United States Patent [19]
Sugiura et al.

[11] Patent Number: 5,457,650
[45] Date of Patent: Oct. 10, 1995

[54] APPARATUS AND METHOD FOR READING MULTI-LEVEL DATA STORED IN A SEMICONDUCTOR MEMORY

[75] Inventors: Nobutake Sugiura, Yokohama; Hideo Kato; Yoshio Mochizuki, both of Kawasaki, all of Japan

[73] Assignee: Kabushiki Kaisha Toshiba, Kanagawa, Japan

[21] Appl. No.: 272,682

[22] Filed: Jul. 8, 1994

[30] Foreign Application Priority Data

Jul. 12, 1993 [JP] Japan ................. 5-193876

[51] Int. Cl.⁶ ........................ G11C 11/34
[52] U.S. Cl. ........................ 365/184; 365/168
[58] Field of Search ............... 365/184, 182, 365/185, 189.09, 189.5, 230.06, 230.08, 210, 168

[56] References Cited

U.S. PATENT DOCUMENTS

| | | | |
|---|---|---|---|
| 5,132,935 | 7/1992 | Ashmore | 365/185 |
| 5,172,338 | 12/1992 | Mehrotra et al. | 365/185 |
| 5,218,569 | 6/1993 | Banks | 365/185 |
| 5,293,560 | 3/1994 | Harari | 365/185 |
| 5,335,198 | 8/1994 | Van Buskirk | 365/210 |

FOREIGN PATENT DOCUMENTS 4172698  6/1992  Japan .

*Primary Examiner*—David C. Nelms
*Assistant Examiner*—A. Zarabian
*Attorney, Agent, or Firm*—Spensley Horn Jubas & Lubitz

[57] ABSTRACT

A semiconductor memory includes memory cells, word lines, bit lines, a row decoder, column decoder, a voltage-changing circuit, a sense amplifier, and an output circuit. Each memory cell stores multi-level data. The row decoder selects one of the word lines in accordance with an address signal. The voltage-changing circuit generates different voltages, which are applied to the row decoder. The different voltages are sequentially applied from the voltage-changing circuit to the word line selected by the row decoder. The column decoder selects a bit line every time the potential of the word line changes. The sense amplifier detects the data read from the memory cell onto the bit line every time the potential of the word line changes. The output circuit converts the data to code data.

23 Claims, 33 Drawing Sheets

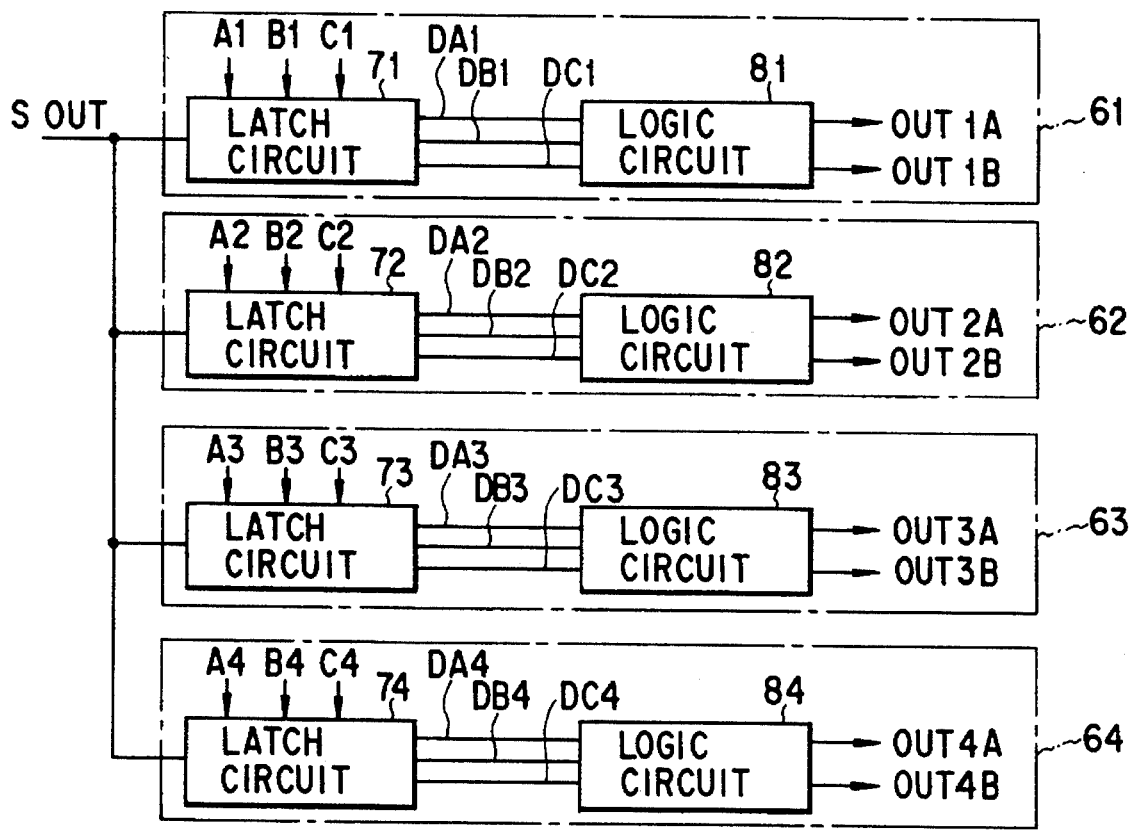
F I G. 2

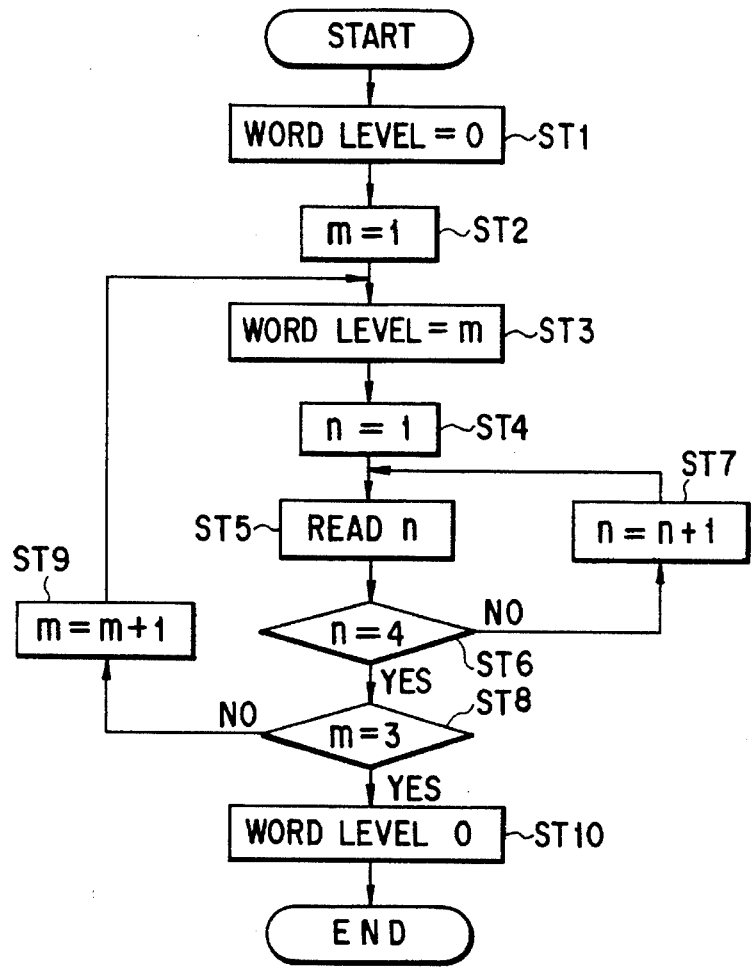
F I G. 7
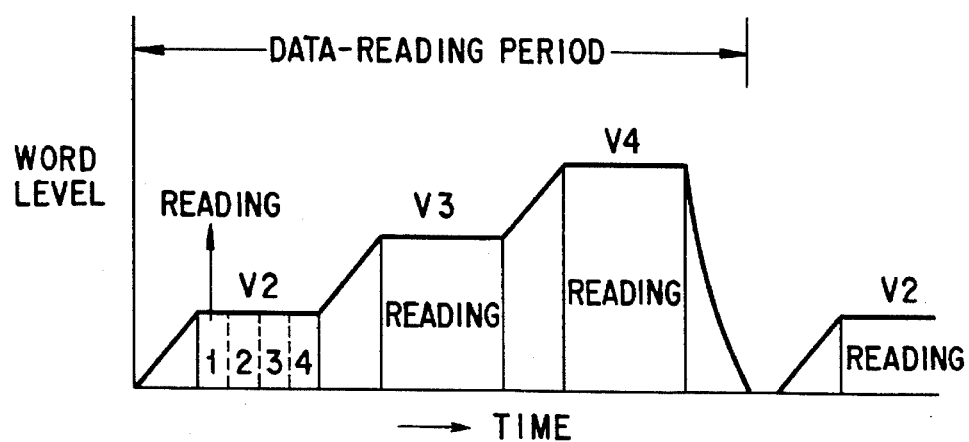
F I G. 8

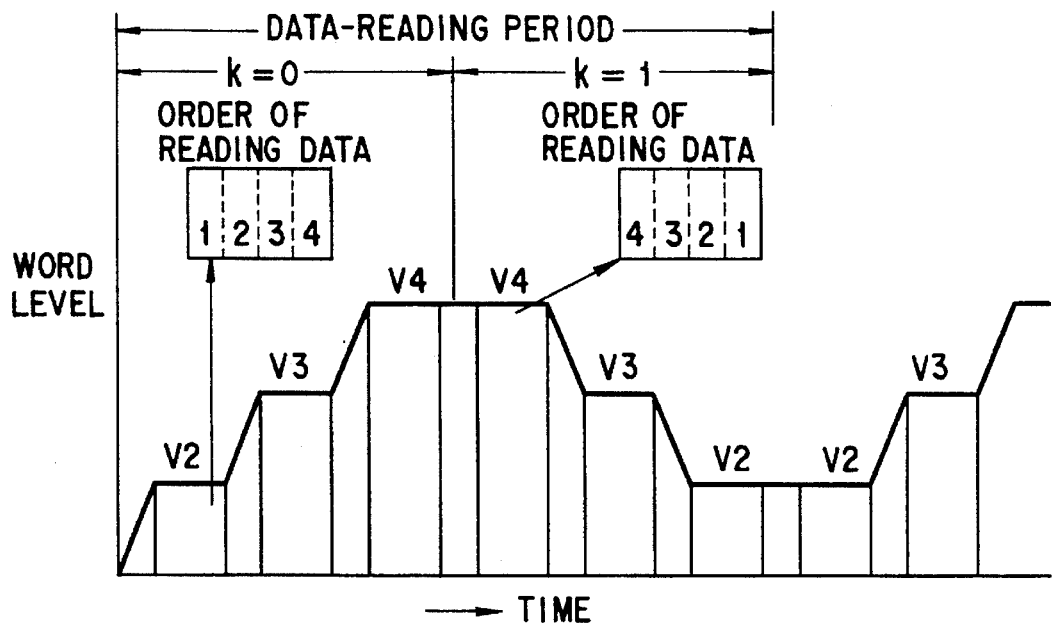
F I G. 17
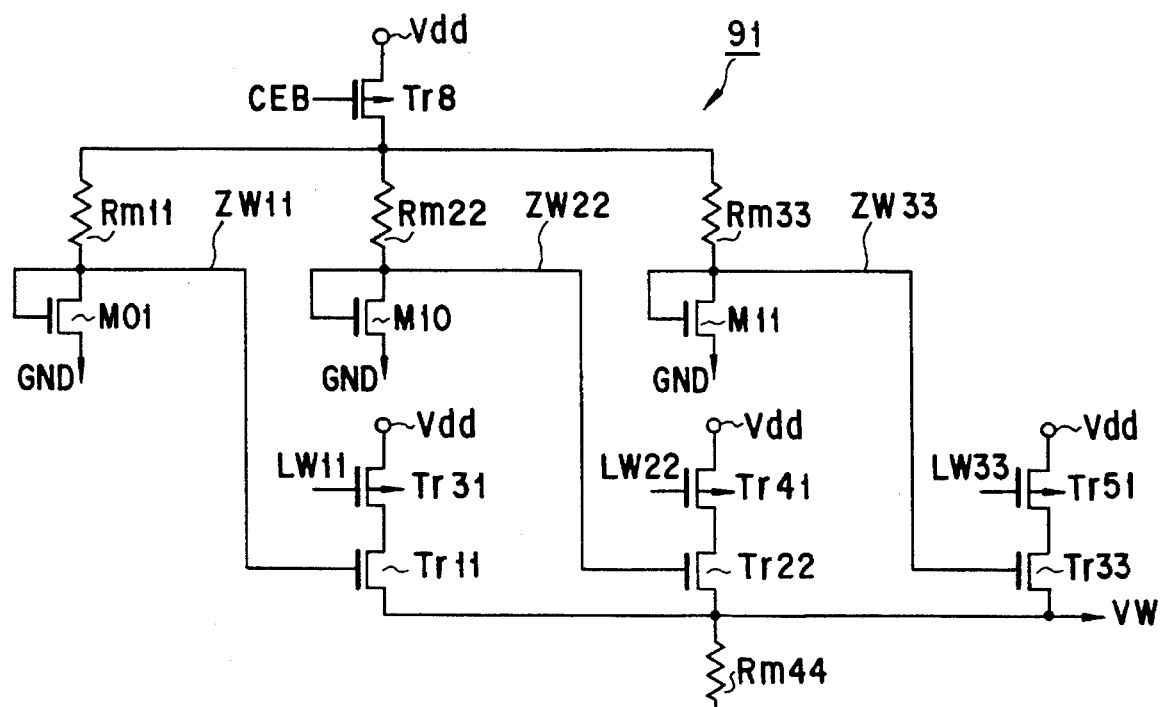
F I G. 18

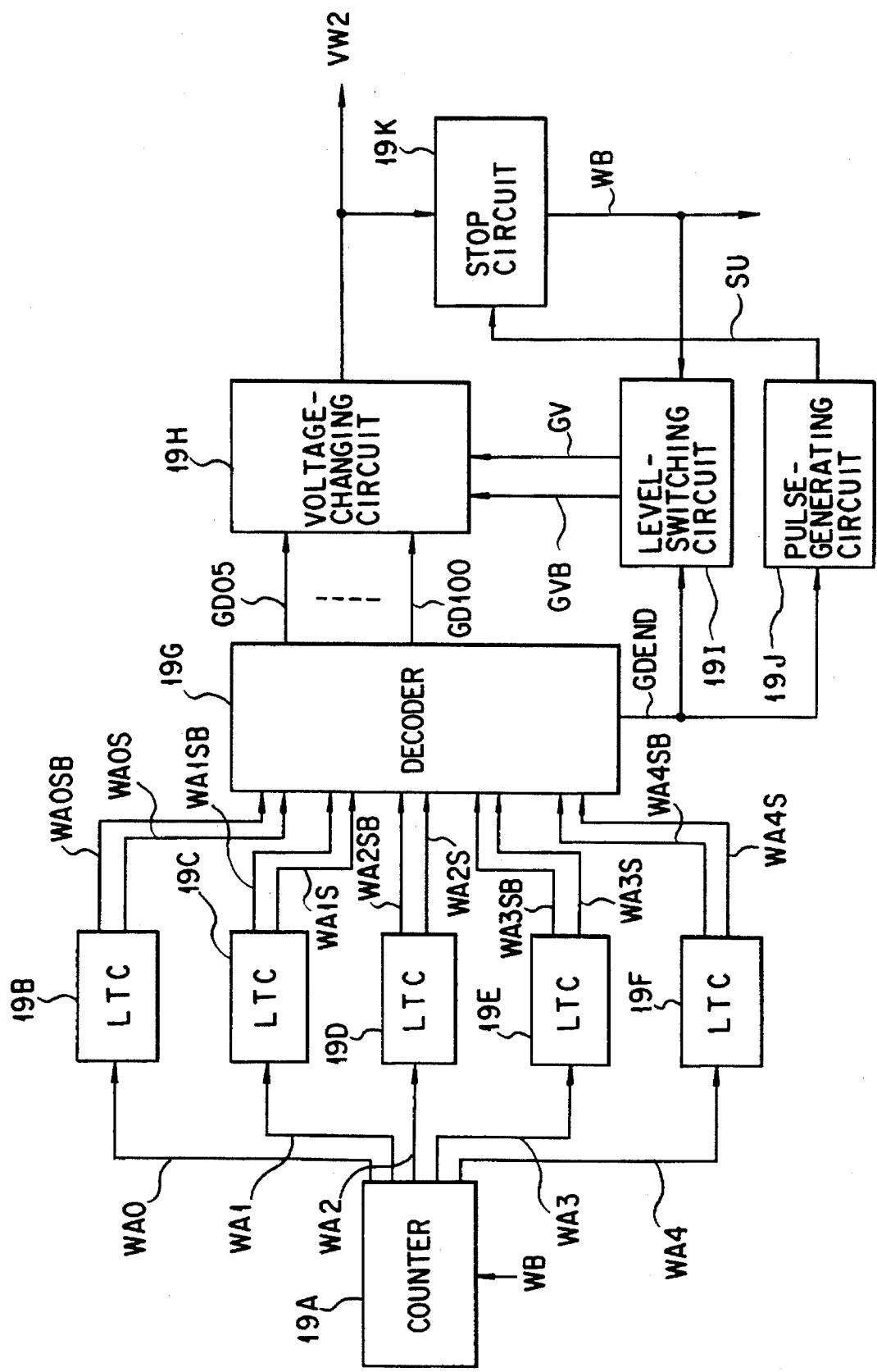
F I G. 19

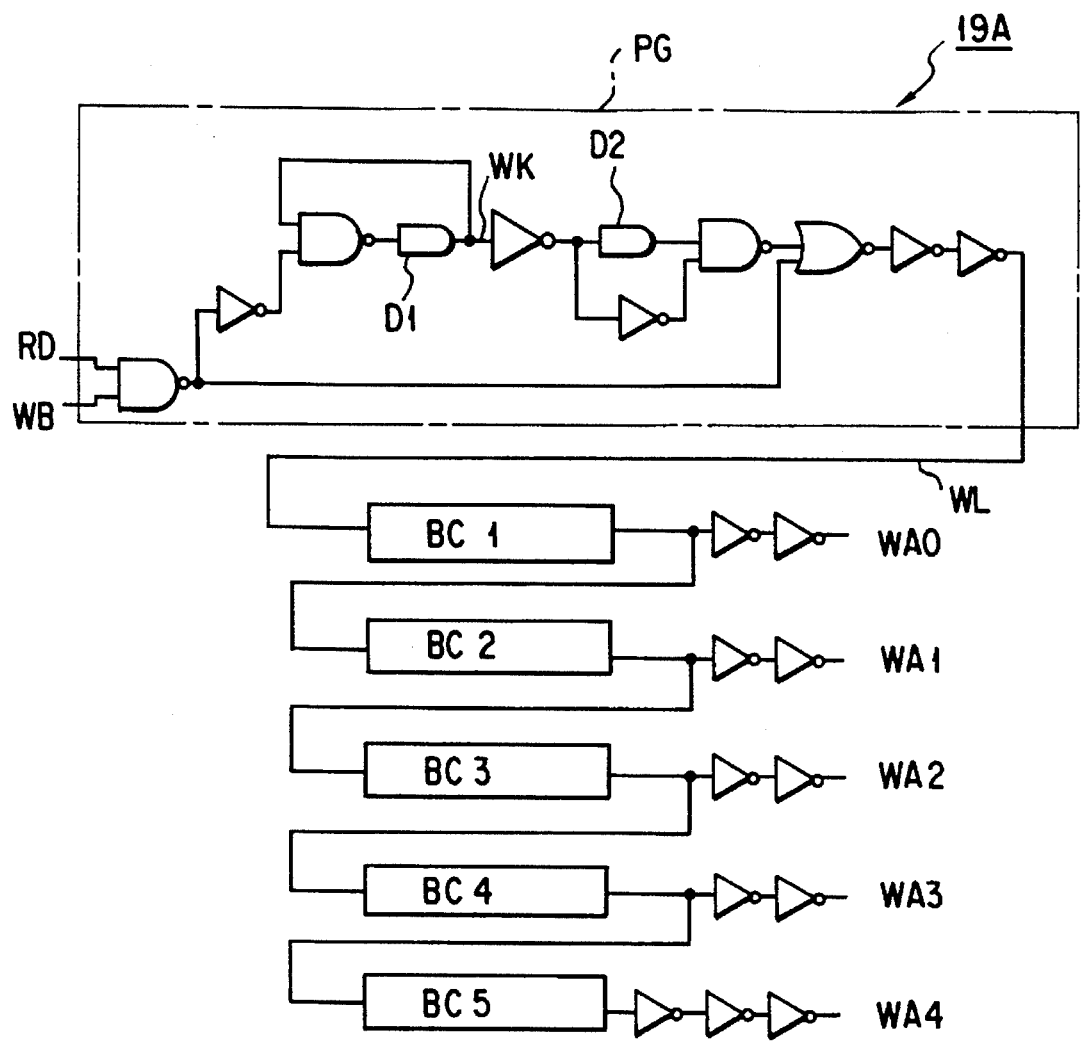
F I G. 20A
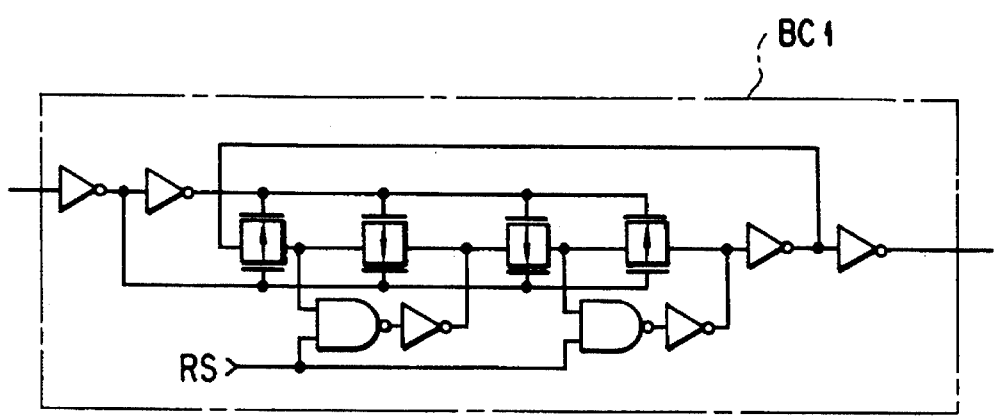
F I G. 20B

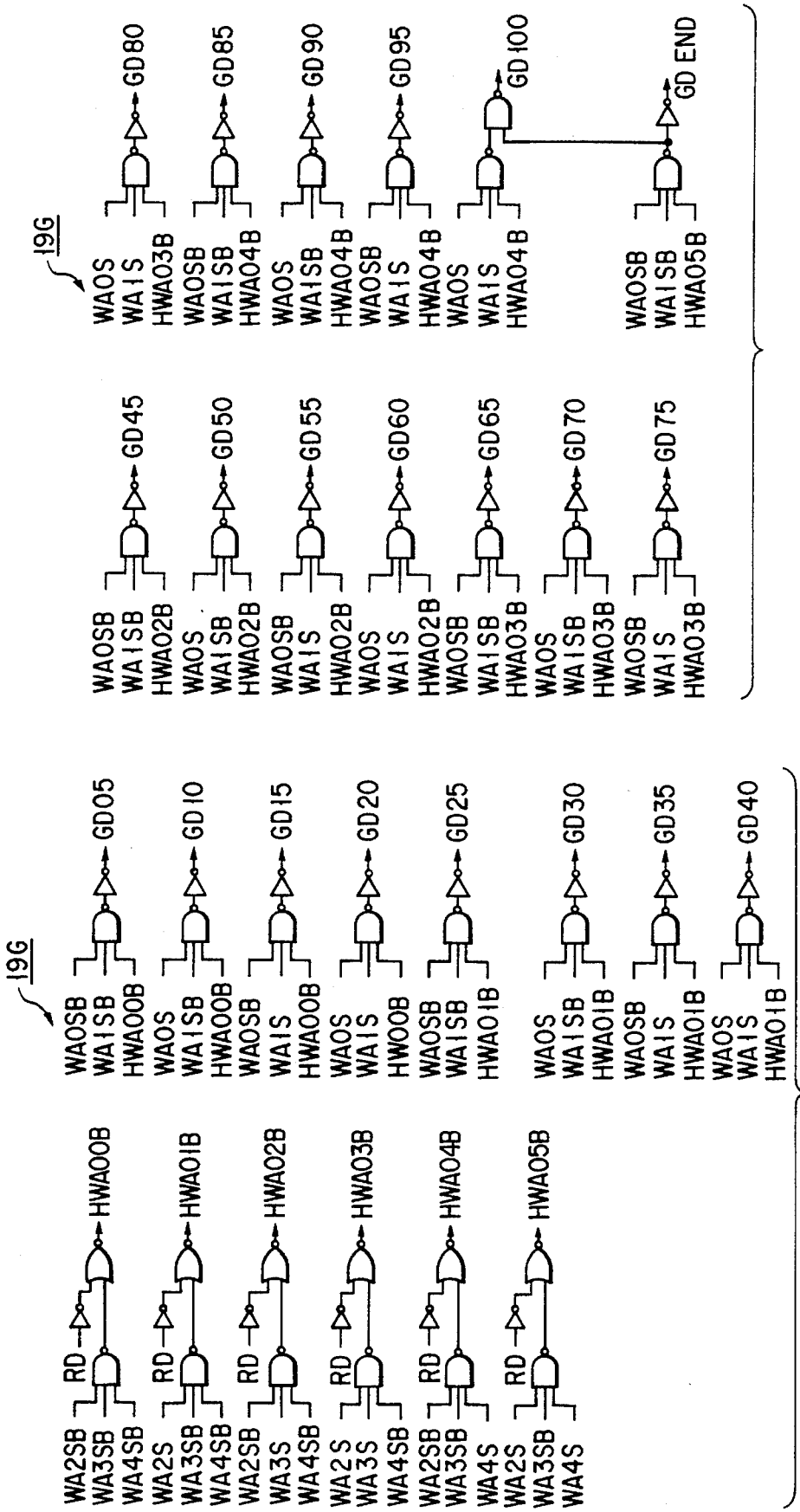

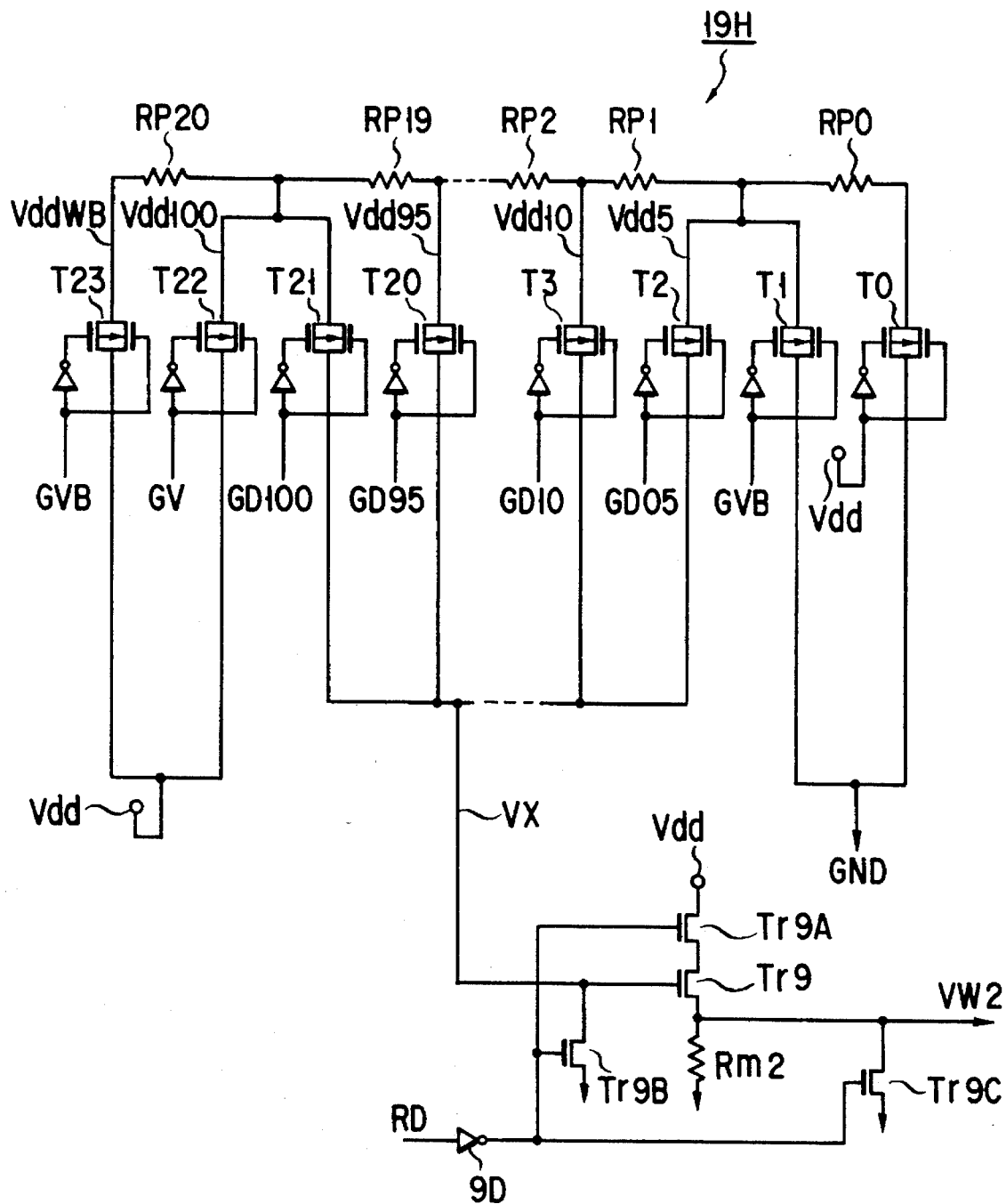
F I G. 28

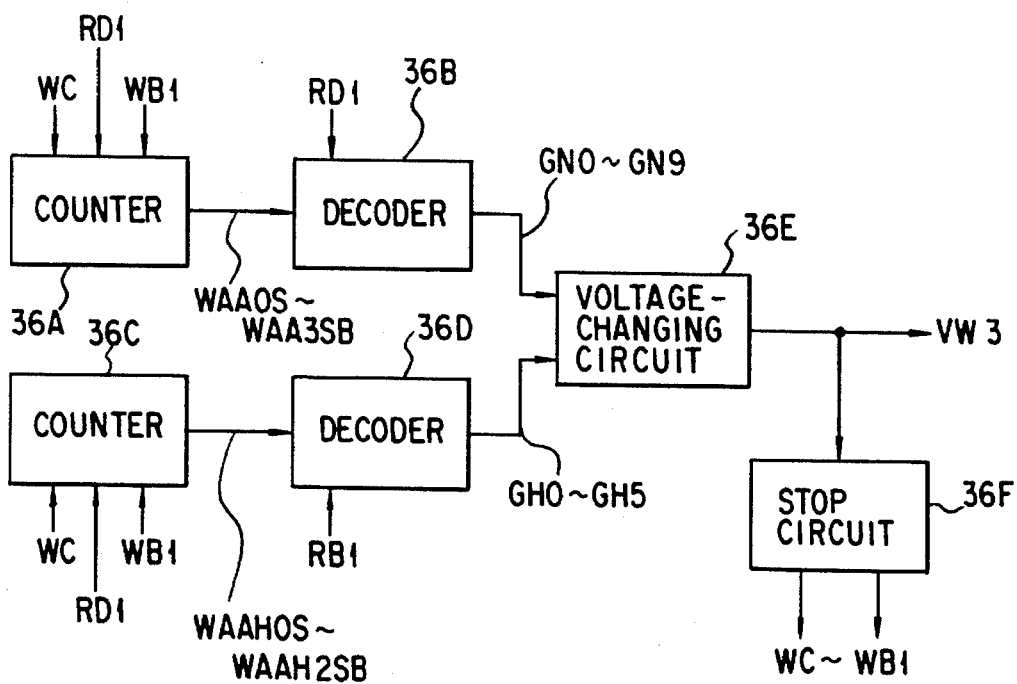
F I G. 36
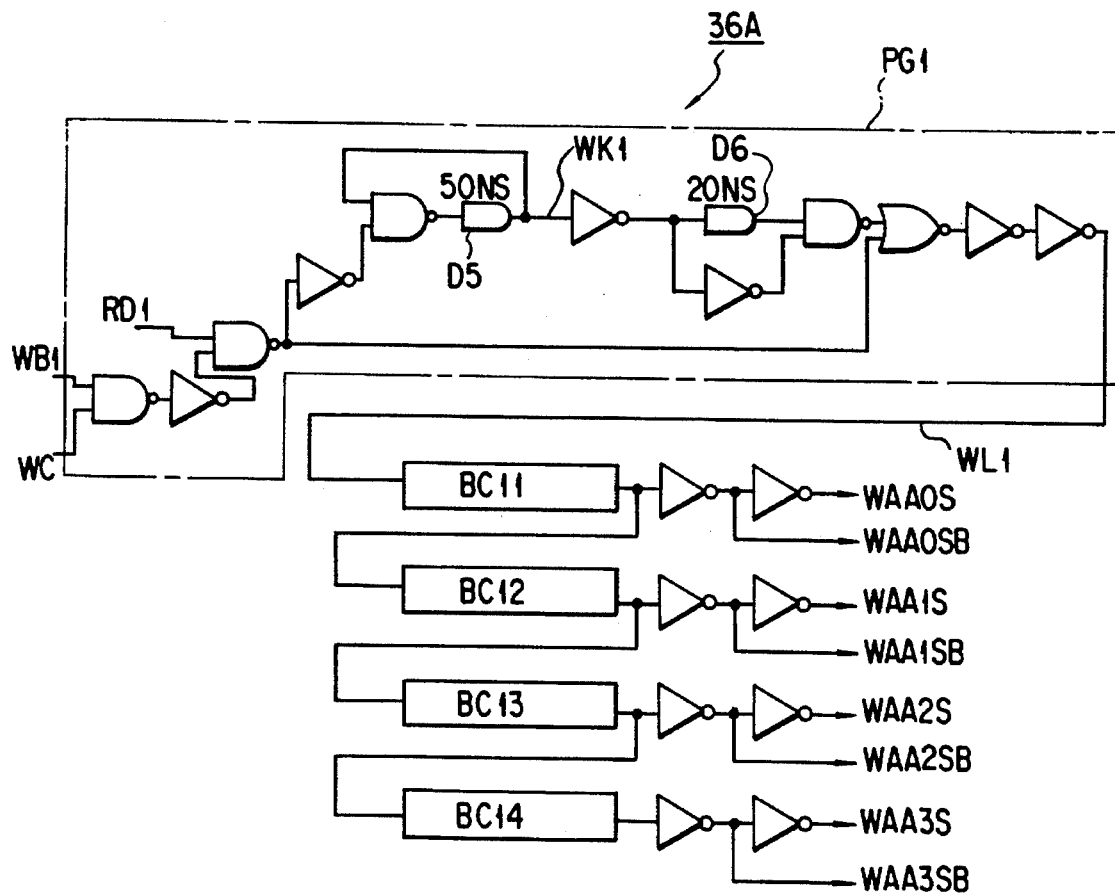
F I G. 37A

F I G. 38 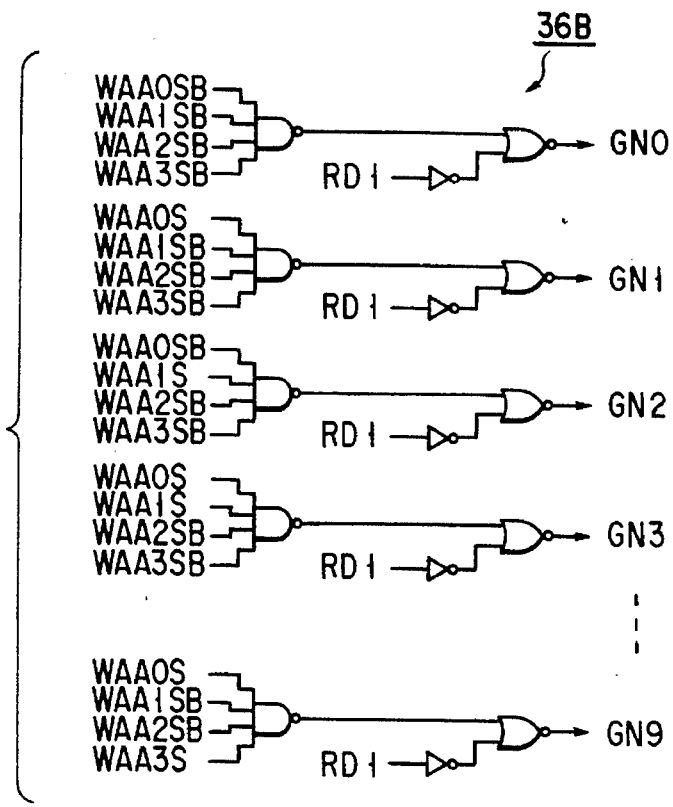
F I G. 40 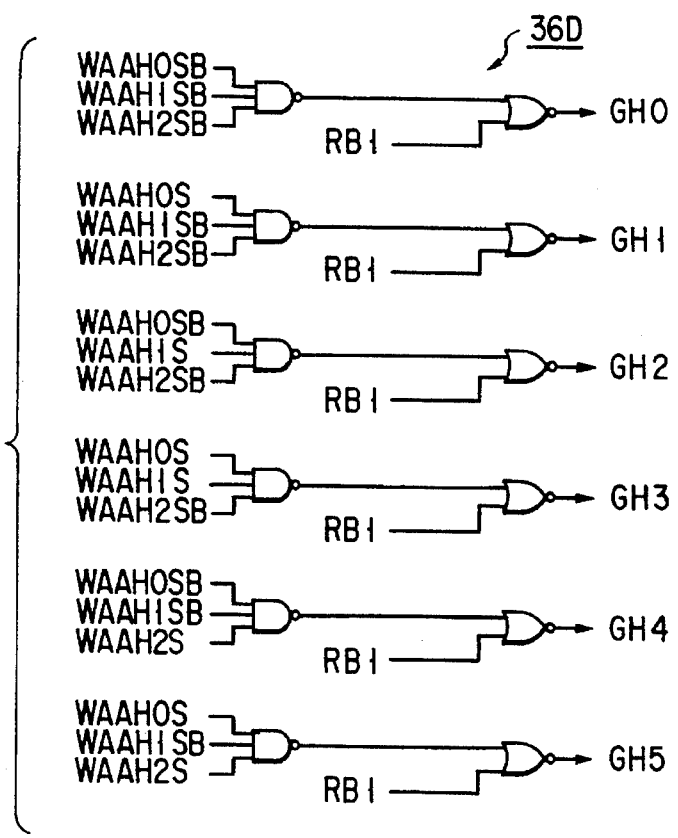

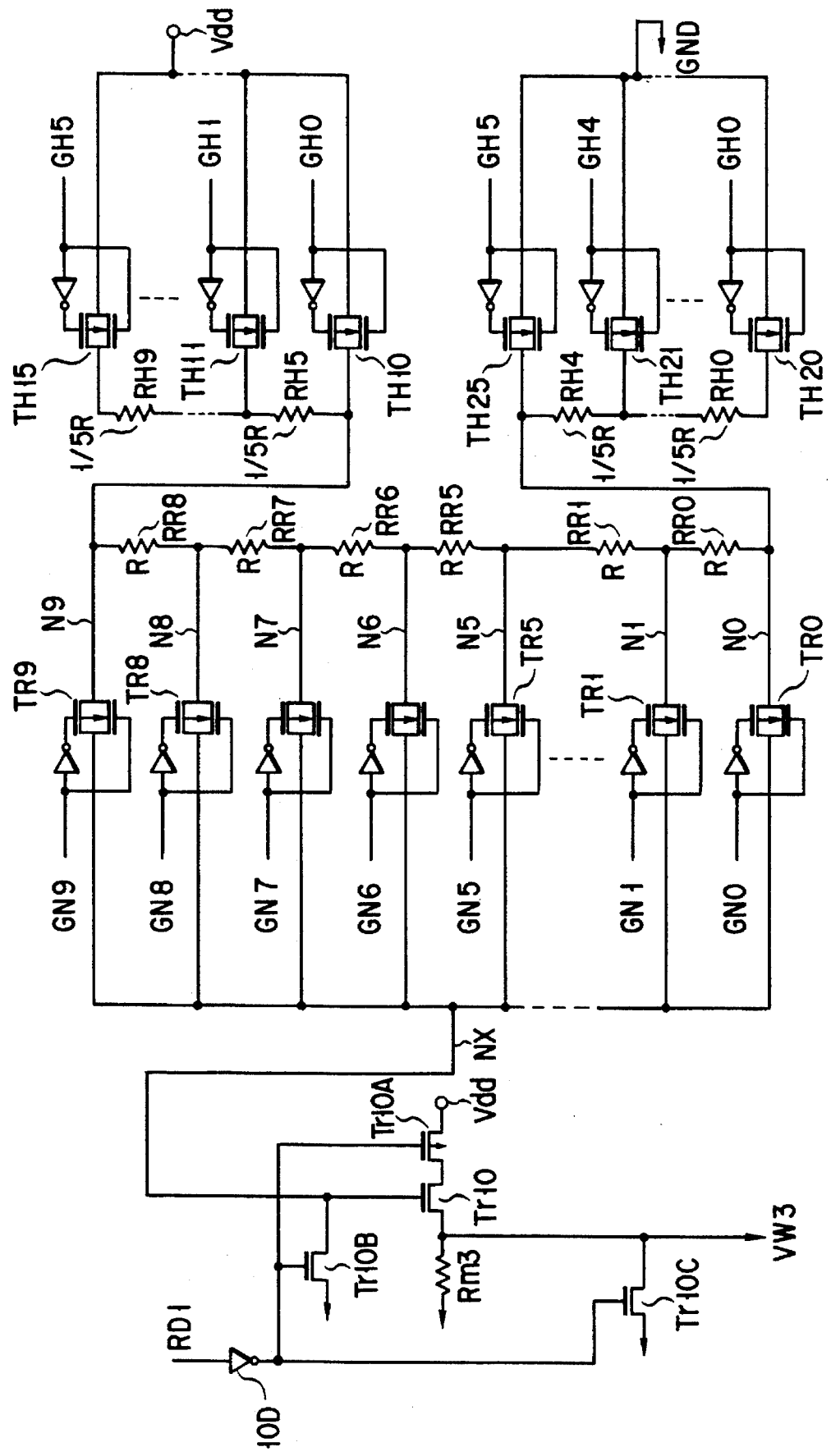
F I G. 41

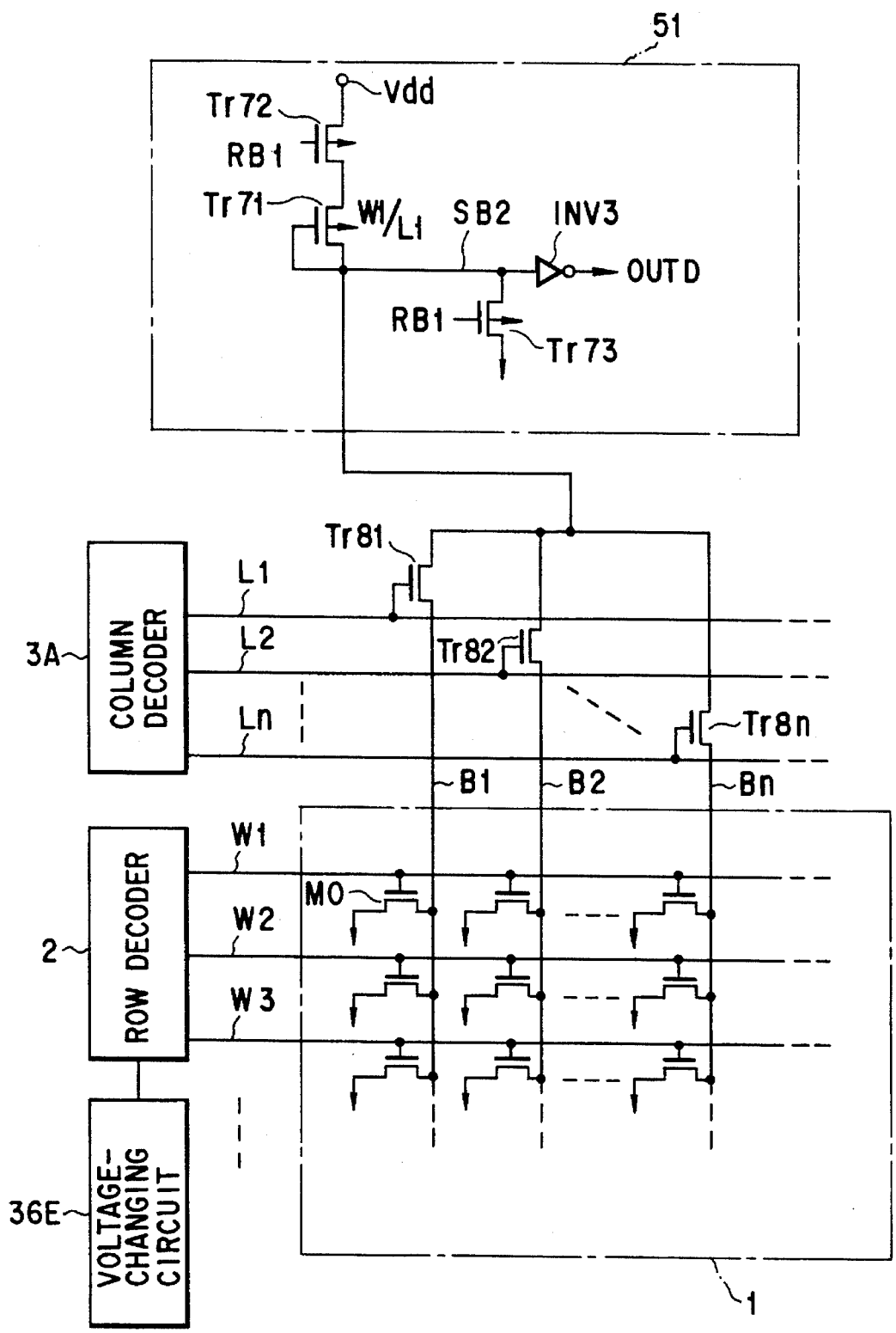
F I G. 46

APPARATUS AND METHOD FOR READING MULTI-LEVEL DATA STORED IN A SEMICONDUCTOR MEMORY

BACKGROUND OF THE INVENTION

1. Field of the Invention

The present invention relates to a semiconductor memory such as a ROM (Read Only Memory) storing multi-level data, and more particularly to an apparatus and method for reading multi-value data from a ROM.

2. Description of the Related Art

The memory-cell array of, for example, a ROM comprises memory cells arranged in rows and columns. Word lines extend along the rows of memory cells, and bit lines extend along the columns of memory cells. Each memory cell has its gate connected to a word line and its source and drain connected to a bit line. To read data from any desired memory cell, the bit line to which the desired memory cell is connected is selected, and the world line to which the desired memory cell is connected is set at a high level.

Generally, a one-bit memory cell has one transistor. The threshold voltage of the transistor is set at a high or low level so that the memory cell stores data. The memory cell can store but one bit of data at a time. To store a great amount of data, a memory needs to have many cells, and its chip size inevitably becomes large.

To manufacture a memory which can store a large amount of data without increasing its chip size, it has recently been proposed that two bits of data be stored in one memory cell. Such a memory is called "multi-level memory." Various types of multi-level memories may be provided. In one type, the gate length or gate width of the transistor of each memory cell is changed so that the current flowing when the memory cell is selected may be set at various values. In another type, the dose of impurity ions injected into the MOS transistor of each memory cell is changed so that the threshold voltage of the MOS transistor may be set at various values. Thus, each memory cell of a multi-level memory can store two or more bits when set in two or more states. The multi-level memory has therefore an increased storage capacity of the memory.

FIG. 48 illustrates the relationship between the gate voltage Vg and drain current Id of each of the memory cells constituting a multi-level ROM. Each memory cell of this multi-level ROM has one of four different threshold voltages V1 to V4 and can store two bits of data. The threshold voltages V1 to V4 have the relationship of: $V1<V2<V3<V4$. Any memory cell having threshold voltage V1 will be identified as memory cell M00; any memory cell having threshold voltage V2 as memory cell M01; any memory cell having threshold voltage V3 as memory cell M10; and any memory cell having threshold voltage V4 as memory cell M11. The memory cells M00, M01, M10 and M11 are assumed to store data items "00", "01", "10" and "11", respectively.

FIG. 49 is a circuit diagram showing a conventional multi-level ROM. The memory cell array 1 of the ROM has memory cells M1, M2 . . . which are MOS transistors and which are arranged in rows and column. Word lines W1, W2, W3, . . . extend along the rows of memory cells, and bit lines B1, B2, . . . and B4 and bit lines B5, B6 . . . B8 extend along the columns of memory cells. Each memory cell has its gate connected to a word line and its drain connected to a bit line. The source of each the memory cell is grounded. The word lines W1, W2, W3, . . . are connected to a row decoder 2.

The multi-level ROM has a first set of selecting transistors S11, S12, . . . and S21, S22, . . . , a second set of selecting transistors S1, S2, . . . , a first set of bit-selecting lines L1, L2, . . . L4, and a second set of bit-selecting lines C1, C2, . . .

The bit lines B1, B2, . . . B4 are connected to a main bit line MB1 by selecting transistors S11, S12, . . . S14. The bit lines B5, B6, . . . B8 are connected to a main bit line MB2 by selecting transistors S21, S22 . . . S24. The gates of the selecting transistors S11, S12, S14, S21, S22, . . . S24 are connected to the bit-selecting lines L1, L2, . . . L4, respectively. The bit-selecting lines L1 to L4 are connected to a column decoder 3. The main bit lines MB1 and MB2 are connected by the selecting transistors S1, S2, . . . to the input SIN of a sense amplifier 5. The gates of the selecting transistors S1, S2, . . . are connected to the bit-selecting lines C1 and C2 . . . , which in turn are connected to a second column decoder 4. The output of the sense amplifier 5 is connected to the input of an output circuit 6. The output circuit 6 encodes a signal supplied from the sense amplifier 5 and outputs two-bit data items OUTA and OUTB.

The second column decoder 4 selects one of the bit-line selecting lines of the second set, in accordance with an address signal, and at the same time the first column decoder 3 selects one of the bit-line selecting lines of the first set. One of the bit lines is therefore selected and connected to the input SIN of the sense amplifier 5. Similarly, the row decoder 2 selects one of the word lines, in accordance with the address signal. As a result, the power-supply voltage Vdd is applied to the gate of the memory cell connected to the bit line and the word line which have been selected. For example, if the bit-selecting lines L1 and C1 and the word line W1 are selected, the data stored in the memory cell M1 will be read out.

FIG. 50 is a sense amplifier which may be used as the sense amplifier 5 in the conventional multi-level ROM of FIG. 49. This sense amplifier comprises two P-channel transistors Tr1 and Tr2 and three inverter circuits IN1, IN2 and IN3. The transistors Tr1 and Tr2 are connected in series, between a power-supply terminal Vdd and an input terminal SIN. The inverter circuits IN1, IN2 and IN3 are connected in parallel to the drain and gate of the transistor Tr1 and set at different reference potentials to discriminate the level of the signal supplied to the input terminal SIN. The potential applied to the input terminal SIN is determined by the current Icell which is to supplied to the memory cell selected. This is because, as has been described, the memory cells of the array 1 are of four types M00, M01, M10 and M11 which have different threshold voltages V1, V2, V3 and V4, respectively.

FIG. 51 is a diagram representing the relationship between the various potentials at the terminal SIN, on the one hand, and the reference potentials of the inverter circuits IN1, IN2 and IN3, on the other hand. Based on this relationship the inverter circuits IN1, IN2 and IN3 can detect the voltage generated at the input terminal SIN in accordance with the memory cell selected. The inverters IN1, IN2 and IN3 output signals DAi, DBi and DCi, respectively.

The signals DAi, DBi and DCi output from the sense amplifier 5 are input to the output circuit 6. The output circuit 6 has the structure shown in FIG. 52. As can be understood from FIG. 52, the circuit 6 converts the signals DAi, DBi and DCi to two-bit data items OUTA and OUTB. The algorithm for this conversion is shown in the following Table 1.

TABLE 1

| Memory cell | DAi | DBi | DCi | OUTA | OUTB |
|---|---|---|---|---|---|
| M00 | 0 | 0 | 0 | 0 | 0 |
| M01 | 1 | 0 | 0 | 0 | 1 |
| M10 | 1 | 1 | 0 | 1 | 0 |
| M11 | 1 | 1 | 1 | 1 | 1 |

Thus can the data be read from the multi-level ROM. In the multi-level ROM ;shown in FIG. 48, the data is sensed by detecting one of four different voltages obtained by dividing the difference between the power-supply voltage Vdd and the ground potential applied the selected memory cell. The difference between the voltages read from the memory cell is small, and the reading margin is proportionally small. Furthermore, the difference between the currents Icell flowing through the memory cells is smaller than in a memory storing binary data. Therefore it is difficult to determine the best possible characteristic for the transistor Tr1 functioning as a load through which the currents Icell eventually flows. The voltages which the inverters IN1, IN2 and IN3 output by dividing the output voltage of the transistor Tr1 are inevitably not balanced, reducing the reading margin. Consequently, data may not be correctly read from any selected memory cell.

To store three-bit data, such as "000" or "010" into one memory cell, eight potentials need to be provided by dividing the difference between the voltage VIN applied to each memory cell and the ground potential GND. In this case, the reading margin is still smaller.

The more bits each memory cell of a memory stores, the more sense amplifiers the reading circuit of the memory must have in order to sense and read different data items. This results in an increase in the complexity of the circuit pattern of the memory as a whole also an increase in the peak current in the memory.

SUMMARY OF THE INVENTION

An object of the present invention is to provide a semiconductor memory device which has a large reading margin and a relatively simple circuit pattern.

Another object of the invention is to provide a semiconductor memory device in which the peak current can be decreased.

According to the invention, there is provided a semiconductor memory device comprising: a plurality of memory cells arranged in rows and columns, for storing multi-level data, each of the memory cells has a gate and current path; a plurality of word lines connected to the gates of the memory cells, respectively; a plurality of bit lines, each connected to one end of the current path of one memory cell; first selecting means connected to the word lines, for selecting one of the word lines in accordance with an address signal; and voltage-applying means connected to the first selecting means, for generating different voltages sequentially, which are to be applied to the word line in order to read data from the memory cells, and for applying the different voltages to the first selecting means.

In the present invention, the potential of each word line is changed several times to read data from one of the memory cells connected to the word line. The data stored in the memory cell is thereby read, bit by bit. Therefore, a plurality of sense amplifiers having different threshold voltages need not be used, and the peak current can be reduced in data-reading operation.

BRIEF DESCRIPTION OF THE DRAWINGS

FIG. 2 is a circuit diagram of the output circuits used in the memory device shown in FIG. 1;

FIG. 7 is a flow chart explaining the operation of the first embodiment;

FIG. 8 is a diagram explaining how data is read from the first embodiment;

FIG. 17 is a diagram explaining the data-reading operation performed in the fourth embodiment;

FIG. 18 is a circuit diagram showing the voltage-changing circuit incorporated in a semiconductor memory device according to the fifth embodiment;

FIG. 19 is a block diagram of a semiconductor memory device according to a sixth embodiment of the invention;

FIG. 20A is a circuit diagram of the counter used in the sixth embodiment;

FIG. 20B is a circuit diagram of the binary counter shown in FIG. 20A;

FIG. 26 is a circuit diagram showing a part of the decoder shown in FIG. 19;

FIG. 27 is a circuit diagram showing the other part of the decoder shown in FIG. 19;

FIG. 28 is a circuit diagram of the voltage-changing circuit shown in FIG. 19;

FIG. 36 is a block diagram of a part of a semiconductor memory device according to a seventh embodiment of the invention;

FIG. 37A is a circuit diagram of the counter shown in FIG. 36;

FIG. 38 is a circuit diagram of the decoder shown in FIG. 36;

FIG. 40 is a circuit diagram of the decoder shown in FIG. 36;

FIG. 41 is a circuit diagram of the voltage-changing circuit shown in FIG. 36;

FIG. 46 is a circuit diagram showing the memory cell array and the sense amplifier, incorporated in the seventh embodiment;

DETAILED DESCRIPTION OF THE PREFERRED EMBODIMENTS

Embodiments of the present invention will be described below, with reference to the accompanying drawings.

A semiconductor memory according to the first embodiment will be described, with reference to FIGS. 1 to 11.

Figure 1:
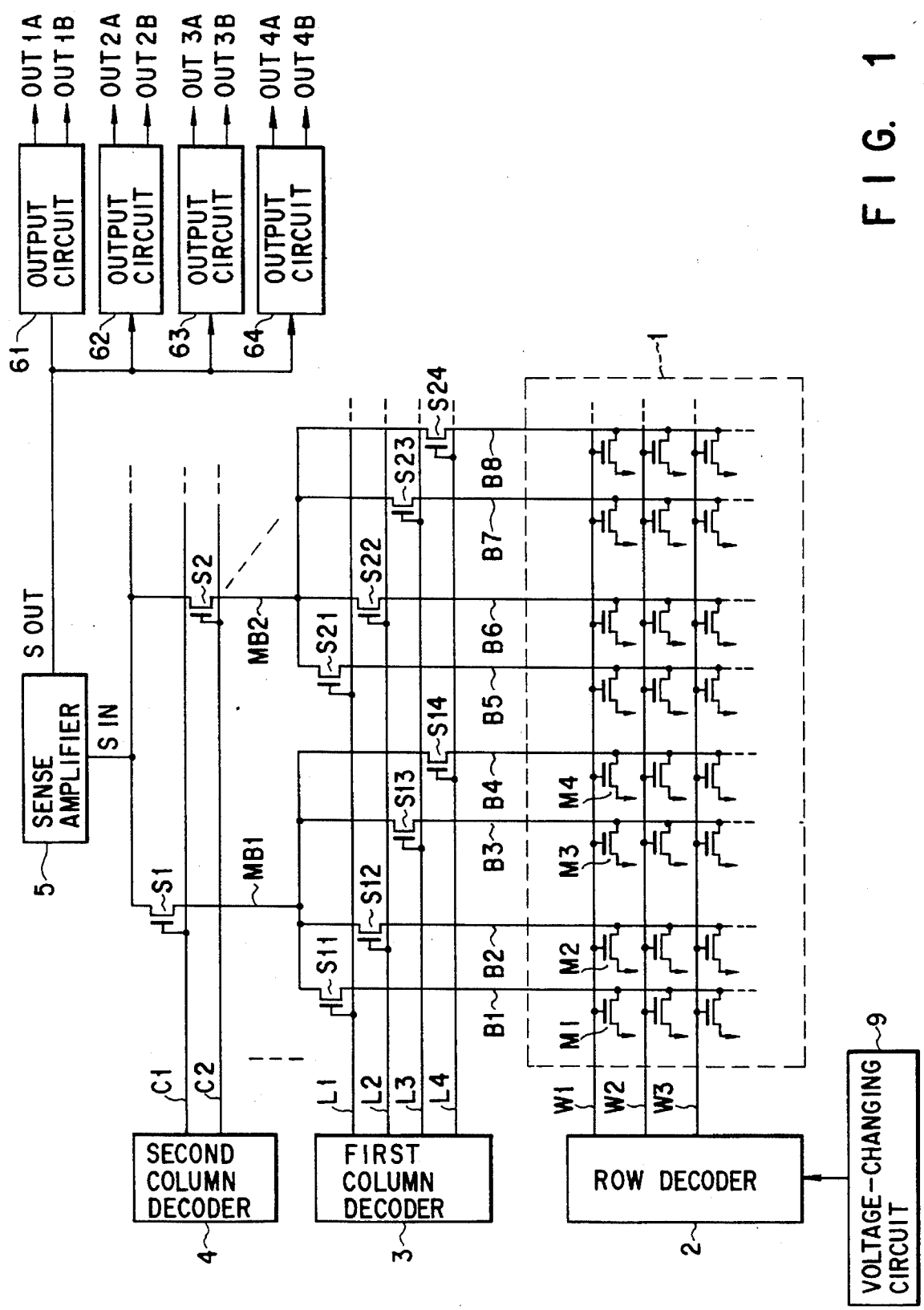
FIG. 1 is a circuit diagram showing a semiconductor memory device according to a first embodiment of the invention.

As shown in FIG. 1, the memory cell array 1 of the semiconductor memory has memory cells M1, M2, M3, M4 ... which are MOS transistors and which are arranged in rows and column. Word lines W1, W2, W3, ... extend along the rows of memory cells, and bit lines B1, B2, B4, B5, B6, B7, B8 ... extend along the columns of memory cells. Each memory cell has its gate connected to a word line and its drain connected to a bit line. The source of each memory cell is grounded. The word lines W1, W2, W3, ... are connected to a row decoder 2.

The multi-level ROM has a first set of selecting transistors S11, S12, S13, S14 ... and S21, S22, S23, S25 ..., a second set of selecting transistors S1, S2, ..., a first set of bit-selecting lines L1, L2, L3 and L4, and a second set of bit-selecting lines C1, C2, ...

The bit lines B1 to B4 are connected to a main bit line MB1 by selecting transistors S11, S12, S13 and S14, and the bit lines B5 to B8 are connected to a main bit line MB2 by selecting transistors S21, S22, S23 and S24. The gates of the selecting transistors S11, S21, ... are connected to the bit-selecting line L1; the gates of the selecting transistors S12, S22, ... are connected to the bit-selecting line L2; the gates of the selecting transistors S13, S23, ... are connected to the bit-selecting line L3; and the gates of the selecting transistors S14, S24, ... are connected to the bit-selecting line L4. The bit-selecting lines L1 to L4 are connected to a first column decoder 3. The main bit lines MB1 and MB2 are connected by the selecting transistors S1, S2, ... to the input SIN of a sense amplifier 5. The gates of the selecting transistors S1, S2, ... are connected to the bit-selecting lines C1 and C2, ..., which in turn are connected to a second column decoder 4. The output of the sense amplifier 5 is connected to the inputs of four output circuits 61 to 64. Each of the output circuits 61 to 64 encodes a signal supplied from the sense amplifier 5 and outputs two-bit data items. More specifically, the circuit 61 outputs two-bit data items OUT1A and OUT1B, the circuit 62 outputs two-bit data items OUT2A and OUT2B, the circuit 63 outputs two-bit data items OUT3A and OUT3B, and the circuit 64 outputs two-bit data items OUT4A and OUT4B.

The second column decoder 4 selects one of the bit-line selecting lines of the second set, in accordance with an address signal, and at the same time the first column decoder 3 selects one of the bit-line selecting lines of the first set. One of the bit lines is therefore selected and connected to the input SIN of the sense amplifier 5. Similarly, the row decoder 2 selects one of the word lines, in accordance with the address signal.

A voltage-changing circuit 9 is connected to the row decoder 2. The circuit 9 can apply different voltages to the row decoder 2. The row decoder 2 applies a voltage output from the voltage-changing circuit 9 to the selected one of the word lines. As a result, the voltage output from the circuit 9 is applied to the gate of the selected memory cell. For example, if the bit-selecting lines L1 and C1 and the word line W1 are selected, the data stored in the memory cell M1 will be read out.

Figure 52:
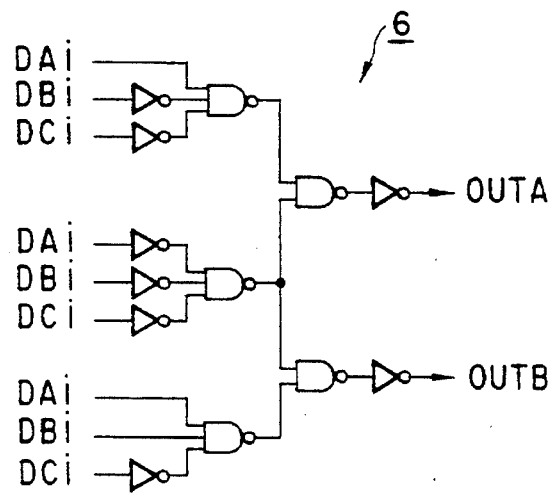
FIG. 52 is a diagram showing the output circuit incorporated in the conventional multi-level ROM.

FIG. 2 shows the output circuits 61 to 64. The circuits 61 to 64 include latch circuits 71, 72, 73 and 74, and logic circuits 81, 82, 83, and 84, respectively. The inputs of the latch circuits 71 to 74 are connected to the output of the sense amplifier 5. The logic circuits 81 to 84 are similar in structure to the output circuit 6 shown in FIG. 52. In each of the output circuits 61 to 64, three control signals Ai, Bi and Ci (i=1 to 4) are supplied to each latch circuit. In accordance with the control signals Ai, Bi and Ci, the latch circuit latches the output signal SOUT of the sense amplifier 5 and outputs three data items DAi, DBi and DCi (i=1 to 4). The data items DAi, DBi and DCi are supplied to the logic circuit. The logic circuit converts the data items DAi, DBi and DCi to two-bit data items OUTiA and OUTiB (i=1 to 4).

Figure 3:
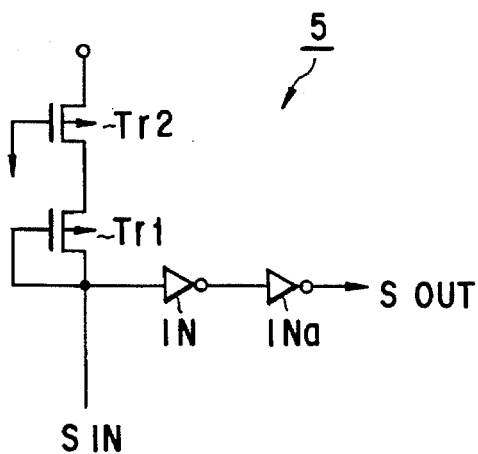
FIG. 3 is circuit diagram of the sense amplifier incorporated in the memory device shown in FIG. 1.

FIG. 3 shows the sense amplifier 5. The sense amplifier 5 comprises two P-channel transistors Tr1 and Tr2 and two inverter circuits IN and INa. The transistors Tr1 and Tr2 are connected in series, between a power-supply terminal Vdd and an input terminal SIN. The gate of the transistor Tr2 is grounded, whereas the gate of the transistor Tr1 works as a load. The drain of the transistor Tr1 is connected to the inverter IN, which in turn is connected to the inverter INa. The inverter INa outputs the signal SOUT described above.

Figure 4:
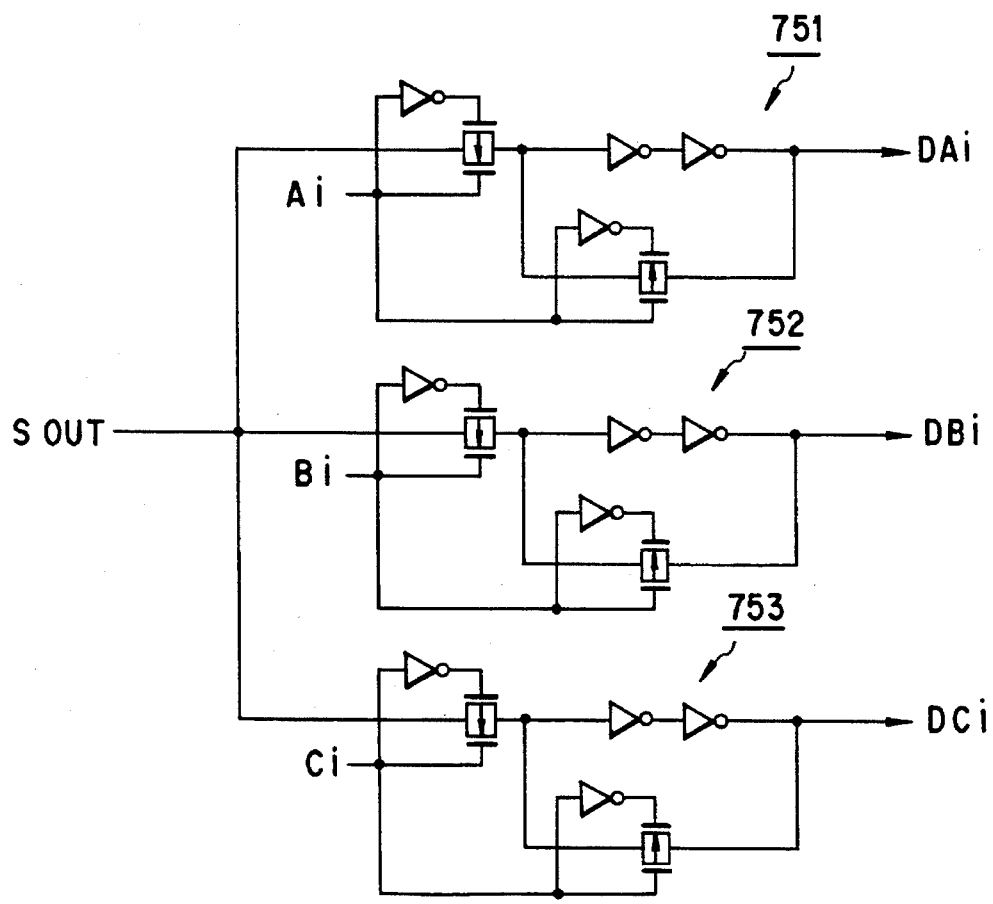
FIG. 4 is a circuit diagram showing one of the identical latch circuits used in the output circuit shown in FIG. 2.

The latch circuits 71 to 74 are identical in structure. Therefore, the latch circuit 71 only will be described, with reference to FIG. 4. As shown in FIG. 4, the latch circuit 71 comprises three latch units 751, 752 and 753. The latch units 751, 752 and 753 latch the output signal SOUT of the sense amplifier 5 in response to latch pulses Ai, Bi and Ci (i=1 to 4). The latch units 751, 752 and 753 output data items DAi, DBi and DCi (i=1 to 4), respectively.

Figure 5:
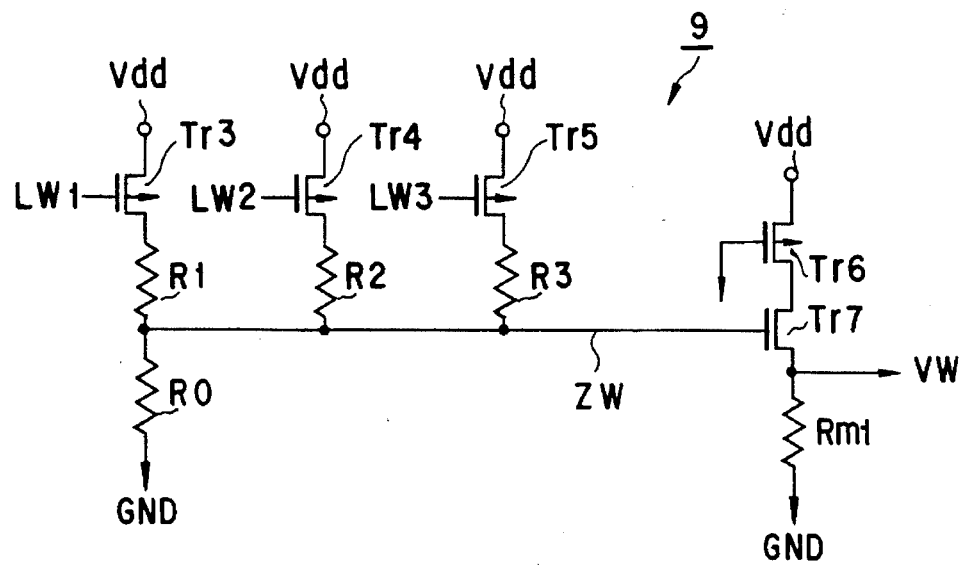
FIG. 5 is a circuit diagram of the voltage-changing circuit incorporated in the memory device shown in FIG. 1.

FIG. 5 shows the voltage-changing circuit 9. As shown in FIG. 5, the circuit 9 comprises four P-channel transistors Tr3, Tr4, Tr5 and Tr6, five resistors R0, R1, R2, R3 and Rm1, and one N-channel transistor Tr7. Signals LW1, LW2 and LW3 are supplied to the gates of the transistors Tr3, Tr4 and Tr5, respectively. The sources of the transistors Tr3, Tr4 and Tr5 are connected to the power supply Vdd. The resistors R1, R2 and R3 are connected, at one end, to the drains of the transistors Tr3, Tr4 and Tr5, respectively. The resistors R1, R2 and R3 are connected, at the other end, to grounded by the resistor R0, and also to the gate of the N-channel transistor Tr7. The drain of the transistor Tr7 is connected to the power supply Vdd by the P-channel transistor Tr6. The source of the transistor Tr7 is grounded by a resistor Rm1. The transistor Tr6 has its gate grounded.

Figure 48:
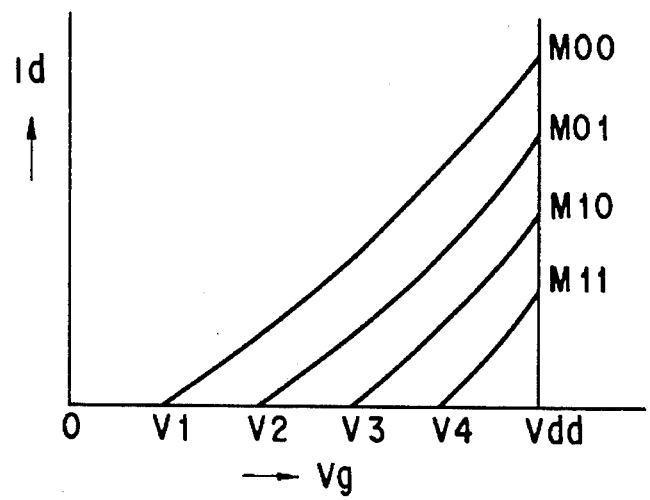
FIG. 48 is a characteristic diagram showing the data stored in a multi-level ROM.
Figure 49:
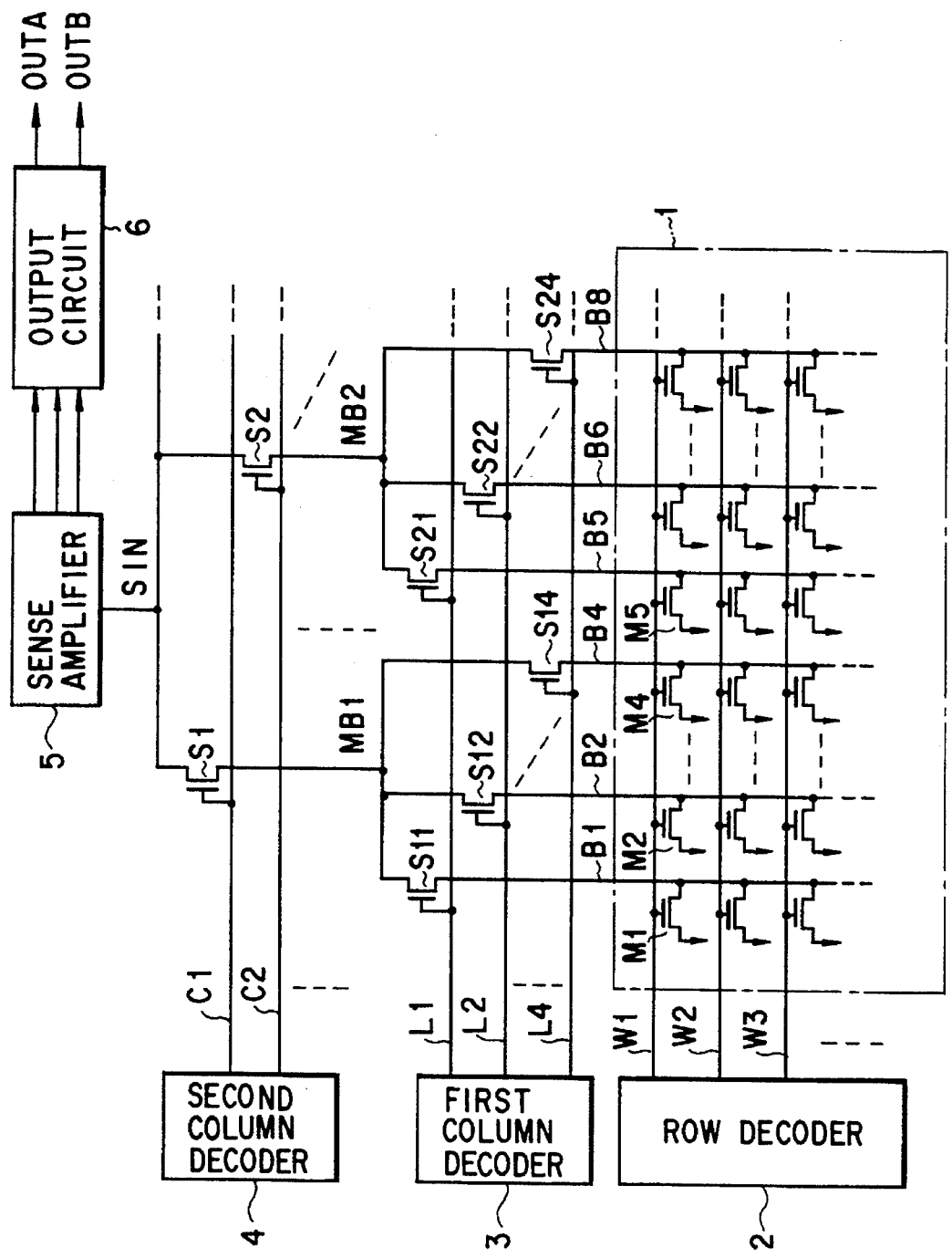
FIG. 49 is a circuit diagram showing a conventional multi-level ROM, illustrating in detail the data-reading circuit of the ROM.

The voltage-division ratio defined by the resistors R1, R2, R3 and R0 is of such a value that the voltage at node ZW assumes value V2 (FIG. 48) when the signal LW1 is low, assumes value V3 (FIG. 48) when the signal WL2 is low, assumes value V4 (FIG. 48) when the signal WL3 is low.

The transistor Tr7 is an enhancement type one which has a threshold voltage of almost 0 V, and the resistor Rm1 has a high resistance. The output voltage VW of the voltage-changing circuit 9 is therefore nearly equal to the voltage at the node ZW. The output voltage VW is applied to the row decoder 2.

Figure 6:
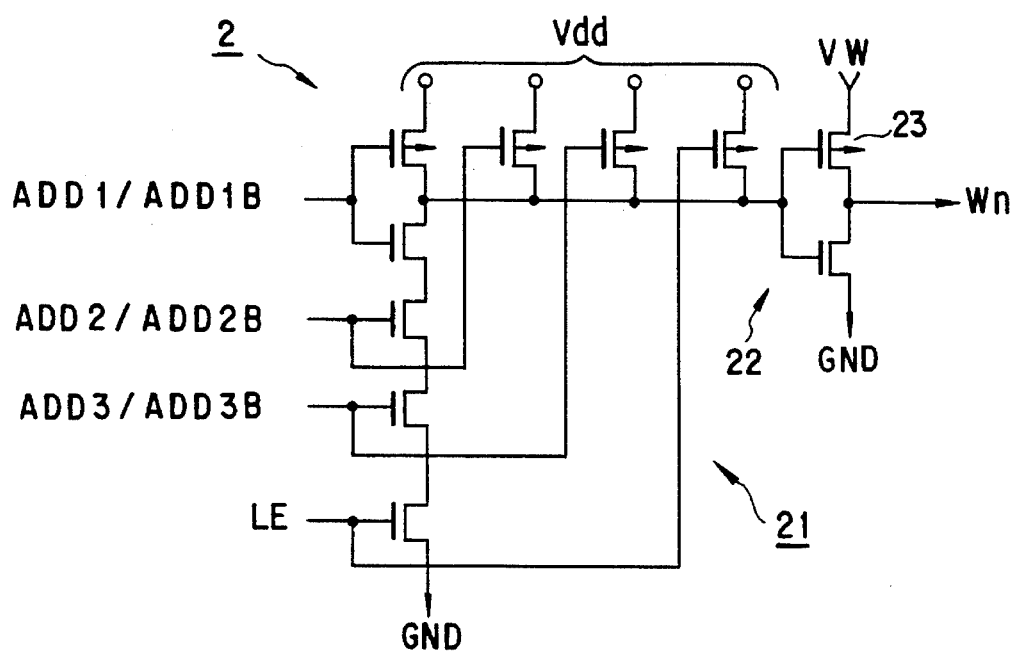
FIG. 6 is a circuit diagram illustrating the row decoder used in the memory device shown in FIG. 1.
Figure 9:
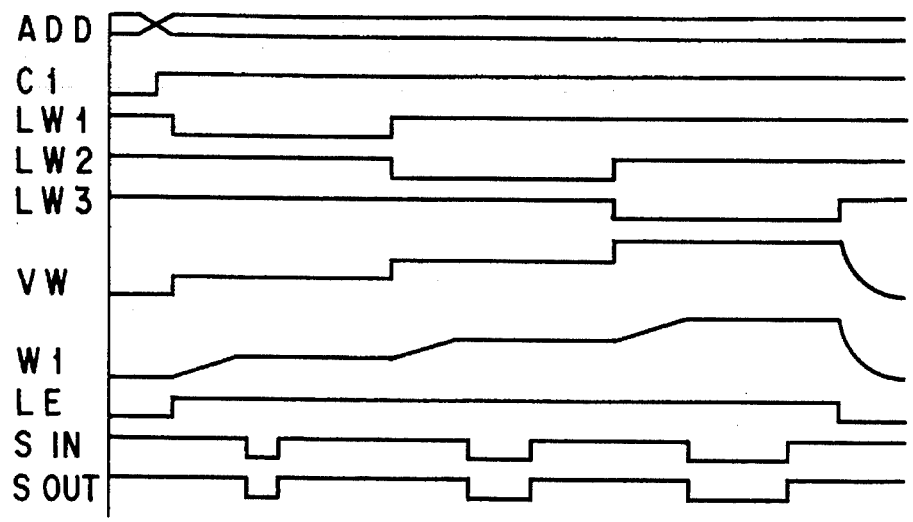
FIG. 9 is a waveform diagram illustrating the operation of the first embodiment.
Figure 10:
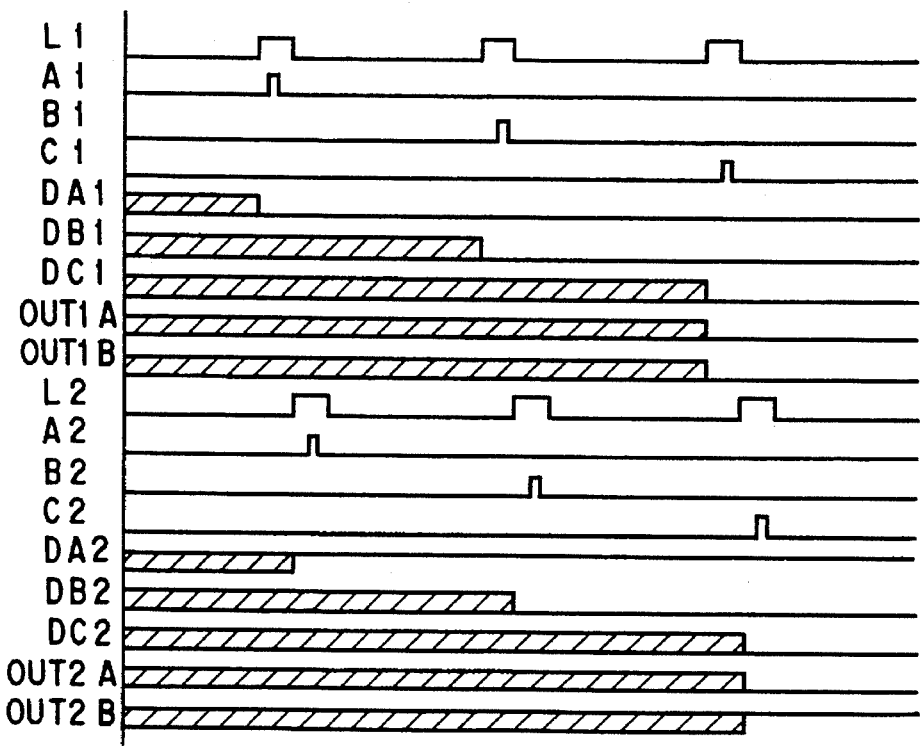
FIG. 10 is a timing chart explaining the operation of the first embodiment.
Figure 11:
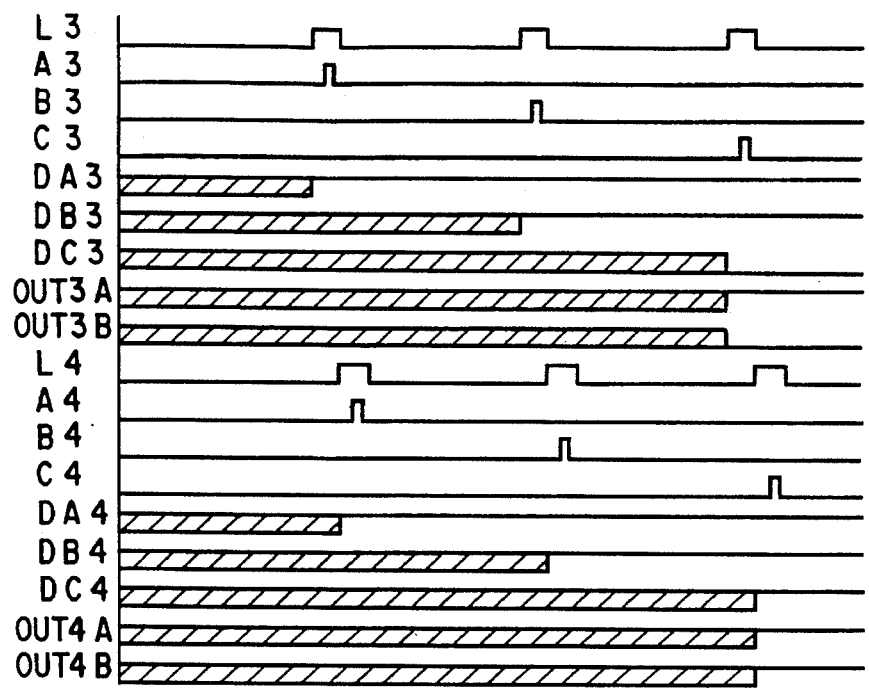
FIG. 11 is a timing chart explaining the operation of the first embodiment.

FIG. 6 shows the row decoder. As shown in FIG. 6, the row decoder comprises a logic circuit 21 and an inverter circuit 22. The logic circuit 21 outputs a word-line selecting signal in accordance with address signals ADD1 and ADD3 or address signals ADD1B to ADD3B and a signal LE. (The signals ADD1B to ADD3B have been obtained by inverting the signals ADD1 and ADD3.) The inverter circuit 22 generates a word-line driving voltage from the output signal of the logic circuit 21. The inverter circuit 22 has a P-channel transistor 23, the source of which receives the voltage VW output from the voltage-changing circuit 9. Hence, the voltage V2 is applied to the word line selected by the row decoder 2, when the signal LW1 (FIG. 5) is at low level; the voltage V3 is applied to the selected word line when the signal LW2 (FIG. 5) is at low level; and the voltage V4 is applied to the selected word line when the signal LW3 (FIG. 5) is at low level. When the signals WL1 to LW3 are all set to high level, 0 V is applied to the selected word line. (See FIGS. 9, 10 and 11.)

FIG. 7 is a flow chart explaining the operation of the first embodiment described above. As shown in FIG. 8, the potential (hereinafter called "word level") of the selected word line changes to read data from the selected memory cell. In more specific words, the word level changes from the first potential V2 to the second potential V3, and finally to the mth potential Vm+1 (m=3)—during each data-reading period. In the first embodiment, it changes from V2 to V3, and hence to V4.

The data-reading operation will be explained, with reference to FIGS. 7 and 8. In the initial state, the word level is 0 V (ST1). The selected word line is charged to the first potential V2. As shown in FIG. 8, the data is not read from the memory cells connected to the selected word line until the word level reaches the first potential V2 (ST2 and ST3). When the word level reaches the first potential V2, the column decoders 3 and 4 selects the first memory cell M1 connected to the word line, whereby the data item is read from the memory cell M1. Then, the column decoders 2 and 4 sequentially selects the other memory cell M2, . . . Mn connected to the word line, whereby the data items are read from the memory cell M2 . . . Mn (ST4 to S7). In this embodiment, data items are read from the first to fourth memory cells M1 to M4 connected to the selected word line.

Upon completion of the data-reading from the fourth memory cell M4, the word level (m) is changed to the next higher one, i.e., the second potential V3 (ST8 and ST9). Hence, the data items are sequentially read from the memory cells M1, M2, M3 and M4. Thereafter, the word level (m) is changed to the third potential V4, and the data items are sequentially read from the memory cells M1, M2, M3 and M4. When the data item is read from the memory cell M4 set at the word level of V4, the word level is lowered to 0 V, whereby the data-reading period expires (ST10).

The data items read at each word level are supplied to the output circuits 61 to 64. More precisely, the data items are supplied to the latch circuits 71 to 74 and eventually to the logic circuits 81 to 84. Each of the logic circuits converts the input data item to two-bit data items OUTiA and OUTiB (i=1 to 4).

With reference to FIGS. 7 to 11, the data-reading operation will be explained in more detail.

First, the column decoder 4 selects the second bit-selecting line C1 of the second set, and the row decoder 2 selects the word line W1, in accordance with an address signal (ADD1, ADD2, ADD3, . . .). Therefore, the signal WL1 is thereby set to low level, while the signal LE is set high level. The word line W1 is thereby gradually charged from 0 V to the level V2. When the potential of the word line W1 reaches V2, the bit-selecting line L1 of the first set is set to high level because of an internal address. As a result, the memory cell M1 is selected. Assuming that the memory cell M1 is a cell M00 having a threshold voltage V1, the memory cell M1 is turned on and a current flows through the memory cell M1 at the word level V2. The output signal SOUT of the sense amplifier 5 is set to "0" level. The latch circuit 71 of the output circuit 61 latches the signal SOUT in response to a latch pulse A1. The output signal DA1 of the latch circuit 71 is set from an "unknown" level to the "0" level. (While the signal DA1 is at the "unknown" level, it remains unknown whether the data the cell M1 stores is "0" or "1".)

The internal address is incremented, thereby setting the bit-selecting line L1 to low level, and the bit-selecting line L2 to high level. At this time, the word line W1 remains at the V2 level. The memory cell M2 is thereby selected. Assuming that the memory cell M2 is a cell M01 having a threshold voltage V2, a current scarcely flows or does not flow through the memory cell M2 at the word level V2. The input voltage SIN of the sense amplifier 5 does not fall below the threshold voltage of the inverter circuit IN. The output signal SOUT of the sense amplifier 5 is therefore set to the "1" level. The latch Circuit 72 of the output circuit 62 latches the output signal SOUT in response to a latch pulse A2. The output signal DA2 of the latch circuit 72 is set from an "unknown" level to the "1" level.

Next, the internal address is further incremented, thereby setting the bit-selecting line L2 to low level, and the bit-selecting line L3 to high level. At this time, the word line W1 remains at the V2 level. The memory cell M3 is thereby selected. Assuming that the memory cell M3 is a cell M10 having a threshold voltage V3, no current flows through the memory cell M3 at the word level V2. The input voltage SIN of the sense amplifier 5 does not fall below the threshold voltage of the inverter circuit IN. The output signal SOUT of the sense amplifier 5 is there fore set to the "1" level. The latch circuit 73 of the output circuit 63 latches the output signal SOUT in response to a latch pulse A3. The output signal DA3 of the latch circuit 73 is set from an "unknown" level to the "1" level.

Then, the internal address is incremented still further, thereby setting the bit-selecting line L3 to low level, and the bit-selecting line L4 to high level. At this time, the word line W1 remains at the V2 level. The memory cell M4 is thereby selected. Assuming that the memory cell M4 is a cell M11 having a threshold voltage V4, no current flows through the memory cell M3 at the word level V2. The input voltage SIN of the sense amplifier 5 does not fall below the threshold voltage of the inverter circuit IN. The output signal SOUT of the sense amplifier 5 is there fore set to the "1" level. The latch circuit 74 of the output circuit 64 latches the output signal SOUT in response to a latch pulse A4. The output signal DA4 of the latch circuit 74 is set from an "unknown" level to the "1" level.

Thus, the output signals SOUT of the sense amplifier 5 are sequentially latched in the latch circuits 71 to 74 as the latch pulses A1 to A4 are supplied to the latch circuits 71 to 74 from the column decoder 3 which is being switched by the internal address. Once data is latched by the latch circuits 71 to 74 after the latch pulse A4 has been supplied to the latch circuit 74, the column decoder 3 sets the bit-selecting lines L1 to L4 to low level, the signals LW1 and LW2 supplied to the voltage-changing circuit 9 to high level and low level, respectively. As a result, the word line W1 is charged to the level V3.

While the bit-selecting line C1 of the second set remains selected by the column decoder 4, the voltage of the word line W1 gradually rises to the level V3. Then, the bit-line selecting lien L1 of the first set is set to high level because of the internal address. The memory cell M1 is thereby selected. Since the memory cell M1 is an M00 cell as mentioned above, it is turned on and a current flows through it. The output signal SOUT of the sense amplifier 5 is set to the "0" level. The latch circuit 71 of the output circuit 61 latches the signal SOUT in response to a latch pulse B1. The output signal DB1 of the latch circuit 71 is set from an "unknown" level to the "0" level.

The internal address is incremented, thereby setting the bit-selecting line L1 to low level, and the bit-selecting line L2 to high level. The memory cell M2 is thereby selected. Since the memory cell M2 is an M01 cell as mentioned above, it is turned on at the word level V3, and a current flows through it. The output signal SOUT of the sense amplifier 5 is set to the level. The latch circuit 72 of the output circuit 62 latches the signal SOUT in response to a latch pulse B2. The output signal DB2 of the latch circuit 72 is set from an "unknown" level to the "0" level.

Then, the internal address is incremented, thus setting the bit-selecting line L2 to low level, and the bit-selecting line L3 to high level. The memory cell M3 is thereby selected. Since the memory cell M3 is an M10 cell as mentioned above, a current scarcely flows or does not flow through it at the word level V3. The output signal SOUT of the sense amplifier 5 does not fall below the threshold voltage of the inverter circuit IN. The output signal SOUT of the amplifier 5 is set to the "1" level. The latch circuit 73 of the output circuit 63 latches the signal SOUT in response to a latch pulse B3. The output signal DB3 of the latch circuit 73 is set from an "unknown" level to the "1" level.

Next, the internal address is further incremented, thereby setting the bit-selecting line L3 to low level, and the bit-selecting line L4 to high level. The memory cell M4 is thereby selected. Since the memory cell M4 is an M11 cell as mentioned above, a current does not flow through it at the word level V3. The output signal SOUT of the sense amplifier 5 does not fall below the threshold voltage of the inverter circuit IN. The output signal SOUT of the amplifier 5 is set to the "1" level. The latch circuit 74 of the output circuit 64 latches the signal SOUT in response to a latch pulse B4. The output signal DB4 of the latch circuit 74 is set from an "unknown" level to the "1" level.

Thus, the output signals SOUT of the sense amplifier 5 are sequentially latched in the latch circuits 71 to 74 as the latch pulses B1 to B4 are supplied to the latch circuits 71 to 74 from the column decoder 3 which is being switched by the internal address. Once data is latched by the latch circuits 71 to 74 after the latch pulse B4 has been supplied to the latch circuit 74, the column decoder 3 sets the bit-selecting lines L1 to L4 to low level, the signals LW2 and LW3 supplied to the voltage-changing circuit 9 to high level and low level, respectively. As a result, the word line W1 is charged to the level V4.

Therefore, the voltage of the word line W1 gradually rises to the level V4. Then, the bit-line selecting lien L1 of the first set is set to high level because of the internal address. The memory cell M1 is thereby selected. Since the memory cell M1 is an M00 cell, it is turned on and a current flows through it. The output signal SOUT of the sense amplifier 5 is set to the "0" level. The latch circuit 71 of the output circuit 61 latches the signal SOUT in response to a latch pulse C1. The output signal DC1 of the latch circuit 71 is set from an "unknown" level to the "0" level.

The internal address is incremented, thereby setting the bit-selecting line L2 to high level. The memory cell M2 is thereby selected. Since the memory cell M2 is an M01 cell as mentioned above, it is turned on at the word level V3, and a current flows through it at the word level V4. The output signal SOUT of the sense amplifier 5 is set to the "0" level. The latch circuit 72 of the output circuit 62 latches the signal SOUT in response to a latch pulse C2. The output signal DC2 of the latch circuit 72 is set from an "unknown" level to the "0" level.

Then, the internal address is incremented, thus setting the bit-selecting line L3 to high level. The memory cell M3 is thereby selected. Since the memory cell M3 is an M10 cell, it is turned on at the word level V4, and a current flows through it. The output signal SOUT of the amplifier 5 is therefore set to the "0" level. The latch circuit 73 of the output circuit 63 latches the signal SOUT in response to a latch pulse C3. The output signal DC3 of the latch circuit 73 is set from an "unknown" level to the "0" level.

Next, the internal address is further incremented, thereby setting the bit-selecting line L4 to high level. The word level V4 is supplied to the word line W1. The memory cell M4 is thereby selected. Since the memory cell M4 is an M11 cell, it is not turned on at the word level V4. The output signal SOUT of the amplifier 5 is therefore set to the "1" level. The latch circuit 74 of the output circuit 64 latches the signal SOUT in response to a latch pulse C4. The output signal DC4 of the latch circuit 74 is set from an "unknown" level to the "1" level.

As indicated above, the output signals SOUT of the sense amplifier 5 are sequentially latched in the latch circuits 71 to 74 as the latch pulses C1 to C4 are supplied to the latch circuits 71 to 74 from the column decoder 3 which is being switched by the internal address. Once data is latched by the latch circuits 71 to 74 after the latch pulse C4 has been supplied to the latch circuit 74, the signal LW3 supplied to the voltage-changing circuit 9 is set to high level, and the signal LE supplied to the row decoder 2 is set at low level. As a result, the outputs of the row decoder 2 are all set to low level, whereby the data-reading operation is terminated.

As the data-reading operation is performed in the way explained above, the latch circuits 71, 72, 73 and 74 output data "000", data "100", data "110" and data "111", respectively. These items of data are input to the logic circuits 81, 82, 83 and 84. The logic circuits 81 to 84 convert the data items to two-bit data items "00", "01", "10" and "11".

Thereafter, the outputs of the column decoder 4 are switched, thereby selecting the bit-selecting lines C2, C3, . . . , one after another. Data is thereby read from the other memory cells of the memory cell array 1.

The algorithm for the conversion which the logic circuits 81 to 84 perform is shown in the following Table 2.

TABLE 2

| Memory cell | DAi | DBi | DCi | OUTiA | OUTiB |
|---|---|---|---|---|---|
| M1 (M00) i = 1 | 0 | 0 | 0 | 0 | 0 |
| M2 (M01) i = 2 | 1 | 0 | 0 | 0 | 1 |
| M3 (M10) i = 3 | 1 | 1 | 0 | 1 | 0 |
| M4 (M11) i = 4 | 1 | 1 | 1 | 1 | 1 |

In the first embodiment described above, the voltage-changing circuit 9 changes the word level sequentially, and one bit of the data stored in each memory cell is read every time the word level is raised. In other words, the data stored in each memory cell is read, bit by bit, by changing the word level. It is in this respect that the present invention differs from the conventional multi-level ROM in which data is read from each memory cell by a single data-reading operation.

In the first embodiment, the data is read from any selected memory cell, bit by bit, as the voltage-changing circuit 9 repeatedly changes the potential of the word line to which the memory cell is connected. Therefore, the sense amplifier 5 senses the cell M00 through which a current flows and the cells M01, M10 and M11 through which a current does not flow or scarcely flows, in order to read data from these cells at the word level V2. It senses the cells M00 and M01 through which a current flows and the cells M10 and M11 through which a current does not flow or scarcely flows, in order to read data from these cells at the word level V3. It senses the cells M00, M01 and M10 through which a current flows and the cell M11 through which a current does not flow or scarcely flows, in order to read data from these cells at the word level V4. The sense amplifier 5 needs to have only one sense level at all times. There is a large difference between the current Icell flowing through one memory cell to be sensed and the current Icell flowing through any other memory cell. Hence, the first embodiment has a sufficient reading margin.

Figure 50:
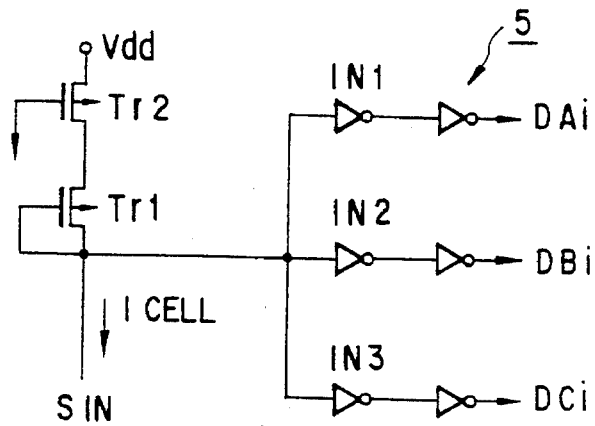
FIG. 50 is a sense amplifier for use in the conventional multi-level ROM.
Figure 51:
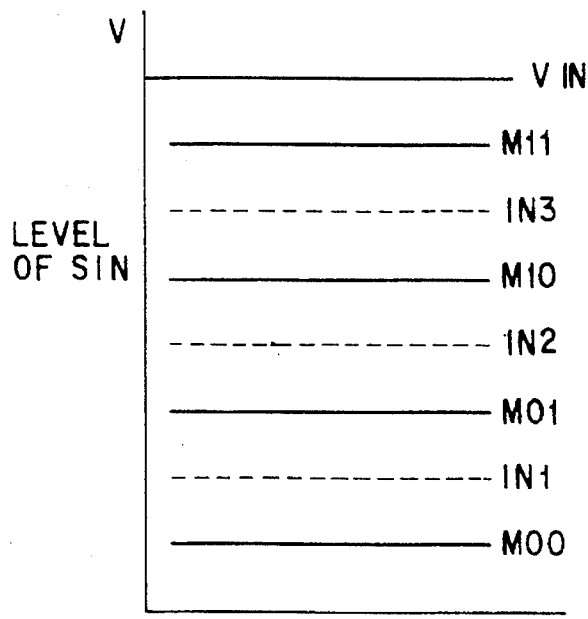
FIG. 51 is a diagram representing the characteristics of the inverter circuits incorporated in the sense amplifier shown in FIG. 50.

In the conventional multi-level ROM, the sense amplifier needs to have, as shown in FIG. 50, three inverters IN1, IN2 and IN3 to read data which can have four different values. In the first embodiment of the present invention, the sense amplifier 5 needs to have only one inverter circuit IN as shown in FIG. 3. The circuit pattern of the first embodiment is smaller than that of the conventional multi-level ROM, and can therefore be formed on a smaller semiconductor substrate. Were the inverter circuit IN replaced by a current mirror circuit, or were various measures are taken in the sensing section, the circuit pattern of the first embodiment should be considerably large. In view of this, the first embodiment whose sensing section comprises a few components is particularly advantageous.

Furthermore, since four parts of the data stored in any selected memory cell are sequentially read while one word line remains selected, the drive current of the sense amplifier 5 can be one-fourth the drive current required to drive the sense amplifier of the conventional multi-level ROM. This helps to reduce the peak current in the first embodiment.

Figure 12:
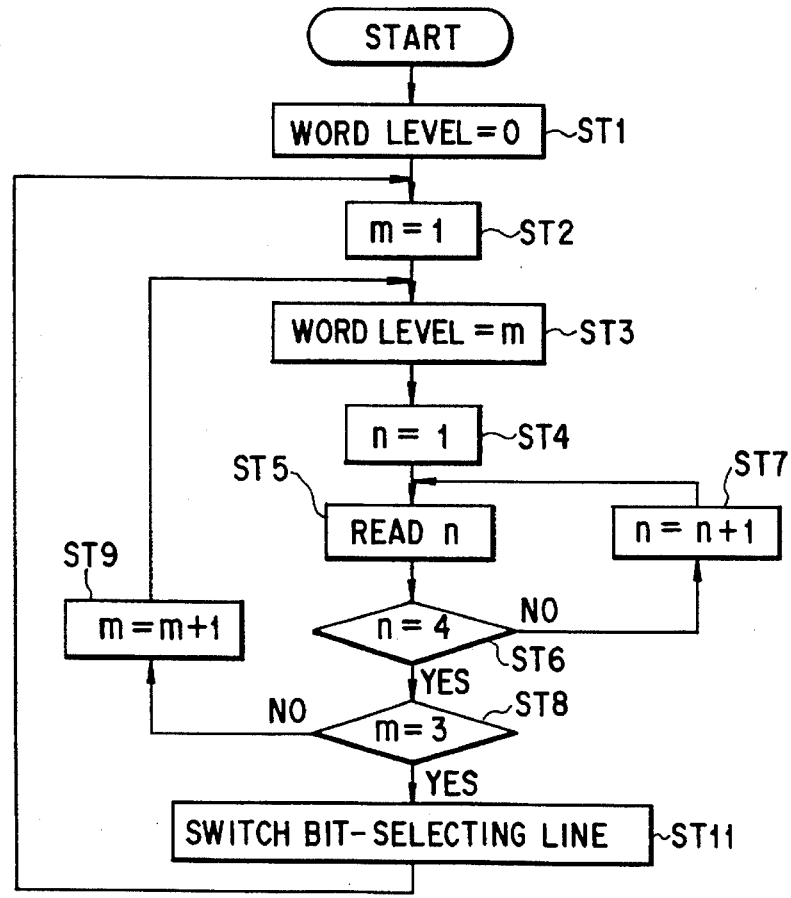
FIG. 12 is a flow chart explaining how data is read from a semiconductor memory device according to a second embodiment of the invention.
Figure 13:
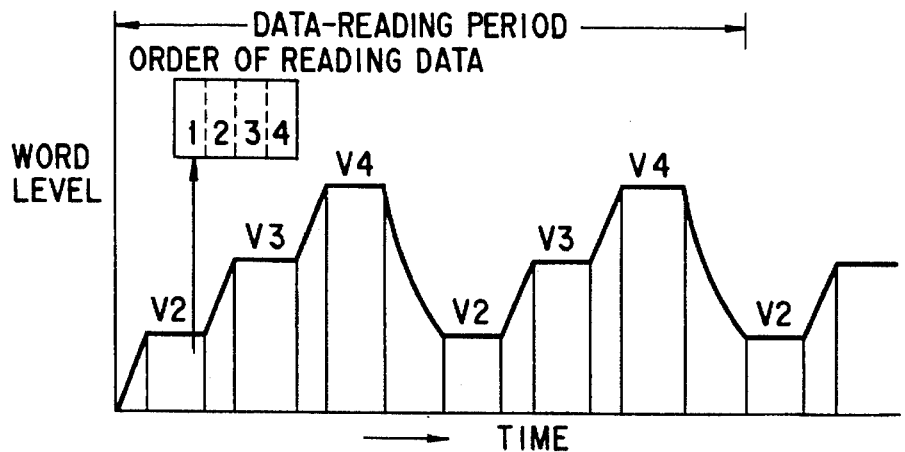
FIG. 13 is a diagram explaining the data-reading operation performed in the second embodiment.

A semiconductor memory, which is the second embodiment of the invention, will now be described with reference to FIGS. 12 and 13. The items shown in FIGS. 12 and 13, which are similar to those shown in FIGS. 7 and 8, are designed at the identical symbols.

The second embodiment is characterized in that the word level is sequentially changed during each data-reading period, and that no data is read while the word level is being changed from one to another. Since some time is required to raise the word level to a prescribed potential, it is important to shorten the time for charging any word line selected.

In the first embodiment, the word level is lowered from V4 to 0 V every time the data-reading operation is completed, and then the word level is raised to V2 to initiate the next data-reading operation. By contrast, in the second embodiment, the word level is lowered from V4 to V2, not to 0 V, as shown in FIG. 13, every time the data-reading operation is completed. Namely, as shown in FIG. 12, after the data stored in the memory cell M4 has been read out (STS), the word level is lowered to V2, not to 0 V, in preparation for the next data-reading operation, by switching the bit-selecting line of the second set by means of the column decoder 4 (ST11). The word-line charging time is thereby shortened, reducing the data-reading time.

Figure 14:
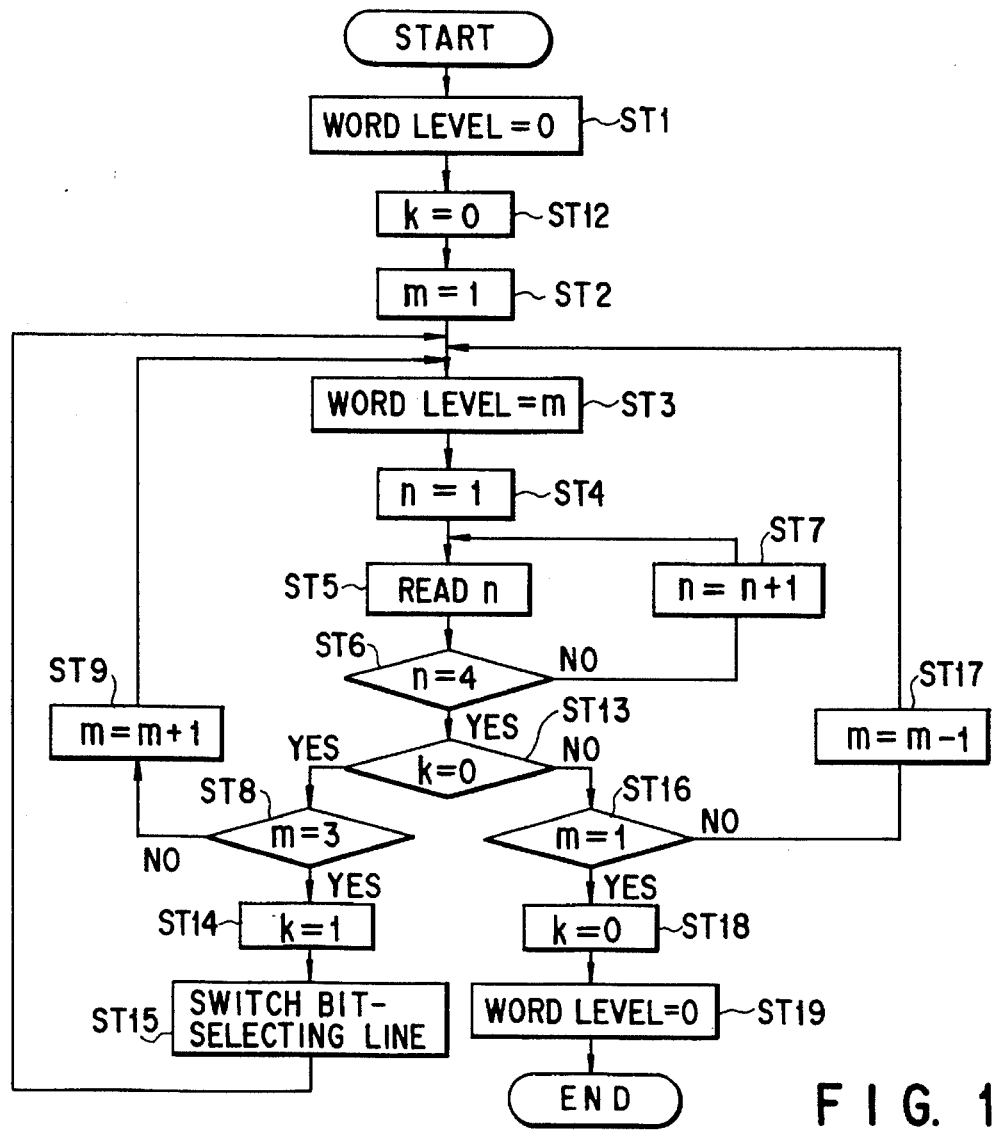
FIG. 14 is a flow chart explaining how data is read from a semiconductor memory device according to a third embodiment of the invention.
Figure 15:
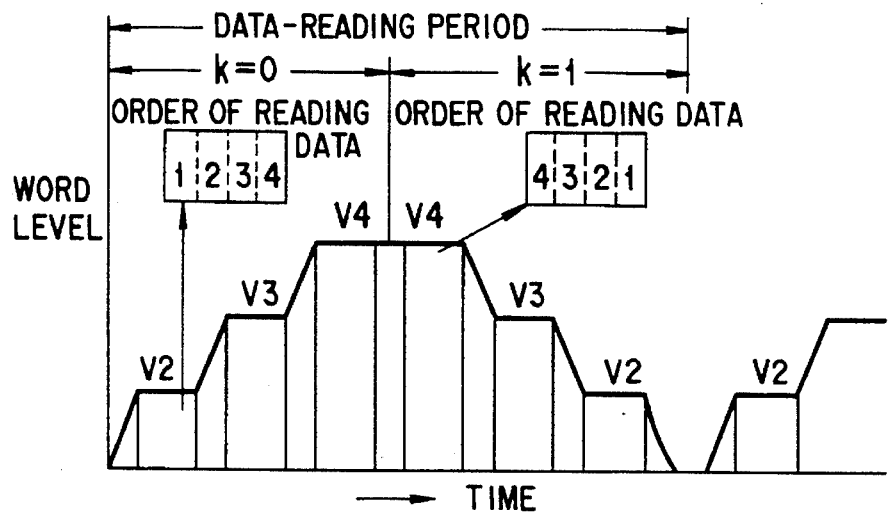
FIG. 15 is a diagram explaining the data-reading operation performed in the third embodiment.

A semiconductor memory, which is the third embodiment of the invention, will now be described with reference to FIGS. 14 and 15. The items shown in FIGS. 14 and 15, which are similar to those shown in FIGS. 12 and 13, are designed at the identical symbols.

The third embodiment is characterized in that each data-reading period is divided into two halves. In the second half period (k=1), data is read in the order reverse to that order in which data is read in the first half period (k=0).

Data is read in the same way as in the first and second embodiments during the first half period. That is, a selected word line is first set to the "0" level and then charged to the word level V2, thereby read data items sequentially from the first, second, third and fourth memory cell. Next, the word level is raised to V3, whereby data items are read sequentially from the first to fourth memory cells. The word level is further raised to V4, whereby data items are read sequentially from the first to fourth memory cells. After the data item stored in the fourth memory cell has been read out at the word level V4, the second half (k=1) of the data-reading operation is started (ST14). The column decoder 4 selects the next bit-selecting line of the second set, in order to read read data items at the word level V4 in the second half period (ST15). In the second half period, the data items are read in the order reverse to that order in which data is read in the first half period, namely from the memory cell M4, the memory cell M3, the memory cell M2 and the memory cell M1 (ST3 to ST7, ST13, ST16 to ST17). Upon completion of the data reading in the second half period, the word level is set to 0 V, terminating one complete data-reading operation (ST18 and ST19). To achieve the next data-reading operation, the column decoder 4 selects the next bit-selecting line of the second set, thereby raising the potential of a prescribed word line to V2.

Figure 16:
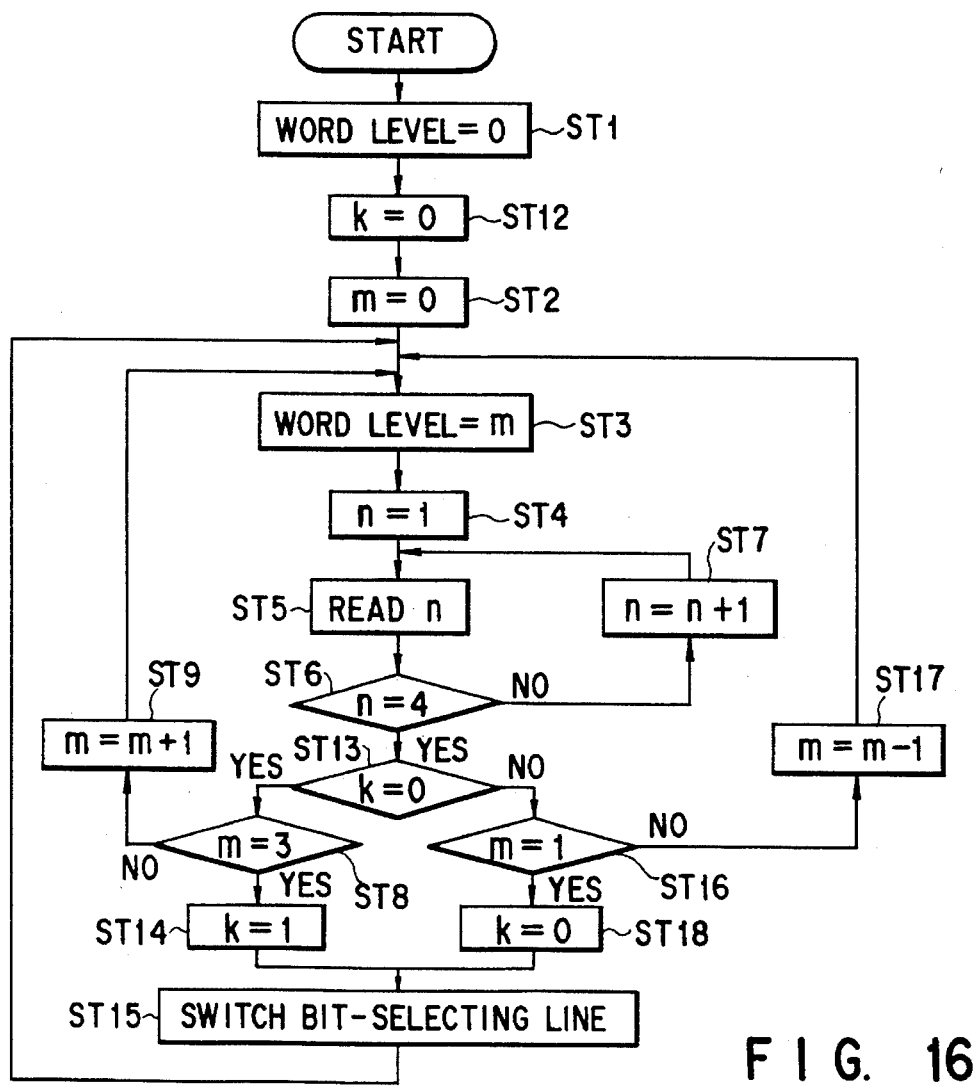
FIG. 16 is a flow chart explaining how data is read from a semiconductor memory device according to a fourth embodiment of the invention.

A semiconductor memory, which is the fourth embodiment of the invention, will now be described with reference to FIGS. 16 and 17. The items shown in FIGS. 16 and 17, which are similar to those shown in FIGS. 14 and 15, are designed at the identical symbols.

The fourth embodiment is characterized in that each data-reading period is divided into two halves. In the second half period (k=1), data is read in the order reverse to that order in which data is read in the first half period (k=0).

In the first half period, data items are read exactly in the same way as in the third embodiment. In the second half period, the data items are read in a somewhat different manner. To be more specific, after the data item stored in the last memory cell M1 has been read out at the word level V2, the next data-reading operation is initiated, while the word level is maintained at V2 (ST16, ST18, ST15). That is, the column decoder 4 selects the next bit-selecting line of the second set, while maintaining the word level at V2, to start the next first half-period data-reading operation. This method of reading data shortens the time required for charging the word line, ultimately increasing the data-reading speed.

The first, second, third and fourth embodiments will be further described, on the assumption that the threshold voltages V1 to V4 (FIG. 48) for the memory cells are 0.7 V, 1.7 V, 2.5 V and 3.5 V, respectively, and that the first, second and third level for the word lines are V2, V3 and V4. In the voltage-changing circuit 9 (FIG. 6), the resistors divide the power-supply voltage Vdd, thereby obtaining three different output voltages VW, as is shown in Table 3. If the resistors R0, R1, R2 and R3 of the circuit 9 have resistances of 595Ω, 805Ω, 357Ω and 85Ω, respectively, and if the power-supply voltage Vdd is 4.0 V, the target values of the output voltages VW will be those shown in Table 4, provided that signals LW1, LW2 and LW3 are all at the "0" level.

TABLE 3

| Input | | | |
|---|---|---|---|
| LW1 | LW2 | LW3 | VW |
| 0 | 1 | 1 | R0/(R0 + R1) × Vdd |
| 1 | 0 | 1 | R0/(R0 + R2) × Vdd |
| 1 | 1 | 0 | R0/(R0 + R3) × Vdd |

TABLE 4

| Input | LW1 = 0 | LW2 = 0 | LW3 = 0 |
|---|---|---|---|
| Target value | 1.7 V | 2.5 V | 3.5 V |
| Vdd = 4.0 V | 1.7 V | 2.5 V | 3.5 V |
| Vdd = 6.0 V | 2.55 V | 3.75 V | 5.25 V |

Generally, the power-supply voltage varies over a specific range. It is therefore required that the voltage-changing circuit 9 operates well even if the power-supply voltage Vdd varies over a specific range, e.g., 4.0 V to 6.0 V. If the voltage Vdd increases to 6.0 V, the output voltage VW of the circuit 9, which is to be used as word level, will become much higher than the target value shown in Table 4. This is because the output voltage VW is generated by dividing the power-supply voltage Vdd by means of the resistor R0, R1, R2 and R3, as can be understood from Table 3. The target value for each word level is determined by the characteristics of the memory cells. However, the actual word level is set by the resistors R0, R1, R2 and R3 incorporated in the voltage-changing circuit 9 (FIG. 6), it will deviate from the value best possible for reading data from the memory cells, if the memory cells fail to have the design characteristics. The same holds of the case where the target values for the word level are not the threshold voltages V2, V3 and V4 of the memory cells, but the intermediates of these voltages, i.e., (V1+V2)/2, (V2+V3)/2 and (V3/+V4)2.

As indicated above, the output voltage VW of the voltage-changing circuit 9 (FIG. 6) may deviate from an optimal word level due to the changes in the power-supply voltage Vdd or the deviation of memory cell characteristics from the design ones.

FIG. 18 shows the voltage-changing circuit 91 used in a semiconductor memory which is the fifth embodiment of the present invention. This circuit 91 uses reference cells to generate an optimal word level for reading data, even if the power-supply voltage Vdd changes or even if the memory cells have characteristics different from the design ones.

As shown in FIG. 18, the voltage-changing circuit 91 has three reference cells M01, M10 and M11, each comprising an N-channel transistor. The reference cells M01, M10 and M11 have threshold voltages V2, V3 and V4, respectively. They have their sources grounded and their drains and gates connected to a P-channel transistor Tr8 by resistors Rm11, Rm22 and Rm33, respectively. The transistor Tr8 has its gate connected to receive a signal CEB and its source connected to a power supply Vdd. The drains of the reference cells M01, M10 and M11 are connected to the gates of N-channel transistors Tr11, Tr22 and Tr33, respectively. The sources of the transistors Tr11, Tr22 and Tr33 are grounded by a resistor Rm44. The drains of the transistors Tr11, Tr22 and Tr33 are connected to the drains of P-channel transistors Tr31, Tr41 and Tr51, respectively. The transistors Tr31, Tr41 and Tr51 have their gates connected to receive signals LW11, LW22 and LW33, and their sources connected to the power supply Vdd. An output voltage VW is applied from the node where the sources of the transistors Tr31, Tr41 and Tr51 are connected to the resistor Rm44.

The resistors Rm11, Rm22 and Rm33 have high resistances. The transistors Tr11, Tr22 and Tr33 are enhancement-type ones having threshold voltages which are nearly equal to 0 V. When the signal CEB supplied to the gate of the P-channel transistor Tr8 is at a low level, the voltage at a node ZW11 is almost V2 for two reasons. First, a current scarcely flows through the reference cell M01 since the resistor Rm11 has a high resistance. Second, a current abruptly flows into the cell M01 when the voltage at the node ZW11 rises above the threshold voltage V2 of the cell M01 since the gate and drain of the cell M01 are connected to each other. When the power-supply voltage changes, the voltage at the node ZW11 is also V2. This is because the current flowing through the resistor Rm11 is far lower than the current which flows through the reference cell M01 when the voltage at the node ZW11 rises above V2.

For similar reason, the voltage at a node ZW22 is equal to the threshold voltage V3 of the reference cell M10, the voltage at a node ZW33 is equal to the threshold voltage V4 of the reference cell M11. The transistors Tr11, Tr22 and Tr33 are enhancement-type ones having threshold voltages nearly equal to 0 V, as mentioned above, and the resistor Rm44 has a high resistance. Therefore, the output voltage VW is V2 (nearly equal to the voltage at the node ZW11) when the signal LW11 is at low level; it is V3 (nearly equal to the voltage at the node ZW22) when the signal LW22 is at low level; and it is V4 (nearly equal to the voltage at the node ZW33) when the signal LW33 is at low level.

The output voltage VW of the voltage-changing circuit 91 is applied to a row decoder (not shown). Hence, the word level is V2 when the signal LW11 is at low level, V3 when the signal LW22 is at low level, and is V4 when the signal LW33 is at low level.

As described above, with the fifth embodiment it is always possible to set a word line at the level which corresponds to the designed threshold voltage of the memory cells, despite the changes in the power-supply voltage or the deviation of the threshold voltage of the memory cells from the design ones.

It will be explained how data stored in a memory cell of the fifth embodiment is read out. When the word level is V2, it is determined from the current flowing through the memory cell whether or not the memory cell is M00 type. When the word level is V3, it is determined from the current flowing through the memory cell whether or not the memory cell is M00 type or M01 type. When the word level is V4, it is determined from the current flowing through the memory cell whether or not the memory cell is M00 type, M01 or M10 type. The data read from the memory cell is thereby identified. When the word level is V4, it is very difficult to distinguish the reference cell M10 and M11 since the current flowing through the reference cell M10 is smaller than those flowing through the other reference cells M01 and M11.

Assume the power-supply voltage Vdd falls below the threshold voltage of the reference cell M11 and takes a value between the threshold voltages of the reference cells M10 and M11. Then, when the word level is V4, it is equal to the power-supply voltage Vdd. When the power-supply voltage rises, not applying the word line with a voltage higher than the power-supply voltage Vdd (=V4), the potential most desirable for the word line to read data is the potential which maximizes the current flowing through the reference cell M10, i.e., the power-supply voltage Vdd. Thus, the voltage-changing circuit 91 (FIG. 18) can apply an optimal data-reading potential to a word line even in the above-mentioned case.

FIGS. 19, 20A, 20B and FIGS. 21 to 35 show a semiconductor memory which is the sixth embodiment of the present invention. More precisely, these figures illustrate a control circuit for controlling the potential of a word line.

Figure 34:
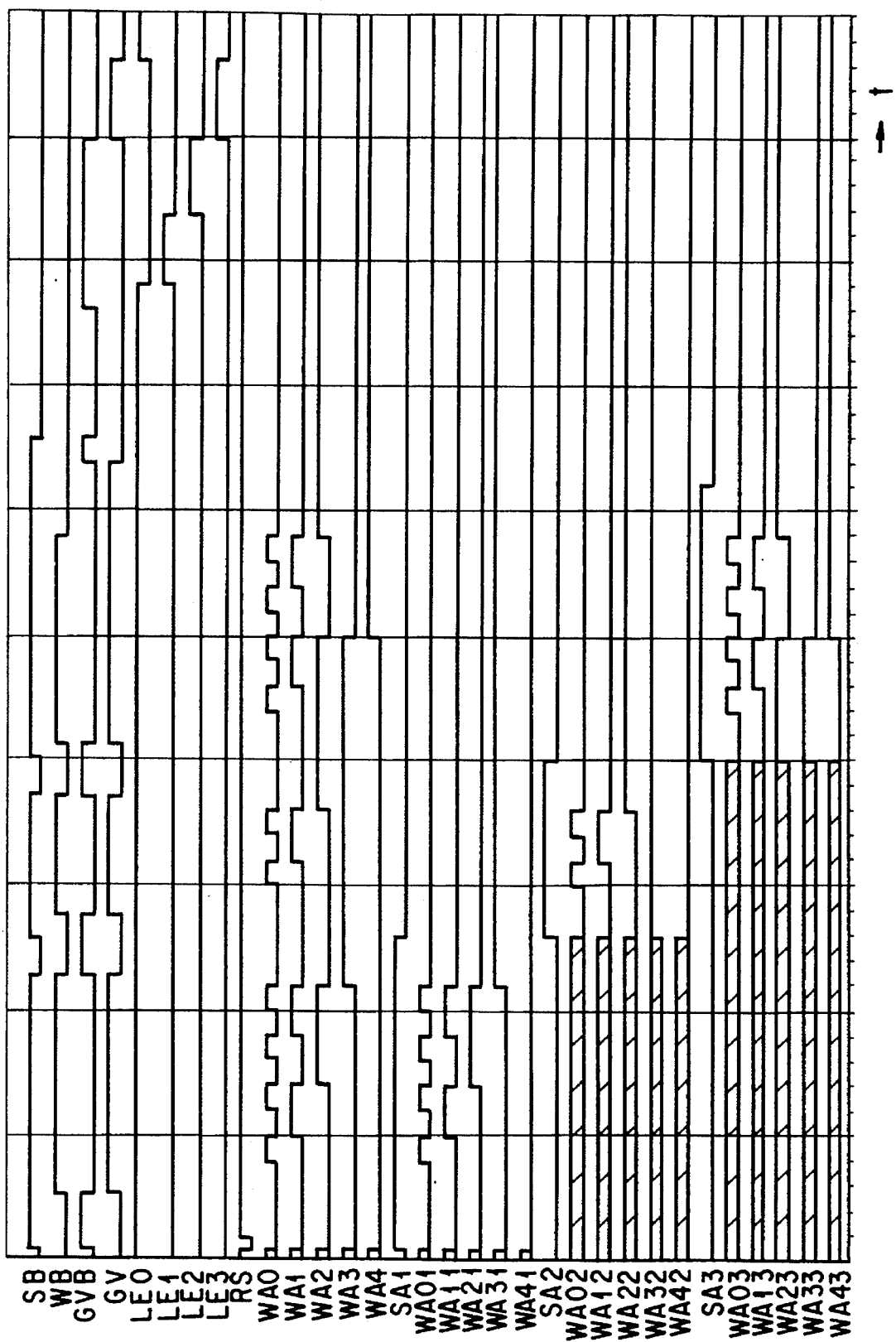
FIG. 34 is another timing chart explaining the operation of the sixth embodiment.
Figure 35:
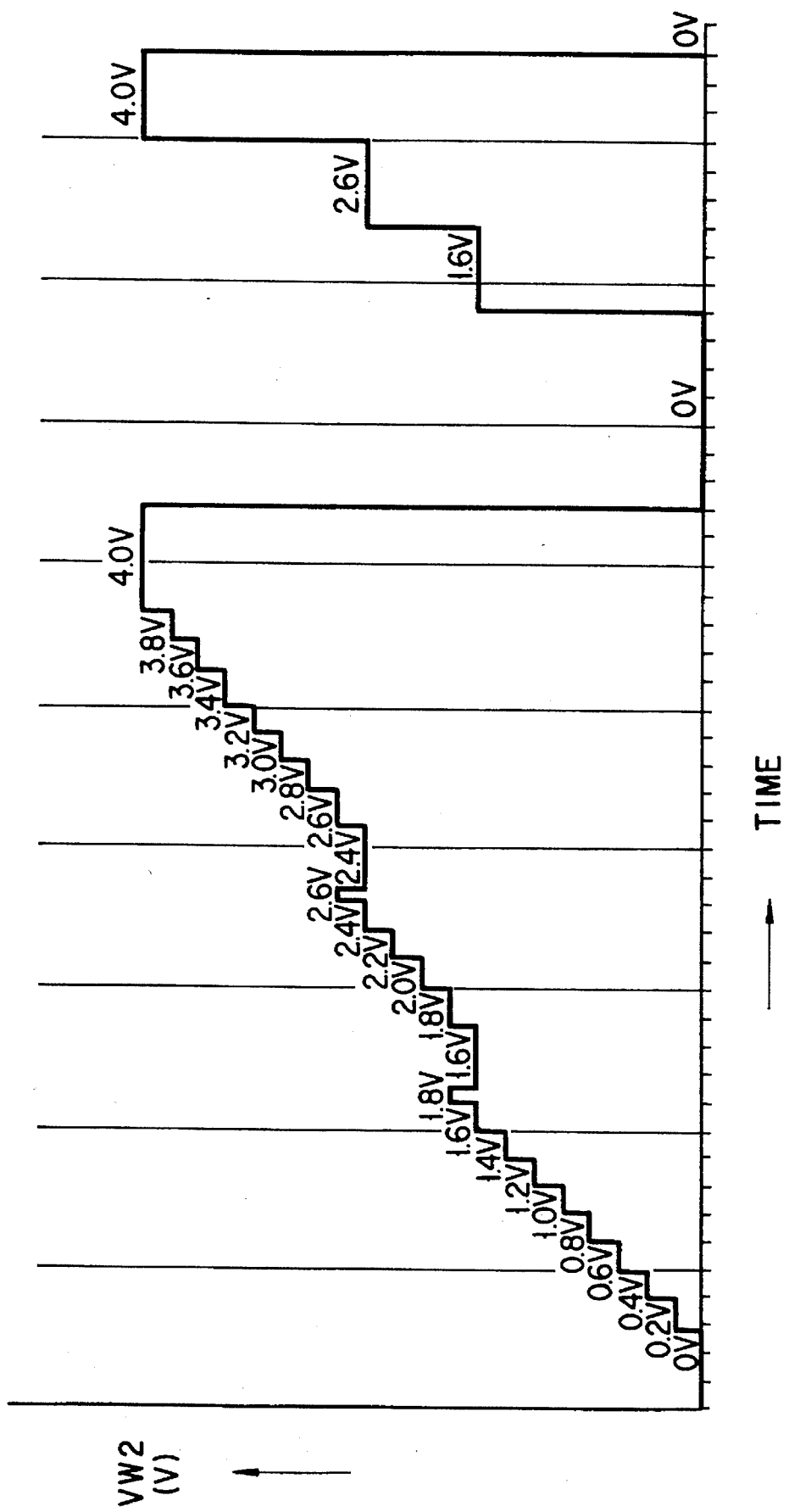
FIG. 35 is a waveform diagram explaining the operation of the sixth embodiment.

FIG. 19 is a block diagram of the control circuit. As can be understood from FIG. 19, a counter 19A counts pulses of a pulse signal (not shown) and generates word-address signals WA0, WA1, WA2, WA3 and WA4, all illustrated in FIG. 34. The word-address signals WA0 to WA4 are supplied to latch circuits 19B, 19C, 19D, 19E and 19F, respectively. The latch circuits 19B to 19F latch the word-address signals WA0 to WA4 at predetermined times, respectively. The latch circuit 19B generates signals WA0SB and WA0S; the latch circuit 19C generates signals WA1SB and WA1S; the latch circuit 19D generates signals WA2SB and WA2S; the latch circuit 19E generates signals WA3SB and WA3S; and the latch circuit 19F generates signals WA4SB and WA4S. The signals output from the latch circuits 19B to 19F are supplied to a decoder 19G. The decoder 19G generates signals GD05 to GD100 and a signal GDEND, all shown in FIG. 33, from the input signals WA0SB to WA4S. The signals GD05 to GD100 are supplied to a voltage-changing circuit 19H. The circuit 19H generates a voltage VW2 which changes stepwise as shown in FIG. 35, from the signals GD05 to GD100. The voltage VW2 is applied to a row decoder 2 (shown in FIG. 1).

In the meantime, the signal GDEND output from the decoder 19G is supplied to a level-switching circuit 19I and a pulse-generating circuit 19J. The pulse-generating circuit 19J generates a signal SU having the waveform shown in FIG. 33, when the signal GDEND is set to a high level. The signal SU is supplied to a stop circuit 19K, along with the voltage VW2 output by the voltage-changing circuit 19H. The stop circuit 19K generates from the voltage VW2 and the signal SU a signal WB shown in FIG. 34. The signal WB will maintain the word level at an optimal level. The signal WB is supplied to the level-switching circuit 19I and the counter 19A. The circuit 19I generates signals GV and GVB, both shown in FIG. 34, from the signals GDEND and WB. The signals GV and GVB are supplied to the voltage-changing circuit 19H. In accordance with the signals GV and GVB, the circuit 19H changes the output voltage VW2 (i.e., the word level) by one step.

Figure 33:
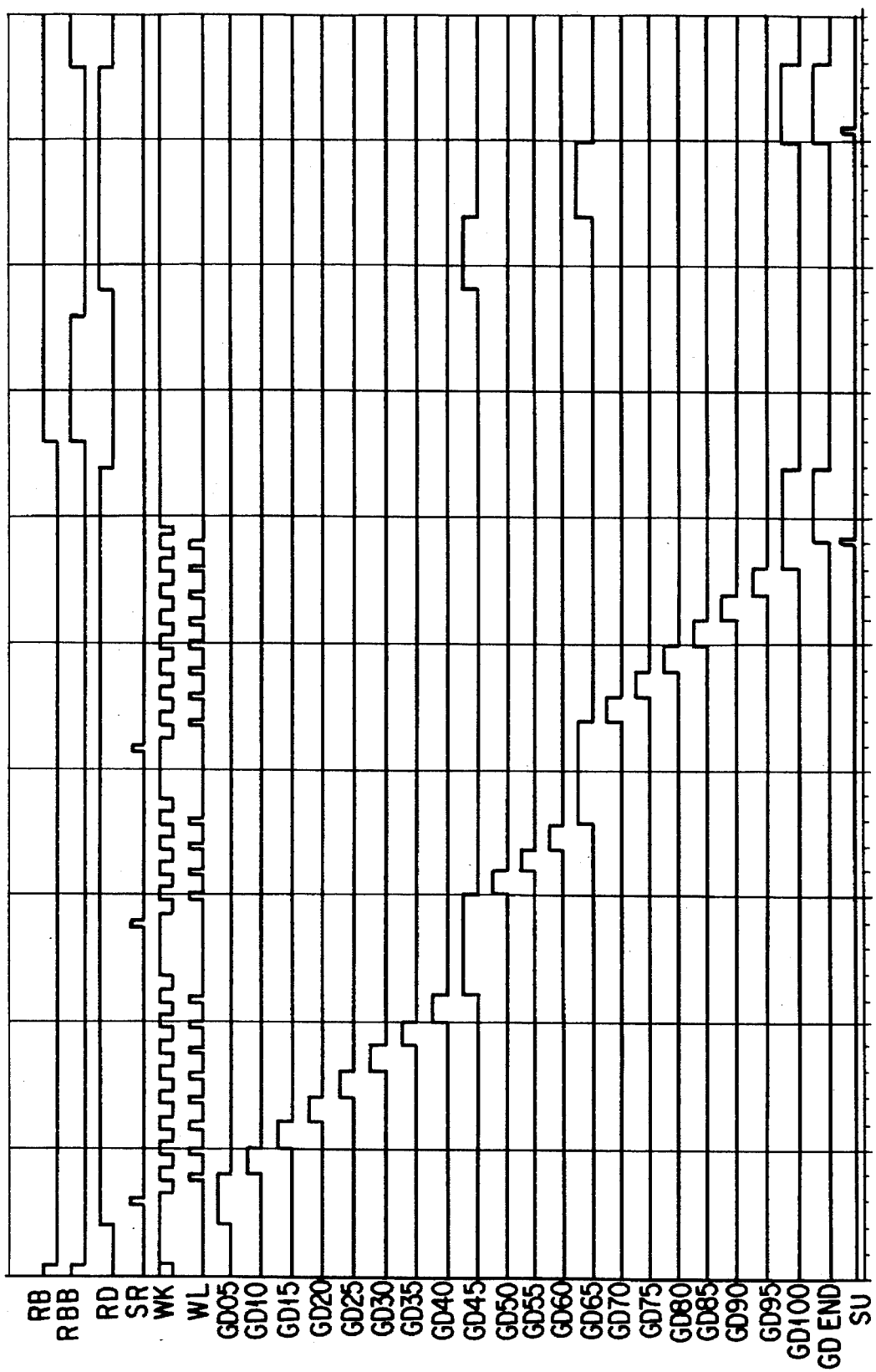
FIG. 33 is a timing chart explaining the operation of the sixth embodiment.

FIG. 20A shows the counter 19A. As shown in FIG. 20A, the counter 19A comprises a pulse generator PG and five binary counters BC1 to BC5. The counters BC1 to BC5 are connected in series, forming a series circuit which is connected to the pulse generator PG. The pulse generator PG has two delay circuits D1 and D2 which have delay time of 50 ns and delay time of 20 ns, respectively. In response to input signals RD and WB the pulse generator PG generates such a pulse signal WL as shown in FIG. 33. The pulse signal WL is supplied to the binary counters BC1 to BC5 sequentially. The binary counters BC1 to BC5 output word-address signals WA0 to WA4, which are supplied via inverter circuits to the latch circuits 19B to 19F. The binary counters BC1 to BC5 have the same structure, which is illustrated in FIG. 20B.

FIGS. 21 to 25 show the latch circuits 19B to 19F, respectively. As can be seen from FIGS. 21 to 25, the latch circuits 19B to 19F are identical in structure. The latch circuit 19B only will be described below, with reference to FIG. 21.

Figure 21:
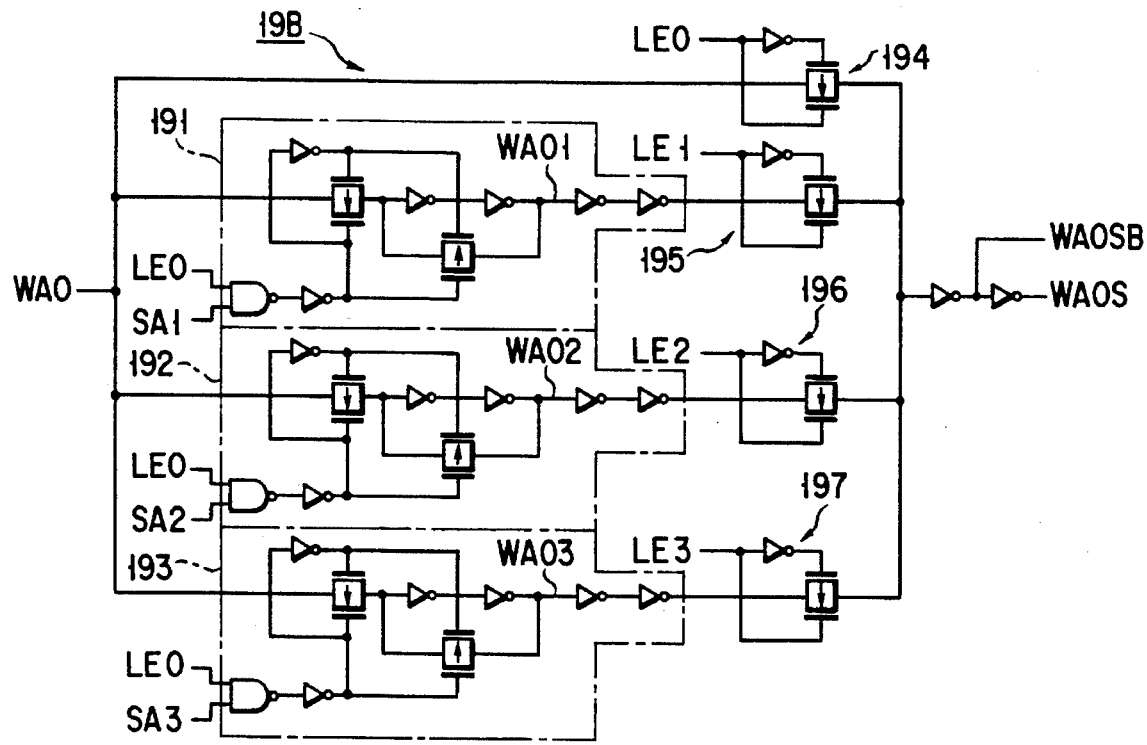
FIG. 21 is a circuit diagram of the first latch circuit shown in FIG. 19.
Figure 22:
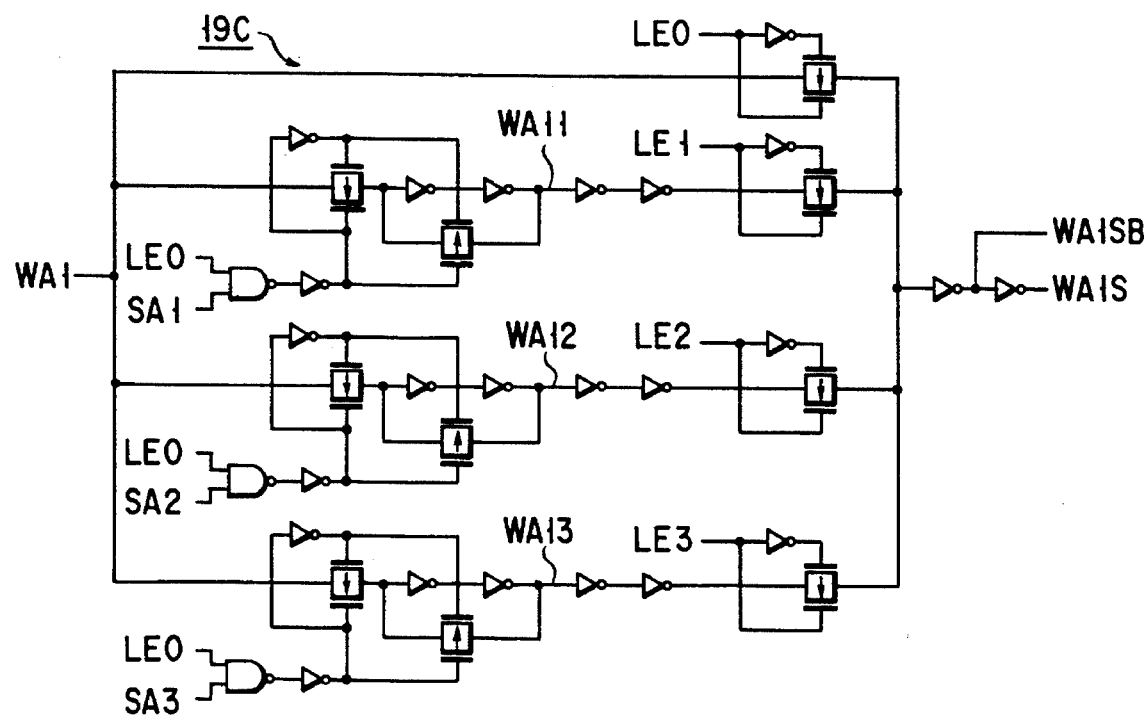
FIG. 22 is a circuit diagram of the second latch circuit shown in FIG. 19.
Figure 23:
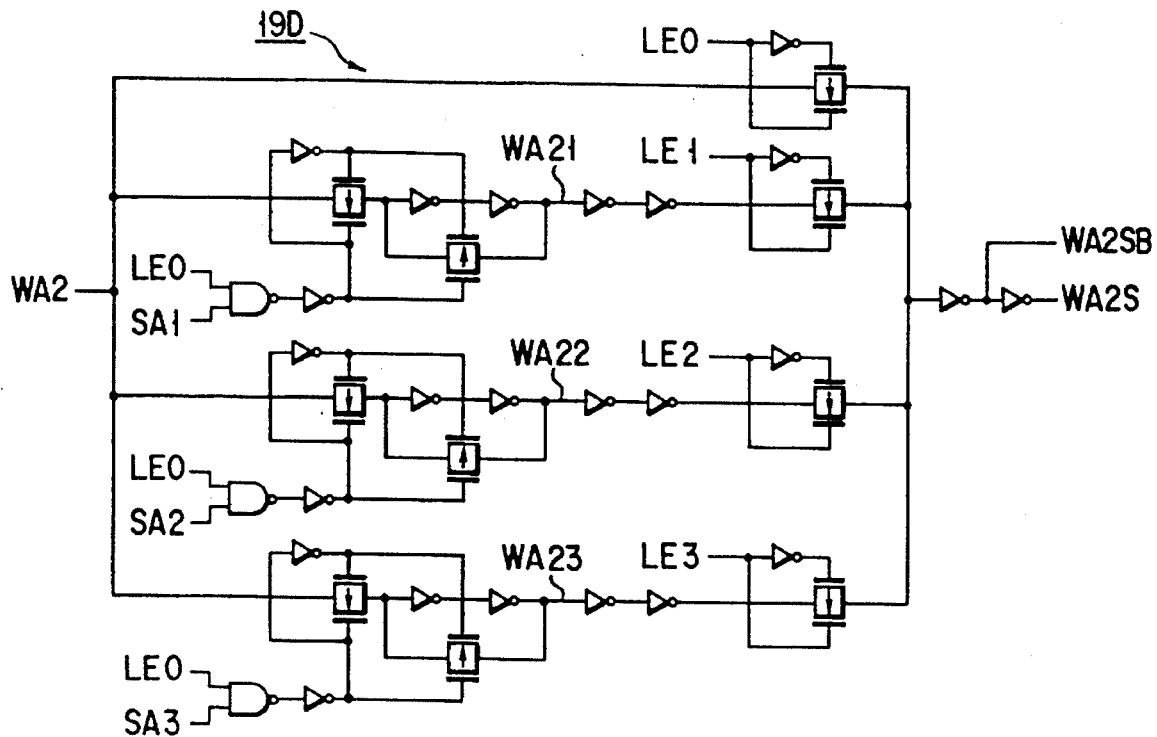
FIG. 23 is a circuit diagram of the third latch circuit shown in FIG. 19.
Figure 24:
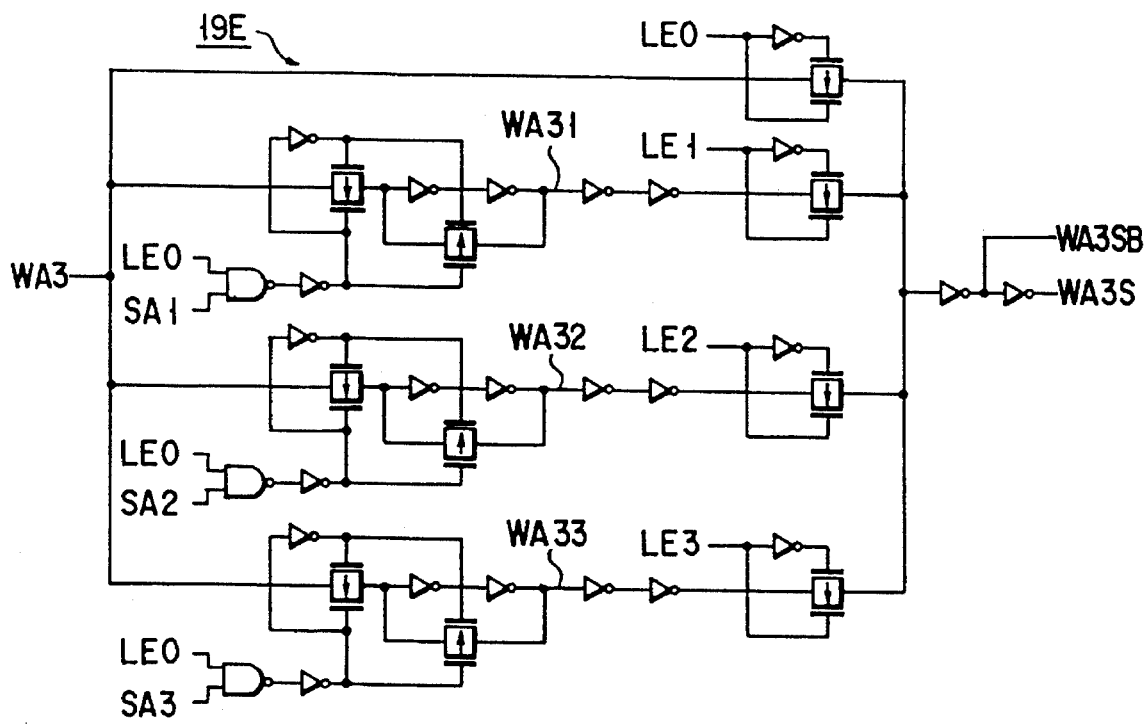
FIG. 24 is a circuit diagram of the fourth latch circuit shown in FIG. 19.
Figure 25:
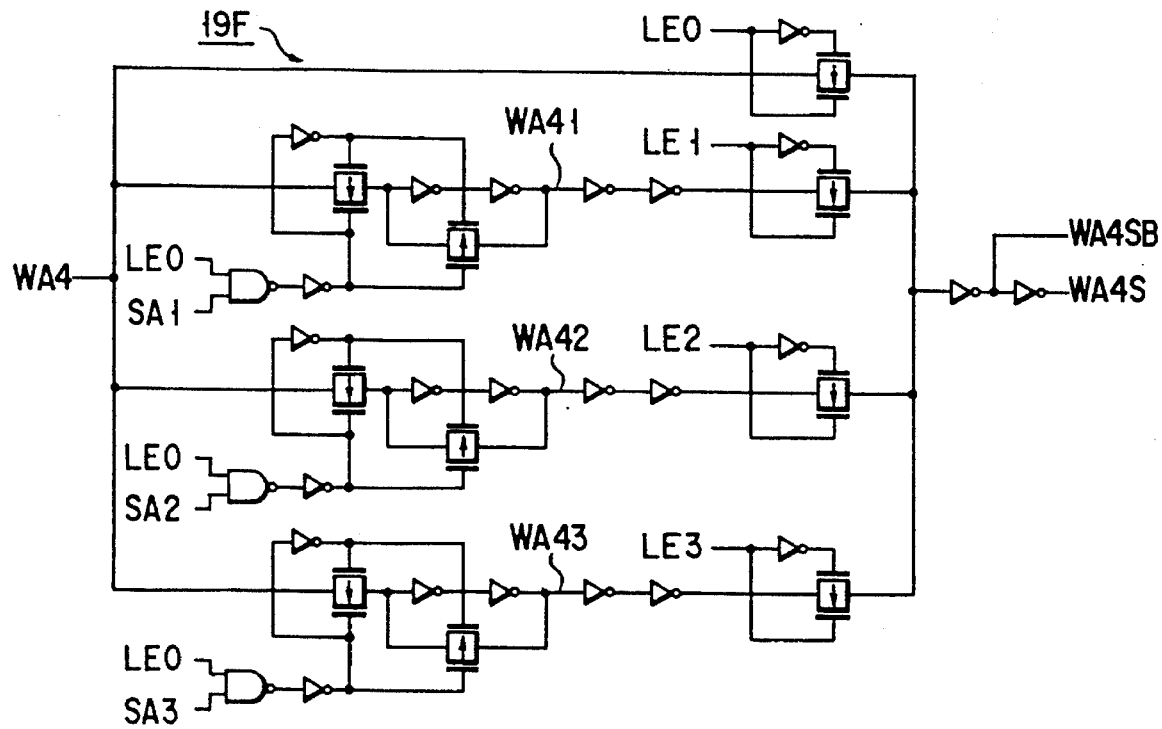
FIG. 25 is a circuit diagram of the fifth latch circuit shown in FIG. 19.

As shown in FIG. 21, the latch circuit 19B comprises three latch circuits 191, 192 and 193 and four transfer gates 194, 195, 196 and 197. The latch circuits 191 to 193 are mutually connected at their input terminals. The first latch circuit 191 latches the word-address signal WA0 in response to signals LE0 and SA1, both shown in FIG. 34. The second latch circuit 192 latches the word-address signal WA0 in response to the signal LE0 and a signal SA2 shown in FIG. 34. The third latch circuit 193 latches the word-address signal WA0 in response to the signal LE0 and a signal SA3 shown in FIG. 34.

The transfer gate 194 is connected to the input terminal of the first latch circuit 191. The transfer gates 195, 196 and 197 have their input terminals connected to the output terminals of the latch circuits 191, 192 and 193, respectively. The output terminals of the transfer gates 194 to 197 are connected to one another. The transfer gate 194 outputs the word-address signal WA0 in response to the signal LE0 shown in FIG. 34; the transfer gate 195 outputs the word-address signal WA01 in response to a signal LE1 shown in FIG. 34; the transfer gate 196 outputs the word-address signal WA02 in response to a signal LE2 shown in FIG. 34; and the transfer gate 197 outputs the word-address signal WA03 in response to a signal LE3 shown in FIG. 34. The latch circuit 19B outputs the output signals of the transfer gates 194 to 197 as signals WA0S and WA0SB.

The latch circuit 19C latches the word-address signal WA1 in response to the signal LE0 and the signals SA1 to SA3, and outputs signals WA1SB and WA1S in response to the LE0 to LE3. The latch circuit 19D latches the word-address signal WA2 in response to the signal LEO and the signals SA1 to SA3, and outputs signals WA2SB and WA2S in response to the LE0 to LE3. The latch circuit 19E latches the word-address signal WA3 in response to the signal LEO and the signals SA1 to SA3, and outputs signals WA3SB and WA3S in response to the LEO to LE3. The latch circuit 19F latches the word-address signal WA4 in response to the signal LE0 and the signals SA1 to SA3, and outputs signals WA4SB and WA4S in response to the LE0 to LE3.

FIGS. 26 and 27 show the decoder 19G. As shown in FIGS. 26 and 27, the decoder 19G comprises a plurality of NAND circuits and a plurality of inverter circuits and is designed to generate signals GD05 to GD100 and a signal GDEND from the signals WA0SB to WA4S supplied from the latch circuits 19B to 19F. The signals GD05 to GD100 are supplied to the voltage-changing circuit 19H to control this circuit 19H. The signal GDEND is supplied to the level-switching circuit 19I and also to the pulse-generating circuit 19J.

FIG. 28 shows the voltage-changing circuit 19H. As shown in FIG. 28, resistors RP0, RP1, RP2, . . . , RP19 and RP20 are connected in series. The resistors RP0 to RP20 have the same resistance. Transfer gates T0 and T23 are connected, at one terminal, to the ends of the series circuit formed of these resistors. The transfer gates T1 and T2 are connected together at one terminal, and their connecting point is connected to the connecting point of the resistors RP0 and RP1. The transfer gates T21 and T22 are connected together at one terminal, and their connecting point is connected to the connecting point of the resistors RP19 and RP20. The other transfer gates T3 to T20 are connected, at one terminal, to the connecting points of the resistors RP1, RP2, . . . , and RP19. The other terminals of the transfer gates T0 and T1 are grounded, and those of the transfer gates T22 and T23 are connected to a power supply Vdd. The other terminals of the other transfer gates T2, T3, . . . , T20 and T21 are connected to the gate of an N-channel transistor Tr9.

The gate of the transfer gate T0 is connected to the power supply Vdd. The signal GVB is supplied to the gate of the transfer gate T1. The signals GD05 to GD100 are supplied to the gates of the transfer gates T2, T3, . . . , T20 and T21, respectively. The signals GV and GVB are supplied to the gates of the transfer gates T22 and T23.

The source of the transistor Tr9 is connected to a resistor Rm2, which in turn is connected to the ground. The drain of the transistor Tr9 is connected to the power supply Vdd by a P-channel transistor Tr9A. The signal RD is supplied to the input terminal of the inverter 9D. The output terminal of the inverter 9D is connected to the gates of N-channel transistors Tr9B and Tr9C. The source of the transistor Tr9B is grounded, and the drain thereof is connected to the gate of the transistor Tr9. The source of the transistor Tr9C is grounded, and the drain thereof is connected to the source of the transistor Tr9.

In the voltage-changing circuit 19H, when the input signals GV and GVB are at high level and low level, respectively, the potential at the node Vdd5 is 5% of the power-supply voltage Vdd, whereas the potential at the node Vdd10 is 10% of the power-supply voltage—that is, the potential at the node Vddn (n=5, 10, 15, . . . 90, 95 and 100) is n% of the power-supply voltage. On the other hand, when the input signals GV and GVB are at low level and high level, respectively, the potential at the node Vdd5 is 0% of the power-supply voltage Vdd (i.e., 0 V), whereas the potential at the node Vdd10 is 50% of the power-supply voltage—that is, the potential at the node Vddn is (n−5)% of the power-supply voltage. Further, when the signal RD is at high level, and any one of the input signals GD5 to GD100 is set at high level, the potential at the node X will be equal to the potential at that one of the nodes Vdd5 to Vdd100. Further, the potential at the node VW2 is equal to potential VX. This is because the resistor Rm2 has a high resistance and the transistor Tr9 is an enhancement type transistor whose threshold voltage is nearly equal to 0 V.

Thus, the voltage-changing circuit 19H outputs a voltage VW which is 5%, 10%, 15% . . . , 90%, 95% or 100% of the power-supply voltage Vdd. In addition, the output voltage VW can be reduced by 5% of the power-supply voltage Vdd, merely by switching the potentials of the input signals GV and GVB. For example, the voltage VW can be changed from 20% of the voltage Vdd to 15% thereof.

Figure 29:
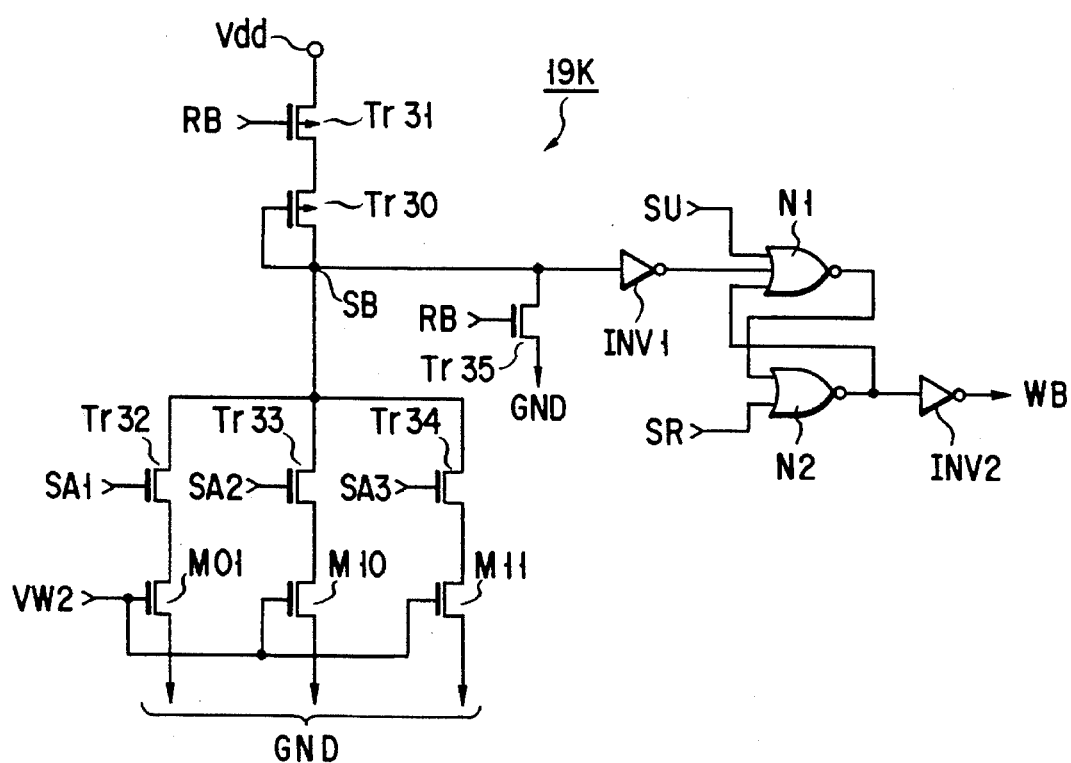
FIG. 29 is a circuit diagram of the stop circuit shown in FIG. 19.
Figure 30:
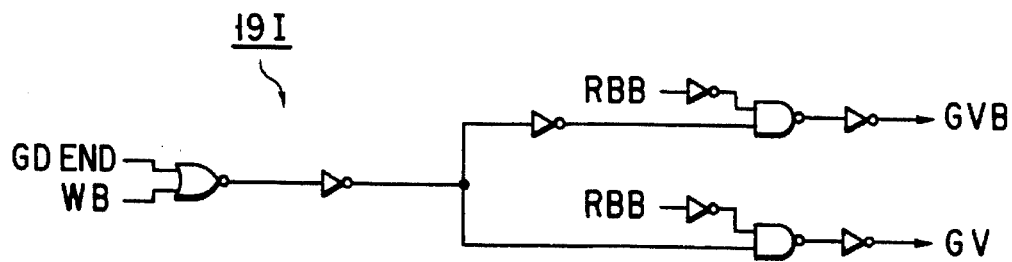
FIG. 30 is a circuit diagram showing the level-switching circuit shown in FIG. 19.
Figure 31:
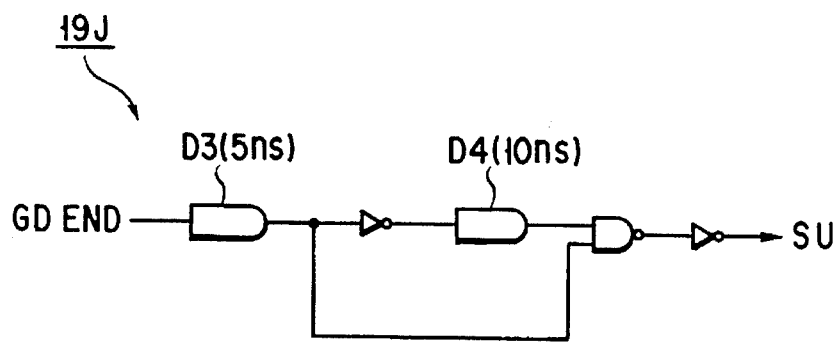
FIG. 31 is a circuit diagram showing the pulse-generating circuit shown in FIG. 19.

FIG. 29 shows the stop circuit 19K. As shown in FIG. 29, two P-channel transistors Tr30 and Tr31 are connected in series, between the power supply Vdd and a node SB. A signal RB is supplied to the gate of the transistor Tr31. The gate of the transistor Tr30 is connected to the node SB. Also connected to the node SB are the drains of N-channel transistors Tr32, Tr33 and Tr34. Connected to the sources of these transistors Tr32, Tr33 and Tr34 are the drains of reference cells M01, M10 and M11. The reference cells M01, M10 and M11 have specific threshold voltages which will be described later. The sources of the reference cells M01, M10 and M11 are connected to the ground. The voltage VW2 output from the voltage-changing circuit 19H is applied to the gates of the reference cells M01, M10 and M11. Signals SA1, SA2 and SA3 are supplied to the gates of the N-channel transistors Tr32, Tr33 and Tr34.

Figure 32:
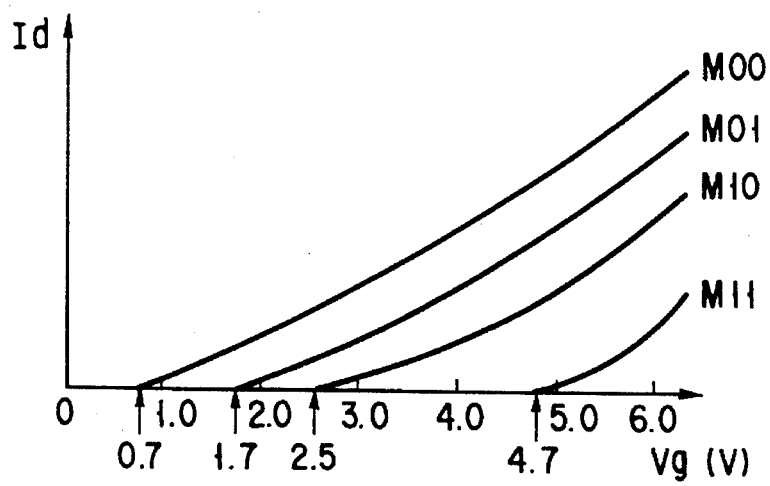
FIG. 32 is a diagram illustrating the characteristic of the memory cells used in the sixth embodiment.

FIG. 32 illustrates the characteristic of the reference cells M00, M01, M10 and M11 in the stop circuit 19K. In the sixth embodiment, the reference cells M00, M01, M10 and M11 have threshold voltages of 0.70 V, 1.70 V, 2.50 V and 4.70 V, respectively, and the power-supply voltage Vdd is 4.0 V. FIGS. 33, 34 and 35 show the waveforms which various signals have in the control circuit shown in FIG. 19.

With reference to FIGS. 33, 34 and 35, the operation of the control circuit (FIG. 19) will be described below.

First, the signal RB is set to low level, thereby activating the stop circuit 19K (FIGS. 19 and 29). At the same time, a signal RBB is set to low level, setting to high level the output signal GVB of the level-switching circuit 19I (FIG. 19). A current therefore flows through the resistors RP0 to RP20 of the voltage-changing circuit 19H. A negative pulse signal RS is supplied to the binary counters BC1 to BC5 (FIG. 20B), resetting the word-address signals WA0 to WA4 output from the counter 19A (FIG. 20A) to low level.

Furthermore, the signal SA1 supplied to the stop signal 19K (FIG. 29) is set to high level, whereby the reference cell M01 is selected. At this time, since the output signal VW of the voltage-changing circuit 19H is 0 V, the reference cell M01 remains non-conducting, and the potential of the node SB stays at high level. Thereafter, the signal RD supplied to the counter 19A to start a data-reading operation is set to high level. The pulse generator PG does not operate, however, since the signal WB remains at low level. At this time, in the decoder 19G, the signal GD05 rises to high level first. Nonetheless, the output voltage VW2 of the voltage-changing circuit 19H remains 0 V since the signal GVB stays at high level. When the a positive pulse signal SR is supplied to the NOR circuit N2 of the stop circuit 19K (FIG. 29), the signal WB output from the stop circuit 19K rises to high level. Then, the control circuit starts setting the first word level.

When the signal WB rises to high level, the output signal GVB of the level-switching circuit 19I falls to low level, and the output signal GV thereof rises to high level. At this time, the only signal GD05 is at high level in the voltage-changing circuit 19H to which the signals GVB and GV are supplied. As a result, the output voltage VW of the circuit 19H is 0.2 V.

When the signal WB is set to high level, the counter 19A (FIG. 20A) is activated. A pulse signal is generated at the node WL when the potential at a node WK rises. This pulse signal is supplied to the binary counters BC1 to BC5, which sequentially output word-address signals WA0 to WA4.

The latch circuits 19B to 19F latch the word-address signals WA0 to WA4 in response to the signals LE) to LE3 and the signals SA1 to SA3, all shown in FIG. 34, and sequentially output signals WA0SB to WA4S. The signals WA0SB to WA4S are supplied to the decoder 19G. The decoder 19G outputs signals GD05 to GD100 in response to the signals WA0SB to WA4S. In the voltage-changing circuit 19H, the transfer gates T2, T3 . . . are sequentially switched by the signals GD05, GD10, GD15, . . . which have been output from the decoder 19G. The output voltage VW2 of the circuit 19H rises stepwise, from 0.2 V to 0.4 V, 0.6 V . . . , each time by 0.2 V (i.e., 5% of the power-supply voltage Vdd).

When the signal GD45 rises to high level, the output voltage VW of the voltage-changing circuit 19H becomes 1.8 V, which is higher than the threshold voltage of the reference cell M01 incorporated in the stop circuit 19K. The reference cell M01 is therefore turned on, setting the potential of the node SB to low level. As shown in FIGS. 33 and 34, the some time passes until the potential at the node SB falls to low level after the signal GD45 has risen to high level. This is the delay is made by the capacitance of the node SB. When the potential at the node SB falls to low level, the output of the inverter circuit INV1 of the stop circuit 19K rises to high level. The output signal WB of the circuit 19K falls to low level, and so does the signal GV. The output voltage VW2 of the voltage-changing circuit 19H, to which the signals GVB and GV are supplied, decreases 0.2 V, from 1.8 V to 1.6 V.

When the signal WB is set to low level, the pulse generator PG of the counter 19A (FIG. 20A) stops generating a pulse signal. The switching of the word-address signals is thereby terminated. The voltage VW2 output from the voltage-changing circuit 19H is applied to a selected word line through the row decoder 2 (FIG. 1). The potential of the selected word line decreases to 1.6 V which is 0.1 V lower than the threshold voltage of the reference memory M01. In this condition, the data stored in the memory cells M1 to M4 (FIG. 1) is read out in the manner described above.

Thereafter, the signals SA1 and SA2, both supplied to the stop circuit 19K (FIG. 29), are set to low level and high level, respectively. Now that the signal SA1 is at low level, the first word address is latched at the nodes WA01, WA11, WA21, WA31 and WA41 of the latch circuits 19B to 19F. In the meantime the potential at the node SB of the stop circuit 19K is set to high level. When a positive pulse signal SR is supplied to the NOR circuit N2 again, the output signal WB of the stop circuit 19K rises to high level, whereby the control circuit starts setting the second word level.

As in the case of setting the first word level, the signal WB is set to high level, the output signal GV of the level-switching circuit 19I rises to high level, and the output signal GVB thereof falls to low level. The signals GV and GVB and the output signal GD45 of the decoder 19G are supplied to the voltage-changing circuit 19H. The output voltage VW2 of the circuit 19H therefore becomes 1.8 V.

when the signal WB is set to high level, the counter 19A (FIG. 20A) is activated. Any word address has not been reset as in the case of setting the first word level. Word-address switching is therefore started from the first word address which has been latched. The decoder 19G sequentially outputs signals GD45 to GD50, GD55, . . . The voltage-changing circuit 19H increases the output voltage VW2 stepwise, each time by 0.2 V, in response to the signals GD45 to GD50, GD55, . . . When the output signal GD65 of the decoder 19G rises to high level, setting the voltage VW2 at 2.60 V, the reference cell M10 of the stop circuit 19K is turned on, whereby the potential at the node SB falls to low level. Then, the output signal of the inverter circuit INV1 rises to high level, and the output signal WB of the stop circuit 19K falls to low level. When the output signal WB falls to low level, the output signal GVB of the level-switching circuit 19I rises to high level, whereas the output signal GV of the circuit 19I falls to low level. The output voltage VW2 of the voltage-changing circuit 19H, to which the signals GVB and GV are supplied, decreases 0.2 V, from 2.6 V to 2.4 V.

The moment the signal WB falls to low level, the pulse generator PG of the counter 19A stops operating. The word-address switching is thereby terminated. In this condition, the data stored in the memory cells M1 to M4 (FIG. 1) is read out in the manner described above.

Then, the signals SA2 and SA3, both supplied to the stop circuit 19K (FIG. 29), are set to low level and high level, respectively. Now that the signal SA2 is at low level, the second word address is latched at the nodes WA02, WA12, WA21, WA22, WA32 and WA42 of the latch circuits 19B to 19F. In the meantime the potential at the node SB of the stop circuit 19K is set to high level. When a positive pulse signal SR is supplied to the NOR circuit N2 again, the output signal WB of the stop circuit 19K rises to high level. As a result, the control circuit starts setting the third word level.

As in the case of setting the first word level and the second word level, the signal WB is set to high level, the output signal GV of the level-switching circuit 19I rises to high level, and the output signal GVB thereof falls to low level. The signals GV and GVB and the output signal GD65 of the decoder 19G are supplied to the voltage-changing circuit 19H. The output voltage VW2 of the circuit 19H therefore becomes 2.6 V.

When the signal WB is set to high level, the counter 19A (FIG. 20A) is activated. Hence, word-address switching is started from the second word address which has been latched. Therefore, the decoder 19G sequentially outputs signals GD65, GD70, GD75, . . . The voltage-changing circuit 19H increases the output voltage VW2 stepwise, each time by 0.2 V, in response to the signals GD45 to GD50, GD55, . . . When the output signal GD100 of the decoder 19G rises to high level, setting the voltage VW2 at 4.0 V. Since the reference cell M11 of the circuit 19H has a threshold voltage of 4.7 V, it remains non-conducting. The potential at the node SB remains at high level. After the output signal GD100 of the decoder 19G has risen to high level, the output signals GD100 and GDEND are set to high level when the next pulse is supplied to the node WL. Thus, the pulse-generating circuit 19J (FIG. 31) outputs a positive pulse signal SU. This pulse signal SU sets the output signal WB of the stop circuit 19K to low level. The word-address switching is thereby terminated. Since the signal GDEND is at high level, the output signals GVB and GV of the level-switching circuit 19I remain unchanged, and the voltage-changing circuits 19H outputs the power-supply voltage Vdd as the output voltage VW2, unlike in the case of setting the first or second word level by lowering the output voltage VW2 by 0.2 V.

In this condition, the data stored in the memory cells M1 to M4 (FIG. 1) is read out in the manner described above. Thereafter, the output signal SA3 of the stop circuit 19K is set to low level, whereby the third word address is latched at the nodes WA03, WA13, WA23, WA33 and WA43 of the latch circuits 19B to 19F. Next, the signal RD is set to low level, setting the output signals GDn and GDEND of the decoder 19G to low level, and setting the output voltage VW2 of the circuit 19H to 0 V. Furthermore, the signals RB and RBB are set to high level, rendering the level-switching circuit 19I inactive. The output signals GVB and GV are thereby set to low level, whereby no current flows through the resistors RP0 to RP20 of the voltage-changing circuit 19H.

The first cycle of switching the word level ends. To initiate the second word-level switching cycle, the signal RBB is set to low level, thereby setting the output signals GVB and GV of the level-switching circuit 19I to high level and low level, respectively. A current therefore flows through the resistors RP0 to RP20 of the voltage-changing circuit 19H. Then, the signals LE0 and LE1 supplied to the latch circuits 19B to 19F are set to low level and high level, respectively, whereby the first word address latched in the first cycle of switching the word level is output to the decoder 19G. At the same time, the signal RD is set to high level, setting the output voltage VW2 of the voltage-changing circuit 19H to 1.6 V which is the first word level set in the first word-level switching cycle. In this condition, the data stored in the memory cells is read out.

Next, the signals LE1 and LE2 supplied to the latch circuits 19B to 19F are set to low level and high level, respectively. The second word address latched in the first cycle of switching the word level is output to the decoder 19G. The output voltage VW2 of the voltage-changing circuit 19H changes to 2.4 V which is the second word level set in the first word-level switching cycle. In this condition, the data stored in the memory cells is read out.

Further, the signals LE2 and LE3 supplied to the latch circuits 19B to 19F are set to low level and high level, respectively. The third word address latched in the first cycle of switching the word level is output to the decoder 19G. The output signal GDEND of the decoder 19G rises to high level. The output signals GVB and GV of the level-switching circuit 19I are thereby set to low level and high level, respectively. The output voltage VW2 of the voltage-changing circuit 19H therefore changes to 4.0 V which is the third word level set in the first word-level switching cycle. In this condition, the data stored in the memory cells is read out.

Thereafter, the signals LE3 and LE0 supplied to the latch circuits 19B to 19F are set to low level and high level, respectively, and the signal RD is simultaneously set to low level. Then, the output voltage VW2 of the voltage-changing circuit 19H changes to 0 V. When the signal RBB is set to high level, the signal GVB and GV output from the level-switching circuit 19I fall to low level, whereby no current flows through the resistors RP0 to RP20 of the voltage-changing circuit 19H.

The second cycle of switching the word level ends. The third word-level switching cycle, et seq. can be performed in the same way as the first and second word-level switching cycles. The word level, i.e., the potential of the selected word line, can easily be set to the first level, the second level or the third level.

In the sixth embodiment, as has been described, the gate voltages of the reference cells M01, M10 and M11 are increased stepwise, each time by 0.2 V, thereby setting the first, second and third word levels which are a little lower than the threshold voltages of the reference cells M01, M10 and M11, respectively. The reference cells M01, M10 and M11 have been manufactured in the same process as the memory cells. If the characteristics of the memory cells deviate from the designed ones, those of the reference cells M01, M10 and M11 also deviate from the designed ones. Thus, the word level output from the voltage-changing circuit 19H deviate from the design value in strict accordance with the deviation in the characteristics of the memory cells, and the selected word line can be always set at the level best possible for reading data from the memory cells.

In the sixth embodiment, the power-supply voltage may be 6.0 V, instead of 4.0 V. If 6.0 V is selected for the power-supply voltage, the word level is changed stepwise, each time by 0.3 V, and the first. In this case, the first, second and the third word levels are 1.5 V, 2.4 V and 4.5 V, respectively. In the case where the power-supply voltage is 4.0 V, the first, second and the third word levels are 1.6 V, 2.4 V and 4.0 V, respectively. In either case, the first word level and the second word level scarcely depend on the power-supply voltage.

The value ideal for the third word level will be considered. If the power-supply voltage is lower than the threshold voltage of the reference cell M11, the optimal word level for reading data is the power-supply voltage at which the greatest current can flow through the reference cell M11. Conversely, if the power-supply voltage is higher than the threshold voltage of the reference cell M11, the word level best possible for reading data is the threshold voltage of the reference cell M11. Hence, the ideal third word level is 4.0 V if the power-supply voltage is 4.0 V, and 4.5 V if the power-supply voltage is 6.0 V.

In the sixth embodiment which has the control circuit of FIG. 19, the word level deviates from the threshold voltage of any reference cell, but by only 5% or less of the power-supply voltage, if the power-supply voltage is higher than the threshold voltage of the reference cell M11. This deviation can be decreased, only by increasing the resistances of the resistors RP1 to RP20 of the voltage-changing circuit 19H. For instance, if the resistance of each resistor is increased twice, the word level can be changed stepwise, each time 2.5% of the power-supply voltage. In this case, the deviation of the word level form the threshold voltage of any reference cell used is at most 2.5% of the power-supply voltage.

In the sixth embodiment, the word level is one step lower than the level at which a current starts flowing through the reference cells M01, M10 and M11. This is necessary for the purpose of rendering the cells M01, M10 and M11 non-conducting, thereby to save power. If the current flowing through any reference cell at the previous higher word level imposes no adverse influence on the data-reading operation, the word level need not be lowered one step.

Also, in the sixth embodiment, the word level is increased stepwise from 0 V up to the power-supply voltage and is set at the most desirable value. Nonetheless, the word level can be set by any other method. For example, the word level may be first increased to the power-supply voltage and lowered stepwise therefrom to 0 V, the level may then be detected at which the reference cells M01, M10 and M11 become non-conducting, and the level thus detected may be used as the most desirable word level. This method is advantageous in that the word level can be set at the value which makes the reference cells M01, M10 and M11 non-conducting, without being changed back to the value one step less.

In the sixth embodiment, the word level is switched by latching the first, second and third word addresses in the first cycle, and these word addresses latched are used in the second cycle et seq. The word level can therefore be switched fast. However, the word level will deviates in the second cycle and any following cycle if the power-supply voltage changes in the second cycle et seq. from the value it had in the first cycle. Thus, in the case where the power-supply voltage is likely to change, the control circuit (FIG. 19) may be designed to repeat the first cycle of switching the word level.

As described above, in the sixth embodiment the word level best possible for word-reading operation can be set even if the power-supply voltage changes or if the memory cells have characteristics different from the designed ones.

FIGS. 36 to 46 show a semiconductor memory which is the seventh embodiment of the present invention.

More precisely, FIG. 36 shows the control circuit incorporated in the seventh embodiment and designed to set a word level. As shown in FIG. 36, the control circuit comprises two counters 36A and 36C, two decoders 36B and 36d, a voltage-changing circuit 36E and a stop circuit 36F.

In operation, the counter 36A receives signals WC, WB1 and RD1 and generates word-address signals WAA0S, WAA0SB . . . , WAA3S and WAA3SB. The decoder 36B decodes the word-address signals WAA0S, WAA0SB, . . . , WAA3S and WAA3SB and generates signals GN0 to GN9. The counter 36C receives the signals WC, WB1 and RD1 and generates word-address signals WAAH0S, WAAH0SB, . . . , WAAH2S and WAAH2SB. The decoder 36D decodes the word-address signals WAAH0S, WAAH0SB . . . , WAAH2S and WAAH2SB and generates signals GH0 to HGS. The voltage-changing circuit 36E changes a word level VW3 in accordance with the signals GN0 to GN9 supplies from the decoder 36B and the signals supplied from the decoder 36D. The stop circuit 36F generates two signals WC and WB1 from the output voltage of the circuit 36E. The signals WC and WB1 are supplied to both counters 36A and 36C and are used to set the word level VW3 at a value best possible for reading data from the memory cell array (not shown) of the semiconductor memory.

Figure 37B:
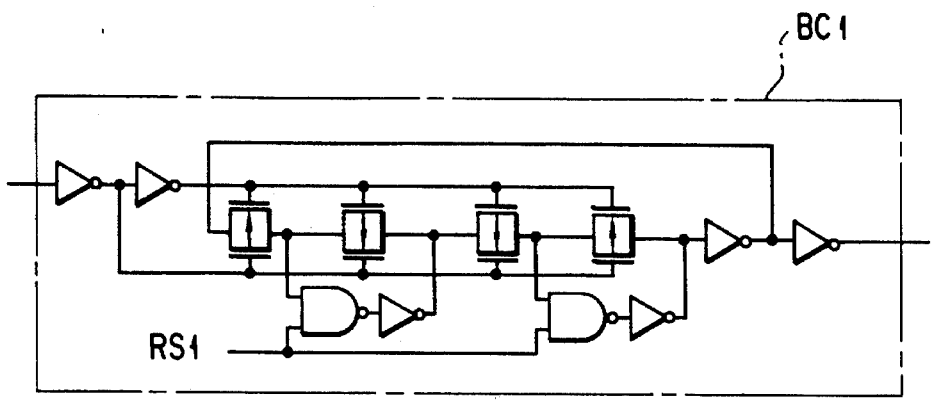
FIG. 37B is a circuit diagram of the binary counter shown in FIG. 37A.
Figure 44:
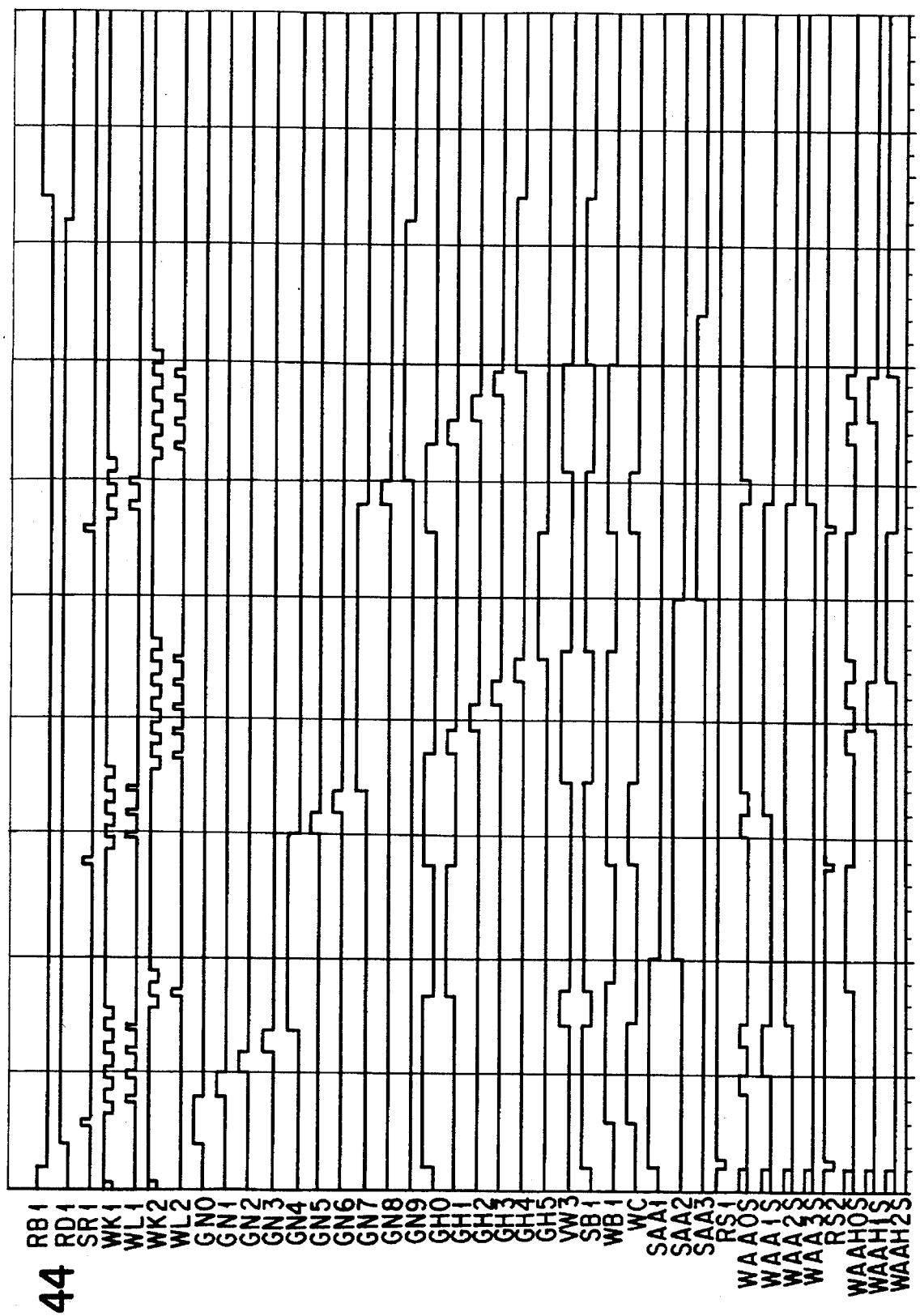
FIG. 44 is a timing chart explaining the operation of the seventh embodiment.
Figure 45:
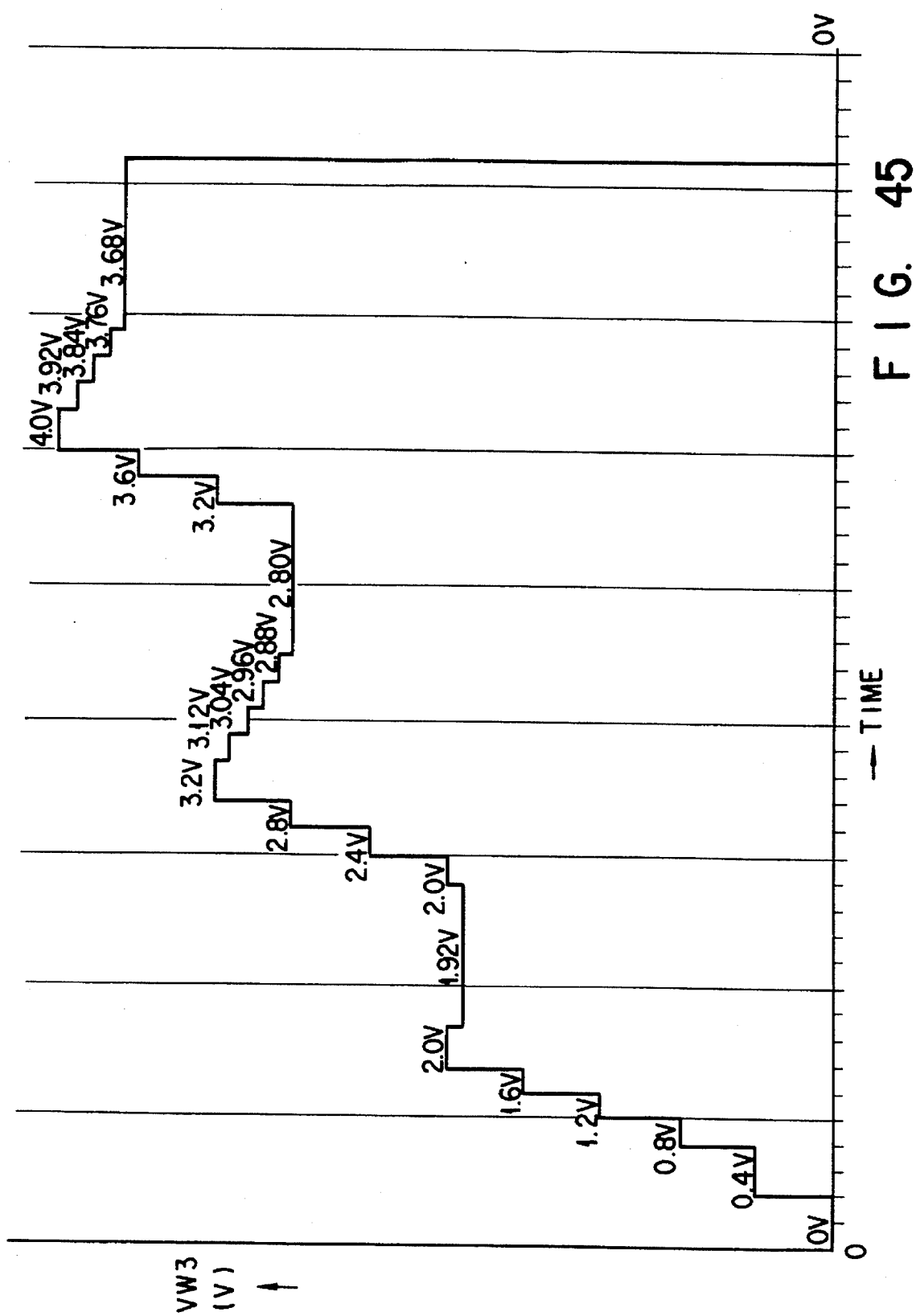
FIG. 45 is a waveform diagram explaining the operation of the seventh embodiment.

FIG. 37A shows the counter 36A. As shown in FIG. 37A, the counter 36A comprises a pulse generator PG1 and four binary counters BC11 to BC14. The pulse counters BC11 to BC14 are connected in series, forming a series circuit which is connected to the pulse generator PG1. The pulse generator PG1 has two delay circuits D5 and D6 which have delay time of 50 ns and delay time of 20 ns, respectively. In response to input signals WB1, WC and RD1 the pulse generator PG2 generates such a pulse signal WL1 as shown in FIG. 44. The pulse signal WL1 is supplied to the binary counters BC11 to BC15 sequentially. The binary counters BC11 to BC15 output word-address signals WAA0S to WAA3SB, which are supplied via inverter circuits. The binary counters BC11 to BC14 have the same structure, which is illustrated in FIG. 37B.

Figure 39A:
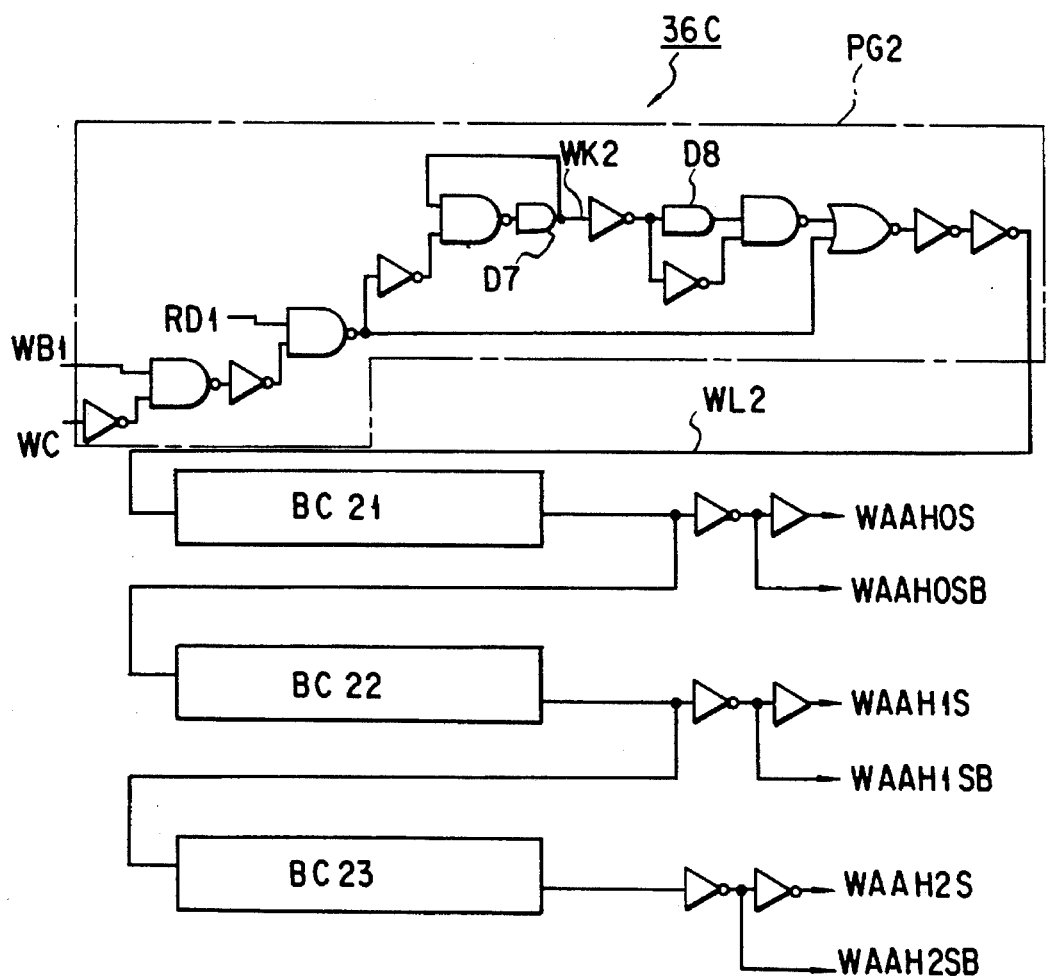
FIG. 39A is a circuit diagram of the counter shown in FIG. 36.
Figure 39B:
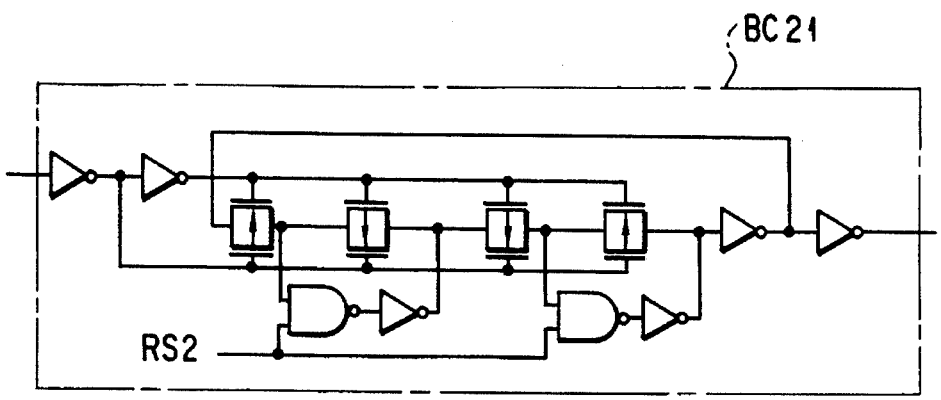
FIG. 39B is a circuit diagram of the binary counter shown in FIG. 39A.

FIG. 38 shows the decoder 36B. As shown in FIG. 38, the decoder 36B comprises a plurality of NAND circuits and a plurality of inverter circuits and is designed to generate signals GN0 to GN9 from the word-address signals WAA0S to WAA3SB and the signal RD1. FIG. 39A shows the counter 36C. As shown in FIG. 39A, the counter 36C comprises a pulse generator PG2 and three binary counters BC21 to BC23. The pulse counters BC21 to BC23 are connected in series, forming a series circuit which is connected to the pulse generator PG2. The pulse generator PG2 has two delay circuits D7 and D8 which have delay time of 50 ns and delay time of 20 ns, respectively. In response to input signals WB1, WC and RD1 the pulse generator PG2 generates such a pulse signal WL2 as shown in FIG. 44. The pulse signal WL2 is supplied to the binary counters BC21 to BC23 sequentially. The binary counters BC21 to BC23 output word-address signals WAA0S to WAA2SB, which are supplied via inverter circuits. The binary counters BC21 to BC23 have the same structure, which is illustrated in FIG. 39B.

FIG. 40 shows the decoder 36D. As shown in FIG. 40, the decoder 36D comprises a plurality of NAND circuits and a plurality of inverter circuits and is designed to generate signals GH0 to GH5 from the word-address signals WAAH0S to WAAH3SB and the signal RB1.

FIG. 41 shows the voltage-changing circuit 36E. As shown in FIG. 41, resistors RP0 to RP8 are connected in series, forming a series circuit which is connected between nodes N0 and N9. The resistors RP0 to RP8 have the same resistance R. Other resistors RH0 to RH4 are connected in series. The resistor RH4 is connected at one end to the node N0. Sill other resistors RH5 to RH9 are connected in series. The resistor RH5 is connected at one end to the node N9. The resistors RH0 to RH9 have the same resistance which is one-fifth of the resistance R of the resistors PR0 to PR8, namely ⅕R.

The voltage-changing circuit 36E has transfer gates T10 to T15. The transfer gates TH10 to TH15 connected are connected at one end to a power supply Vdd. The transfer gates TH10 and TH15 are connected at the other end to the resistors RH5 and RH9, respectively. The transfer gates TH11 to TH14 (all not shown, but TH11) are connected at the other end to the connecting points of the resistors RH5 to RH9. The signals GH0 to GH5 output from the decoder 36D are supplied to the gates of the transfer gates TH10 to TH15.

The voltage-changing circuit 36E further comprises transfer gates TH20 to TH25. The transfer gates TH20 to TH25 are connected at one end to the ground. The transfer gates TH20 and TH25 are connected at the other end to the resistors RH0 and RH4, respectively. The transfer gates TH21 to TH24 (all not shown, but TH21) are connected at the other end to the connecting points of the resistors RH0 to RH4. The signals GH0 to GH5 output from the decoder 36D are supplied to the gates of the transfer gates TH20 to TH25.

The voltage-changing circuit 36E further comprises transfer gates TR0 to TR9 are connected at one end to a node NX. The transfer gates TR0 and TR9 are connected at the other end to the nodes N0 and N9, respectively. The transfer gates TR1 to TR8 are connected at the other end to the connecting nodes N1 to N8 of the resistors RR0 to RR9, respectively. Signals GN0 to GN9 output from the decoder 36B are supplied to the gates of the transfer gates TR0 to TR9.

The voltage-changing circuit 36E further comprises a transistor Tr10, a P-channel transistor Tr10A, N-channel transistors Tr10B and Tr10C, a resistor Rm3 and an inverter circuit 10D. The gate of the transistor Tr10 is connected to the node NX. The source of the transistor Tr10 is connected to the ground by a resistor Rm3. The drain of the transistor Tr10 is connected to the power supply Vdd by the transistor Tr10A. The signal RD is supplied to the input of the inverter circuit 10D. The output of the inverter circuit 10D is connected to the gates of the transistors Tr10, Tr10B and Tr10C. The source of the transistor TR10B is grounded, and the drain thereof is connected to the gate of the transistor Tr10. The source of the transistor Tr10C is grounded, and the drain thereof is connected to the source of the transistor Tr10. The node VW3 of the transistors Tr10 and Tr10C is connected to a decoder 2 shown in FIG. 26.

It will now be explained how the voltage-changing circuit shown in FIG. 36E operates. The following explanation is based on the assumption that the power-supply voltage Vdd is 4.0 V.

The resistors RP0 to RP9 divides the power-supply voltage, setting the nodes N0 to N9 at potentials of 0.4 V, 0.8 V, 1.2 V, 1.6 V, 2.0 V, 2.4 V, 2.8 V, 3.2 V, 3.6 V and 4.0 V, respectively. If any one of the signals GN0 to GN9 is set to high level while the signal RD1 remains at high level, the node NX will be set at one of the potentials at the nodes N0 to N9.

The signals GH0 to GH5 output from the decoder 36D are switched one after another, thereby to change the potential at the node NX after one of the signals GN0 to GN9 has been set to high level. The potential at the node NX is Vx when the signal HG0 is at high level, Vx-0.08 V when the signal GH1 is at high level, Vx-0.16 V when the signal GH2 is at high level, Vx-0.24 V when the signal GH3 is at high level, Vx-0.32 V when the signal GH4 is at high level, and Vx-0.40 V when the signal GH5 is at high level. That is, the potential at the node NX is at the same level as at the time the signal HG0 and the signal GN(n-1) are at high level. (Namely, the potential is 0 V when the signal GN0 is at high level.) Since the power-supply voltage is 4.0 V, the potential at the node NX can be changed stepwise from 0 V to 4.0 V, each time by 0.08 V, by combining one of the signals GH0 to GH5 and one of the signals GN0 to GN5.

The resistor Rm3 has a high resistance, and the transistor Tr10 is an enhancement-type one having a threshold voltage nearly equal to 0 V. The potential at the node VW3 is nearly equal to the potential of the node NX when the signal RD1 is at high level. Hence, the word level (i.e., the potential of the selected word line) can be varied stepwise from 0 V to 4.0 V, each time by 0.08 V.

The power-supply voltage Vdd may change by some cause. Even if this happens, the potential at the node NX can be changed stepwise from 0 V to the power-supply voltage Vdd, each time by 1/50 of the voltage Vdd.

Figure 42:
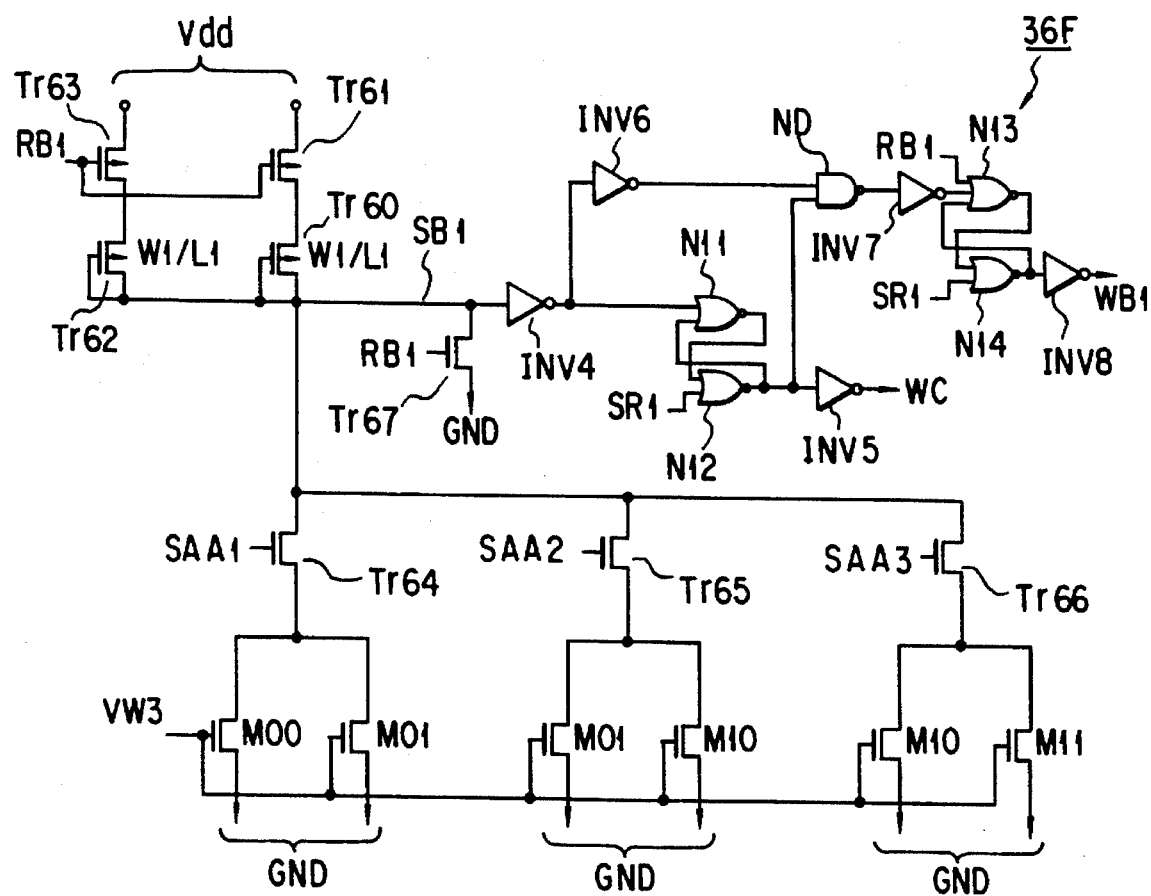
FIG. 42 is a circuit diagram of the stop circuit shown in FIG. 36.

FIG. 42 shows the stop circuit 36F. As shown in FIG. 42, the stop circuit 36F comprises P-channel transistors Tr60, Tr61, Tr62 and Tr63. The transistors Tr60 and Tr61 are connected in series, forming a series circuit connected between the power supply Vdd and a node SB1. Similarly, the transistors Tr62 and Tr63 are connected in series, forming a series circuit connected between the power supply Vdd and a node SB1. The transistors Tr60 and Tr63 work as loads; they have the same gate width and the same gate length. The signal RB1 is supplied to the gates of the transistors Tr60 and TR63, The gates of the transistors Tr60 and TR62 are connected to the node SB1.

The stop circuit 36F further comprises N-channel transistors Tr64, Tr65 and Tr66 and reference cells M00, M01, M10 and M11 (each being an N-channel transistor). The transistors Tr64, Tr65 and Tr66 are connected at their drains to the node SB1. Connected to the source of the transistor Tr64 are the drains of the reference cells M00 and M01. Connected to the source of the transistor Tr65 are the drains of the reference cells M01 and M10. Connected to the source of the transistor Tr66 are the drains of the reference cells M10 and M11. The reference cells M00, M01, M10 and M11 have the threshold voltages specified in FIG. 43. The sources of the reference cells M00, M01, M10 and M11 are grounded, and the gates of them receive the voltage VW3 output from the voltage-changing circuit 36E. The gates of the transistors Tr64, Tr65 and Tr66 receive signals SAA1, SAA2 and SAA3, respectively.

The stop circuit 36F further comprises an N-channel transistor Tr67, inverter circuit INV4 and INV5 and NOR circuits N11 and N12. The N-channel transistor Tr67 connects the node SB1 to the ground. The signal RB1 is supplied to the gate of the transistor Tr67. The input of the inverter circuit INV4 is connected to the node SB1. The output signal of the inverter circuit INV4 is supplied to the NOR circuit N11, along with the output signal of the NOR circuit N12. The output signal of the NOR circuit N11 is supplied to the NOR circuit N12, together with the signal SR1. The output signal of the NOR circuit N12 is supplied to the inverter circuit INV5, which outputs the above-mentioned signal WC.

The stop circuit 36F further has a NAND circuit ND, inverter circuits INV6, INV7 and INV8 and NOR circuits N13 and N14. The first input of the NAND circuit ND receives the output signal of the inverter INV4 through the inverter circuit INV6. The second input of the NAND circuit ND receives the output signal of the NOR circuit N12. The output of the NAND circuit ND is connected to an input of the NOR circuit N13 by the inverter circuit INV7. The output signal of the NOR circuit N14 and the above-mentioned signal RB1 are supplied to the other inputs of the NOR circuit N13. The output signal of the NOR circuit N13 is supplied to the first input of the NOR circuit N14, and the signal SR1 is supplied to the second input of the NOR circuit N14. The output signal of the NOR circuit N14 is supplied to the inverter INV8, which outputs the above-mentioned signal WB1.

Figure 43:
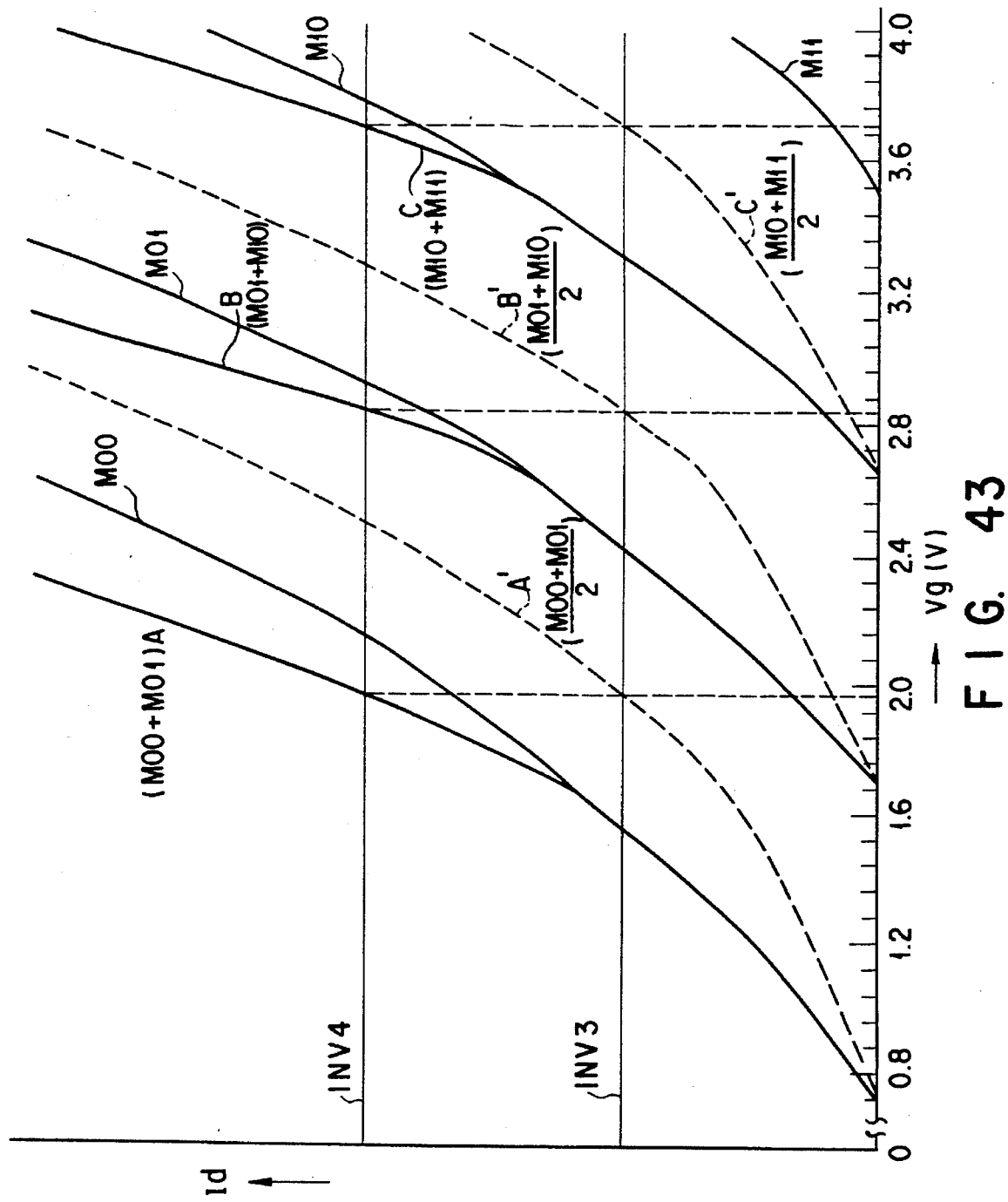
FIG. 43 is a diagram representing the characteristic of the memory cells used in the seventh embodiment.

FIG. 43 is a diagram representing the characteristic of the reference cells M00, M01, M10 and M11—all shown in FIG. 42. In FIG. 43, curves M00, M01, M10 and M11 indicate how the currents flowing through the cells M00, M01, M10 and M11, respectively, change in accordance with the word level. Curve A represents a composite current formed by combining the currents flowing through the reference cells M00 and M01; curve A' indicates a current half the current A. Curve B represents a composite current formed by combining the currents flowing through the reference cells M01 and M10; curve B' indicates a current half the current B. Curve C represents a composite current formed by combining the currents flowing through the reference cells M01 and M11; curve C' indicates a current half the current C.

FIGS. 44 is a waveform diagram showing the waveforms of the various signals used in the circuits shown in FIGS. 36 to 42. The seventh embodiment operates, basically in the same way as the sixth embodiment. In other words, the voltage-changing circuit 36E changes the word level stepwise, from one value to another, and the word level is controlled by the currents made to flow through the reference cells M00, M01, M10 and M11 of the stop circuit 36F.

More specifically, when the signal RB11 is set to low level, the stop circuit 36F and the decoder 36D are activated. At the same time, a negative pulse signal RS1 is supplied to the binary counters BC11 to BC14, and a negative pulse signal RS2 is supplied to the binary counters BC21 to BC23, thereby resetting these binary counters BC11 to BC14 and BC21 to BC23. Of the signals GH0 to GH5 output from the decoder 36D at this time, the signals GH0 is at highlevel. At the same time, the signal SAA1 supplied to the stop circuit 36F is set to high level, turning on the transistor Tr6464. As a result of this, the reference cells M00 and M01 are selected.

Thereafter, the signal RD1 is set to high level, setting the signal GN0 to high level. Then, the voltage-changing circuit 36E applies a potential of 0.4 V to the selected word line. When a positive pulse signal SR1 is supplied to the NOR circuit N14 of the stop circuit 36F, the signals WB1 and WC rise to high level, activating the counter 36A. In accordance with the count of the counter 36A, the signals GN0 to GN9 output from the decoder 36B are sequentially set to high level.

As the signals GN0 to GN9 are set to high level, one after another, the word level rises stepwise, each time by 0.4 V. When the signal GN4 rises to high level, setting the word level to 2.0 V, the currents flowing through the reference cells M00 and M01 switch the output signal of the inverter circuit INV4 of the stop circuit 36F, from low level to high level. The output signal WC of the stop circuit 36F therefore falls from high level to low level. When the signal WC falls to low level, the counter 36A stops operating, and the signals GN0 to GN9 can no longer be switched.

The moment the counter 36A ceases to operate, the counter 36C is activated. In accordance with the count of this counter 36C, the signals GH0 to GH5 output from the decoder 36D are sequentially set to high level. As a result, the word level lowers stepwise from 2.0 V, each time by 0.08 V. When the signal GH1 rises to high level, setting the word level to 1.92 V, the output signal of the inverter circuit INV4 falls from high level to low level, and so does the output signal WB1 of the stop circuit 36F. The counter 36C is thereby stopped. While the word level remains at 1.92 V (i.e., the first word level), the first data-reading operation is effected, reading the data stored in the memory cell connected to the word line.

Next, the signals SAA1 and SAA2, both supplied to the stop circuit 36F, are set to low level and high level, respectively, rendering the transistor Tr64 non-conducting and the transistor Tr65 conducting. The reference cells M01 and M10 are selected. Then, a negative pulse signal RS2 is supplied to the binary counters BC21 to BC23, and a positive pulse signal RS1 to the binary counters BC11 to BC14. The control circuit shown in FIG. 36 starts setting the second word level.

The binary counters BC21 to BC23 are reset by the negative pulse signal RS2. Therefore, of the signals GH0 to GH5 output from the decoder 36D, the signal GH0 is set to high level, setting the word level to 2.0 V. The positive pulse signal SR1 is supplied to the NOR circuits N12 and N14 of the stop circuit 36F, setting both output signals WC and WB1 of the circuit 36F to high level. The counter 36A is thereby activated, and the output signals GN0 to GN9 of the decoder 36B are sequentially switched to high level. The word level rises stepwise from 2.0 V, each time by 0.4 V. When the word level increases to 3.2 V, the currents flowing through the reference cells M01 and M10 switch the output of the inverter circuit INV4 of the stop circuit 36F, from low level to high level. The signal WC output from the stop circuit 36F falls from high level to low level.

The moment the signal WC falls to low level, the counter 36A stops performing its function. The signals GN0 to GN9 can no longer be switched. The counter 36C is activated, setting the output signals GH0 to GH5 of the decoder 36D to high level in sequence. The word level is thereby lowered stepwise from 3.2 V, each time by 0.08 V. When the signal GH5 rises to high level, setting the word level to 2.80 V, the output of the inverter circuit INV4 is switched from high level to low level. As a result, the counter 36C is stopped. While the word level remains at 2.80 (i.e., the second word level), the second data-reading operation is performed.

Thereafter, the signals SAA2 and SAA3, both supplied to the stop circuit 36F, are set to low level and high level, respectively, thereby rendering the transistor Tr65 non-conducting and the transistor Tr66 conducting. In this case, the reference cells M10 and M11 of the stop circuit 36F are selected. A negative pulse signal RS2 is supplied to the binary counters BC21 to B23, and a positive pulse signal SR1 to the binary counters BC11 to BC14. The control circuit shown starts setting the third word level.

The binary counters BC21 to BC23 are reset by the negative pulse signal RS2. Therefore, of the signals GH0 to GH5 output from the decoder 36D, the signal GH0 is set to high level, setting the word level to 3.2 V. The positive pulse signal SR1 is supplied to the NOR circuits N12 and N14 of the stop circuit 36F, setting both output signals WC and WB1 of the stop circuit 36F rise to high level, as shown in FIG. 42. Therefore, the counter 36A is activated, setting the output signals GN0 to GN9 of the decoder 36B to high level in sequence, beginning with the signal GN7. The word level is thereby raised stepwise from 3.2 V. When the signal GN9 rises to high level, setting the word level to 4.0 V, the output of the inverter circuit INV4 is switched from low level to high level, due to the currents flowing through the reference cells M01 and M11. As a result, the output signal WC of the stop circuit 36F falls from high level to low level.

When the signal WC falls to low level, the counter 36A stops operating, and the signals GN0 to GN9 can no longer be switched. Instead, the counter 36C is activated. In accordance with the count of this counter 36C, the signals GH0 to GH5 output from the decoder 36D are sequentially set to high level. As a result, the word level lowers stepwise from 4.0, each time by 0.08 V. When the signal GH1 rises to high level, setting the word level to 3.68 V, the output signal of the inverter circuit INV4 falls from high level to low level, and so does the output signal WB1 of the stop circuit 36F. The counter 36C is thereby stopped. While the word level remains at 3.68 V (i.e., the third word level), the third data-reading operation is effected, reading the data stored in the memory cell connected to the word line.

Thereafter, the signal SAA3 supplied to the stop circuit 36F is lowered from high level to low level, setting the signals RD1 and RB1 to low level and high level, respectively. As a result, the data-reading operation is completed.

FIG. 46 shows the memory cell array 1 and the sense amplifier 51, both incorporated in the seventh embodiment. The sense amplifier 51 comprises P-channel transistors Tr71, Tr72 and Tr73, and an inverter circuit INV3. The transistors Tr71 and Tr72 are connected in series, forming a series circuit connected between the power supply Vdd and a node SB2. The transistor Tr71 functions as a load. The transistor Tr71 have the same gate width and the same gate length as the transistors Tr60 and Tr62 of the stop circuit 36F. The signal RB1 is supplied to the gate of the transistor Tr72. The gate of the transistor Tr71 is connected to the node SB2. The source of the transistor TR73 is grounded, and the drain thereof is connected to the node SB2. The signal RB1 is supplied to the gate of the transistor Tr73. The input of the inverter circuit INV3 is connected to the node SB2. The threshold voltage of the inverter circuit INV3 is, as shown in FIG. 42, half the threshold voltage of the inverter circuit INV4 used in the stop circuit 36F. It follows that the inverter INV3 performs its function with only half the current flowing through any reference cell shown in FIG. 42.

Also shown in FIG. 46 are a row decoder 2, a column decoder 3A and a voltage-changing circuit 36E. The row decoder 2 is of the same type as that one shown in FIG. 6. It selects one of the word lines W1 to Wn in accordance with addresses ADD1/ADD1B, ADD2/ADD2B and ADD3/ADD3B, as has been explained above. The voltage VW3 output from the voltage-changing circuit 36E (FIG. 41) is applied to, the power-supply terminal VW of the row decoder 2. Therefore, the potential of the selected word line is raised to the voltage VW3.

Figure 47:
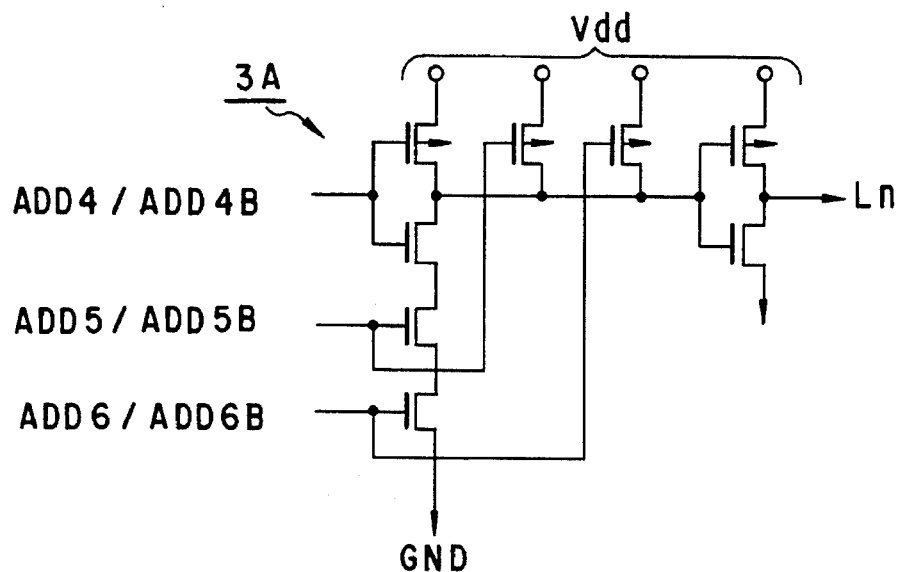
FIG. 47 is a circuit diagram of the column decoder shown in FIG. 46.

The column decoder 3A selects one of bit-selecting lines L1 to Ln in accordance with the address signal it has received. The bit-selecting lines L1 to Ln are connected to the gates of transistors Tr81 to Tr8n, which in turn are connected to bit lines B1 to Bn, respectively. Hence, the row decoder 2 and the column decoder 3A can select one of the memory cells constituting the array 1. FIG. 47 shows the column decoder 3A. As can be understood from FIG. 47, the column decoder 3A selects one of the bit-selecting lines L1 to Ln in accordance with address signals ADD4/ADD4B, ADD5/ADD5B and ADD6/ADD6B.

As indicated above, the transistors Tr71 shown in FIG. 46 is identical in size to the transistors Tr60 and TR62, both shown in FIG. 42. Furthermore, the inverter circuit INV3 shown in FIG. 46 has a transistor which has the same size as the transistor used as the inverter circuit INV4 shown in FIG. 42. Thus, the inverter circuit INV3 can be driven by a current half the current required to drive the inverter circuit INV4. This relationship between the inverter circuits INV3 and INV4 in terms of drive current remains unchanged even if the power-supply voltage Vdd varies or even if the transistors sued have characteristics different from the design ones, provided that the transistors have the same gate length L and the same gate width W. Therefore, when the word level is set to the potential at which the inverter circuit INV4 inverts the input, the output voltage of the sense amplifier 51 changes along the curve A' shown in FIG. 43. That is, at the first word level, the output voltage is switched by a current half the current flowing through the reference cell M00 or M01, which is more difficult to discriminate than the current flowing through the reference cell M10 or M11, during the first data-reading operation. This means that the seventh embodiment has a reading margin.

At the second word level, the output voltage is switched along the curve B' (FIG. 43) by a current half the current flowing through the reference cell M01 or M10, which is more difficult to discriminate than the current flowing through the reference cell M10 or M11, during the second data-reading operation. At the third word level, the output voltage is switched along the curve C' (FIG. 43) by a current half the current flowing through the reference cell M10 or M11, which is more difficult to discriminate than the current flowing through the reference cell M00 or M01, during the third data-reading operation.

In the seventh embodiment, the two reference cells which have less reading margin than the other two are used to set the word level, in the first, second and third data-reading operation. The output voltage of the sense amplifier 51 is, therefore, switched with half the current flowing through the two reference cells. The data stored in the memory cell can be read out with reliability.

In the seventh embodiment, a word level optimum for data-reading can always be set even if the power-supply voltage varies or even if the selected memory cell has characteristics different from the design ones.

Moreover, the relation between the word level and the inverting input voltage of the sense amplifier 51 remains unchanged even if the transistors Tr60, Tr61 and Tr71, each working as a load, have been roughly set in terms of threshold voltage, though the output voltage of the inverter circuit (FIG. 43) slightly deviates from a desired value. No strict requirements involves in designing these transistors Tr60, Tr61 and Tr71.

Still further, the seventh embodiment needs less resistors than the sixth embodiment to control the word level more minutely than in the sixth embodiment. The potential of the word line can be changed by 10% of the power-supply voltage Vdd and also by 2% thereof. More precisely, the potential of the word line is changed roughly by 10% of voltage Vdd, to a value between any two adjacent word level, and minutely by 2% of the voltage Vdd once it has reached any word level. In the case the word level is controlled minutely by 2% of voltage Vdd, it can be set to a desired value within a short time.

In the fifth to seventh embodiments described above, the reference cells used to control the word level are identical in structure to the memory cells. Nevertheless, the reference cells may be of a structure different from that of the memory cells.

Furthermore, some of the memory cells of the array 1 may be used as reference cells, instead of using reference cells. The reference cells may be located around the memory cell array 1.

The first to seventh embodiments, described above, are ROMs. Nonetheless, the present invention can be applied to other types of semiconductor memories, such as EPROMs, EEPROMs, DRAMs and SRAMs.

What is claimed is:

1. A semiconductor memory device comprising:

a plurality of memory cells arranged in rows and columns, for storing multi-level data, wherein each of said memory cells has a gate and a current path;

a plurality of word lines connected to the gates of said memory cells, respectively;

a plurality of bit lines, each connected to one end of the current path of one memory cell;

first selecting means connected to said word lines, for selecting one of said word lines in accordance with an address signal; and voltage-applying means connected to said first selecting means, for generating different voltages sequentially and for applying the different voltages to said first selecting means when data are read out from said memory cells during a data reading operation.

2. A device according to claim 1, further comprising:

second selecting means for selecting said bit lines one after another in accordance with an address signal in order to read data from said memory cells, while one of said word lines in being selected by said first selecting means and while a voltage is being applied from said voltage-applying means to the word line being selected;

a sense amplifier to be connected to said bit line selected by said second selecting means, for sequentially detecting potentials of said bit line; and a plurality of output circuits connected to said sense amplifier, for converting a plurality of voltages output from said sense amplifier into digital data in accordance with potentials of the word line selected by said first selecting means, and for outputting the digital data.

3. A device according to claim 1, wherein each of said memory cells has a threshold voltage which is one of a plurality of threshold voltages.

4. A device according to claim 2, wherein each of said output circuits comprises at least two latch circuits for latching potentials output from said sense amplifier, and data-converting means for converting the potential latched by each of said latch circuits into digital data.

5. A device according to claim 1, wherein said voltage-applying means has a plurality of resistors for dividing a power-supply voltage to generate potentials which are identical to the threshold voltages of said memory cells.

6. A semiconductor device comprising:

a plurality of memory cells arranged in rows and columns, each of said memory cells storing multi-level data representative of at least two bits of information, each of said memory cells having a gate and a current path;

a plurality of word lines connected to the gates of said memory cells, respectively;

a plurality of bit lines, each connected to one end of the current path of one memory cell;

first selecting means connected to said word lines, for selecting one of said word lines in accordance with an address signal; and voltage applying means connected to said first selecting means, said voltage applying means having a plurality of reference cells, respective ones of said reference cells being set at different reference potentials, said voltage-applying means applying reference potentials generated by said references cells to said first selecting means sequentially when data are read out from the memory cell during a data reading operation.

7. A device according to claim 6, wherein said reference cells are connected in parallel between a power supply and ground and generate potentials identical to the threshold voltages of said memory cells, and said voltage-applying means has a voltage-applying unit for extracting one of the potentials generated by said reference cells and applying the extracted potential as said reference potential to said first selecting means.

8. A semiconductor memory device comprising:

a plurality of memory cells arranged in rows and columns, for storing multi-level data, each of said memory cells has a gate and a current path;

a plurality of word lines connected to the gates of said memory cells, respectively;

a plurality of bit lines, each connected to one end of the current path of one memory cell;

first selecting means connected to said word lines, for selecting one of said word lines in accordance with an address signal; and voltage-applying means connected to said first selecting means and including:

a voltage-generating circuit for dividing a power-supply voltage into a plurality of voltages which are to be applied to said word lines, and for applying the voltages sequentially to said first selecting means;

a stop circuit connected to said voltage-generating circuit and having first, second and third reference cells which are used to set at a potential the word line selected by said first selecting means and which have a first threshold voltage, a second threshold voltage higher than the first threshold voltage and a third threshold voltage higher than the second threshold voltage, respectively, said stop circuit designed to stop said voltage-generating circuit when the voltage generated by said voltage-generating circuit reaches one of said first, second and third threshold voltages.

9. A device according to claim 8, further comprising:

second selecting means for selecting said bit lines one after another in accordance with an address signal in order to read data from said memory cells, while one of said word lines is being selected by said first selecting means and while a voltage is being applied from said voltage-applying means to the word line selected;

a sense amplifier to be connected to said bit line selected by said second selecting means, for sequentially detecting potentials of said bit lines; and a plurality of output circuits connected to said sense amplifier, for converting a plurality of voltages output from said sense amplifier into digital data in accordance with potentials of the word line selected by said first selecting means, and for outputting the digital data.

10. A device according to claim 8, wherein said voltage-applying means further includes a level-switching circuit connected to said voltage-generating circuit and said stop circuit, for lowering the voltage generated by said voltage-generating circuit to a value slightly lower than any one of said first, second and third threshold voltages, when said stop circuit stops said voltage-generating circuit.

11. A device according to claim 8, wherein said voltage-applying means further includes:

address-generating means for sequentially generating word-address signals representing positions at which the voltages to be applied to said word lines are to be extracted;

a decoder connected to said address-generating means, for generating signals representing positions at which the voltages generated by said voltage-generating circuit are to be extracted, in accordance with the word-address signals supplied from said address-generating circuit; and a latch circuit connected to said address-generating means, for latching the word address signals output from said address-generating circuit, when said stop circuit stops said voltage-generating circuit.

12. A device according to claim 11, wherein said voltage-generating circuit comprises:

a resistor circuit having two ends and first to n-th resistors connected in series at connecting points between the two ends; and a plurality of transfer gates each of which has two ends and which are connected at one end to one end of said resistor circuit, the other end of said resistor circuit, and connecting points of said first to n-th resistors, respectively, wherein the other end of the transfer gates connected to both ends of said first resistor is connected to a first power supply; the other end of the transfer gates connected to both ends of said n-th resistor are connected to a second power supply; the transfer gates other than these two transfer gates are connected to one another at the other end; one of the transfer gates connected to both ends of said first resistor, and one of the transfer gates connected to both ends of said n-th resistor are controlled by a signal output from said level-switching circuit; and the transfer gates other than these transfer gates are controlled by a signal output from said decoder.

13. A semiconductor memory device comprising:

a plurality of memory cells arranged in rows and columns, for storing multi-level data, each of said memory cells has a gate and a current path;

a plurality of word lines connected to the gates of said memory cells, respectively;

a plurality of bit lines, each connected to one end of the current path of one memory cell;

first selecting means connected to said word lines, for selecting one of said word lines in accordance with an address signal; and voltage-applying means connected to said first selecting means and including:

a voltage-generating circuit for dividing a power-supply voltage into a plurality of voltages which are to be applied to said word lines, and for applying the voltages sequentially to said first selecting means;

a stop circuit connected to said voltage-generating circuit and having first, second, third and fourth reference cells which are used to set at a potential the word line selected by said first selecting means and which have a first threshold voltage, a second threshold voltage higher than the first threshold voltage, a third threshold voltage higher than the second threshold voltage and a fourth threshold voltage higher than the third threshold voltage, respectively, said stop circuit designed to stop said voltage-generating circuit when the voltage generated by said voltage-generating circuit reaches one of an intermediate voltage between said first and second threshold voltages, an intermediate voltage between said second and third threshold voltages and an intermediate voltage between said third and fourth threshold voltages.

14. A device according to claim 13, further comprising:

second selecting means for selecting bit lines one after another in accordance with an address signal in order to read data from said memory cells, while one of said word lines is being selected by said first selecting means and while a voltage is being applied from said voltage-applying means to the word line selected;

a sense amplifier to be connected to said bit line selected by said second selecting means, for sequentially detecting potentials of said bit lines; and a plurality of output circuits connected to said sense amplifier, for converting a plurality of voltages output from said sense amplifier into digital data in accordance with potentials of the word line selected by said first selecting means, and for outputting the digital data.

15. A device according to claim 13, wherein said voltage-applying means further includes:

first address-generating means for sequentially generating word-address signals of a first set which represent positions at which voltages to be applied to said word lines are to be extracted;

a first decoder connected to said first address-generating means, for generating signals of a first set which represent positions at which the voltages generated by voltage-generating circuit are to be extracted, in accordance with the word-address signals of the first set supplied from said address-generating circuit;

second address-generating means for sequentially generating word-address signals of a second set which represent positions at which voltages to be applied to said word lines are to be extracted; and a second decoder connected to said second address-generating means, for generating signals of a second set which represent positions at which the voltages generated by voltage-generating circuit are to be extracted, in accordance with the word-address signals of the second set supplied from said address-generating circuit, and for supplying the signals of the second set to said voltage-generating circuit.

16. A device according to claim 15, wherein said voltage-generating circuit comprises:

a first resistor circuit having two ends and a plurality of resistors connected in series between the two ends;

a first group of transfer gates each of which has two ends and which are connected at one end to the ends of said first resistor circuit and connecting points of the resistors of said first resistor circuit, respectively, each transfer gate of the first group is controlled by a first signal output from said first decoder;

a second resistor circuit having two ends, connected at one end to one end of said first resistor circuit and comprising a plurality of resistors connected in series between the two ends;

a second group of transfer gates each of which has two ends and which are connected at one end to the ends of said second resistor circuit and connecting points of the resistors of said second resistor circuit, respectively, and at another end to a first power supply, each transfer gate of the second group is controlled by a second signal output from said second decoder;

a third resistor circuit having two ends, connected at one end to another end of said first resistor circuit and comprising a plurality of resistors connected in series between the two ends; and a third group of transfer gates each of which has two ends and which are connected at one end to the ends of said third resistor circuit and connecting points of the resistors of said third resistor circuit, respectively, and at another end to a second power supply, each transfer gate of the third group is controlled by said second signal output from said second decoder.

17. A method of reading multi-level data stored in one of a plurality of memory cells by selecting a word line and a bit line, said method comprising the steps of:

applying a first potential to the selected word line to sequentially detect current flowing through at least one memory cell connected to the word line with a sense amplifier, and latching a signal output from the sense amplifier in a latch circuit;

applying a second potential higher than the first potential to the selected word line to sequentially detect current flowing through said at least one memory cell, and latching a signal output from the sense amplifier in a second latch circuit;

applying a third potential higher than the second potential to the selected word line to sequentially detect current flowing through said at least one memory cell, and latching a signal output from the sense amplifier, in a third latch circuit; and generating digital data from the signals latched in said first, second and third latch circuits.

18. A method according to claim 17, wherein the first, second and third potentials are sequentially applied to the selected word line after the digital data has been generated, and currents flowing through the memory cell when the first, second and third potentials are applied to the word line are sequentially detected by said sense amplifier.

19. A method according to claim 17, wherein the third, second and first potentials are sequentially applied to the selected word line after the digital data has been generated, and currents flowing through the memory cell when the first, second and third potentials are applied to the word line are sequentially detected by said sense amplifier.

20. A semiconductor memory device comprising:

a plurality of memory cells arranged in rows and columns for storing multi-level data, each of said memory cells having a gate and a current path;

a plurality of word lines connected to the gates of said memory cells, respectively;

a plurality of bit lines, each connected to one end of the current path of one memory cell;

first selecting means connected to said word lines for selecting one of said word lines in accordance with an address signal;

voltage-applying means, connected to said first selecting means, for generating different voltages sequentially and for applying the different voltages to said first selecting means when data are read out from said memory cells during a data reading operation;

second selecting means for selecting said bit lines one after another in accordance with an address signal in order to read data from said memory cells, while one of said word lines is being selected by said first selecting means and while a voltage is being applied from said voltage-applying means to the word line being selected;

a sense amplifier to be coupled to one of said bit lines selected by said second selecting means, for sequentially detecting potentials of said bit line; and a plurality of output circuits connected to said sense amplifier, for converting a plurality of voltages output from said sense amplifier into digital data in accordance with potentials of the word line selected by said first selecting means, and for outputting line digital data.

21. A device according to claim 20, wherein each of said memory cells stores two-bit data.

22. A device according to claim 20, wherein said voltage-applying means generates first, second and third voltages sequentially, said second voltage being higher than said first voltage and said third voltage being higher than said second voltage.

23. A device according to claim 22, wherein said voltage-applying means generates first, second and third voltages consecutively, and thereafter generates said third, second and first voltages consecutively.

* * * * *